US008912583B2

(12) United States Patent
Mori et al.

(10) Patent No.: US 8,912,583 B2
(45) Date of Patent: Dec. 16, 2014

(54) TOP GATE THIN-FILM TRANSISTOR, DISPLAY DEVICE, AND ELECTRONIC APPARATUS

(71) Applicant: NEC LCD Technologies, Ltd., Kanagawa (JP)

(72) Inventors: Shigeru Mori, Kanagawa (JP); Takahiro Korenari, Kanagawa (JP); Hiroshi Tanabe, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 24 days.

(21) Appl. No.: 13/676,754

(22) Filed: Nov. 14, 2012

(65) Prior Publication Data

US 2013/0069097 A1    Mar. 21, 2013

Related U.S. Application Data

(62) Division of application No. 13/026,683, filed on Feb. 14, 2011, now Pat. No. 8,334,553.

(30) Foreign Application Priority Data

Feb. 15, 2010   (JP) .................................. 2010-030343
Dec. 15, 2010   (JP) .................................. 2010-279367

(51) Int. Cl.
  *H01L 31/062*   (2012.01)
  *H01L 29/786*   (2006.01)
  *H01L 29/78*    (2006.01)
  *H01L 33/58*    (2010.01)

(52) U.S. Cl.
  CPC .......... *H01L 33/58* (2013.01); *H01L 29/78633* (2013.01); *H01L 29/7833* (2013.01); *H01L 29/78621* (2013.01)
  USPC .................... 257/290; 257/291; 257/E29.151

(58) Field of Classification Search
  USPC ............................................... 257/72; 349/43
  IPC ................................... H01L 51/0554,29/78633
  See application file for complete search history.

(56) References Cited

U.S. PATENT DOCUMENTS

| 2003/0025848 A1 | 2/2003 | Sera et al. |
| 2007/0181877 A1 | 8/2007 | Lim et al. |
| 2007/0210303 A1 | 9/2007 | Ikeda et al. |

FOREIGN PATENT DOCUMENTS

| JP | 09-281521   | 10/1997 |
| JP | 2001-284594 | 10/2001 |
| JP | 2007-109868 | 4/2007  |
| JP | 2009-053660 | 3/2009  |

*Primary Examiner* — Eva Yan Montalvo
(74) *Attorney, Agent, or Firm* — Young & Thompson

(57) ABSTRACT

The present invention provides a thin-film transistor manufactured on a transparent substrate having a structure of a top gate type crystalline silicon thin-film transistor in which a light blocking film, a base layer, a crystalline silicon film, a gate insulating film, and a gate electrode film arranged not to overlap at least a channel region are sequentially formed on the transparent substrate; wherein the channel region having channel length L, LDD regions having LDD length d on both sides of the channel region, a source region, and a drain region are formed in the crystalline silicon film; the light blocking film is divided across the channel region; and interval x between the divided light blocking films is equal to or larger than channel length L and equal to or smaller than a sum of channel length L and a double of LDD length d (L+2d). Thereby, the cost for manufacturing the thin-film transistor is low, and the photo leak current of the thin-film transistor is suppressed.

9 Claims, 17 Drawing Sheets

FIG. 7-2
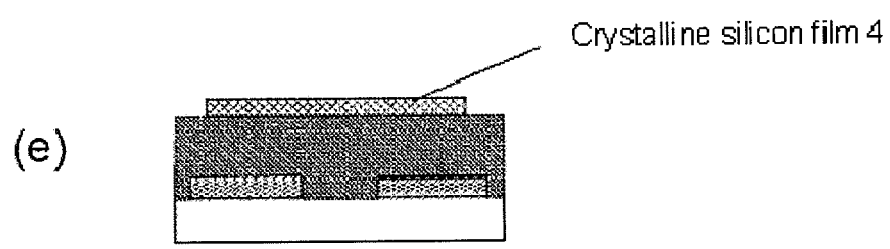
(e) Crystalline silicon film 4
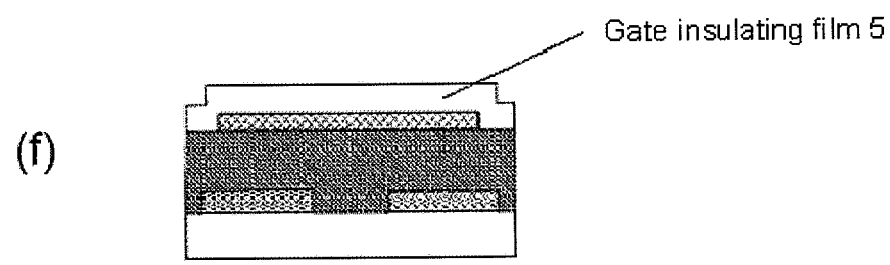
(f) Gate insulating film 5
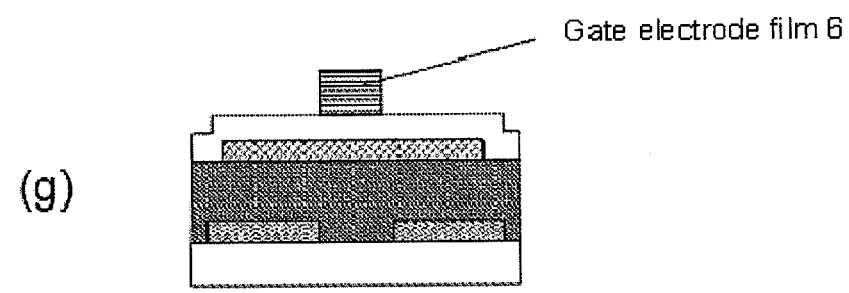
(g) Gate electrode film 6

FIG. 7-3
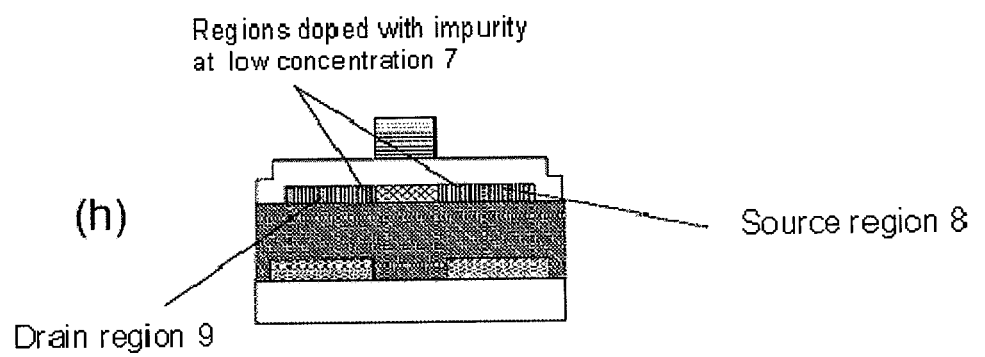
(h)
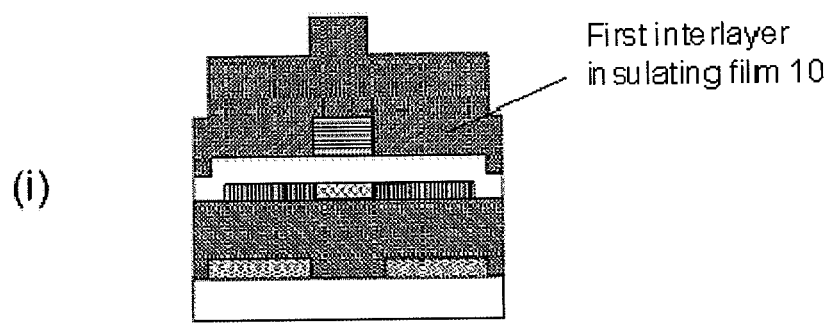
(i)
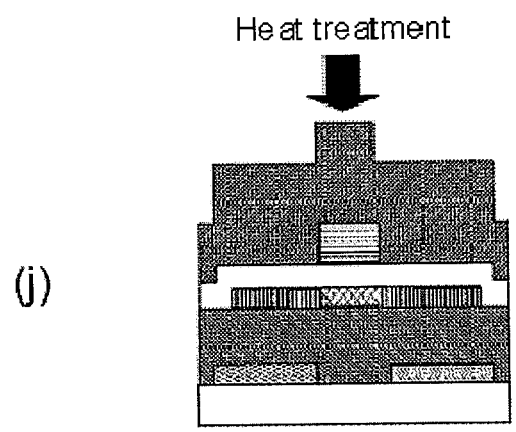
(j)

(k)

(l)

FIG. 8-4
Background Art
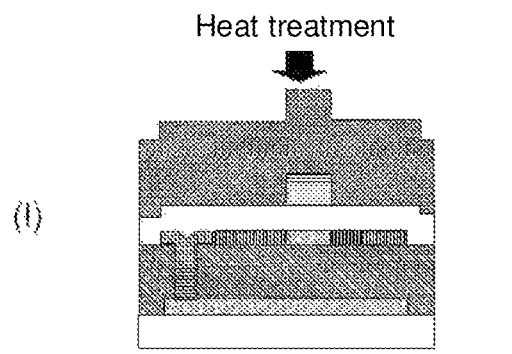
(l) Heat treatment
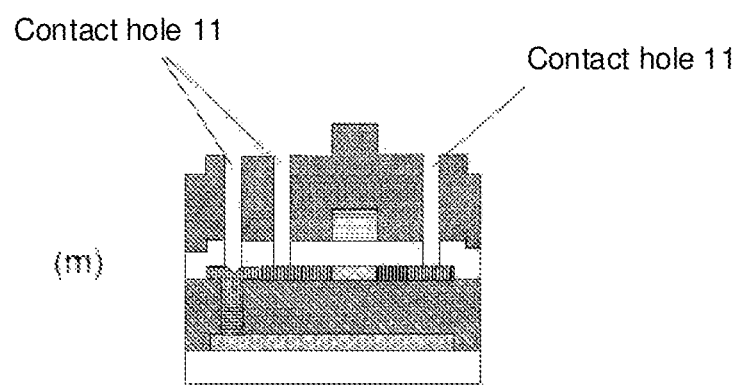
(m) Contact hole 11 — Contact hole 11
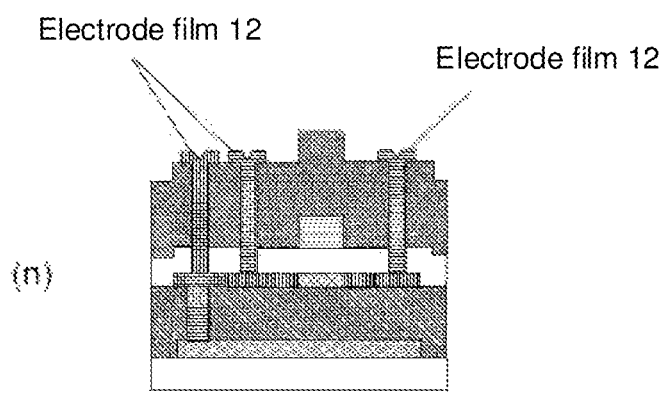
(n) Electrode film 12 — Electrode film 12

US 8,912,583 B2

TOP GATE THIN-FILM TRANSISTOR, DISPLAY DEVICE, AND ELECTRONIC APPARATUS

BACKGROUND OF THE INVENTION

1. Field of the Invention

The present invention relates to a thin-film transistor, a method of manufacturing the thin-film transistor, a display device, and an electronic apparatus.

2. Description of the Related Art

It is widely known that a thin-film transistor (TFT) is formed, as a driving device for active matrix of a liquid crystal display device, on a transparent substrate such as a glass substrate. In recent years, in order to deal with display of many varieties of information, an improvement in high-definition of pixels of a liquid crystal display device is under way. As reduction in area of each of the pixels is caused by the improvement in high-definition thereof, a sufficient opening area is secured to prevent display luminance of each of the pixels from decreasing. As a result, a decrease in an area of a portion where a charge of the pixel is held, i.e., a decrease in a storage capacity is inevitable. The decrease in the storage capacity will lead to such problem that a leak current (photo leak current) of a pixel transistor that is induced at the time when backlights illuminate has increased influence on a decrease in the charge of the pixel. Hence, the decrease in the charge of the pixel causes a fall in contrast.

In an organic electroluminescence display device, in which an organic electroluminescence device is used as a self-emitting element therefor, there is a mode in which a TFT is formed, as a driving device for active matrix of a bottom emission type, on a transparent substrate. In that case, external light that is made incident through a glass substrate will cause an increase in a photo leak current of the TFT, and thereby a fall in contrast is caused. Therefore, in such a case when the external light is made incident from the glass substrate side, a light blocking layer is formed between the TFT and the glass substrate to prevent the external light from being made incident on the TFT. In other words, there is employed such an approach for suppressing the photo leak current in which the light blocking layer is used to suppress the incidence of the external light on the TFT.

JP2001-284594A (paragraphs 0015 to 0020 on pages 2 to 3) proposes a structure for a TFT having a so-called LDD (Lightly-Doped Drain) structure, wherein low-concentration impurity regions are provided on both sides of a gate electrode, in which a light blocking film two-dimensionally covers a channel region and the low-concentration impurity regions provided on both sides of the channel region. Specifically, an amorphous silicon film, which is deposited on an upper layer of a light blocking film made of nontransparent metal, is polycrystallized by a laser beam irradiated thereon to form a polysilicon film, which is used as the channel region and the low-concentration impurity regions provided on both the sides of the channel region. In the structure, a crystal grain size in the obtained polysilicon film is large and uniform, and proposed is a suitable structure capable of suppressing leak current of the TFT when being irradiated with light.

JP2007-109868A (paragraphs 0006 to 0010 on pages 3 to 4) proposes such a TFT in which a light blocking layer is formed to cover only a boundary region of a drain region and a channel region is provided. Generation of a photo leak current in the boundary region of the drain region and the channel region, which is in a reverse bias state, is suppressed, whereby an effect of reducing fluctuation in performance (e.g., a threshold voltage) of a thin-film transistor is obtained.

SUMMARY OF THE INVENTION

Problems to be Solved by the Invention

However, the TFT disclosed in JP2001-284594A has problems explained below. The TFT disclosed in JP2001-284594A employed a top gate type polysilicon TFT, because the top gate type polysilicon TFT has a high driving ability. For dielectric isolation between a light blocking layer formed of a conductor, which shields the entire source and drain region and channel region from light, and the source and drain regions and the channel region (the polysilicon film), an insulating film that covers the light blocking layer is formed, and then a silicon film is formed on the insulating film. Therefore, in the source and drain regions and the channel region (the polysilicon film), a layered structure of the polysilicon film/the insulating film/the light blocking film (the conductor film) is formed. An electric field is generated between the light blocking layer and the polysilicon film by the potential of the light blocking layer (the conductor layer). Therefore, a channel is formed by the potential of the light blocking layer on a rear surface side of the polysilicon film in the channel region (an interface between the polysilicon film and the insulating film). As a result, an increase in an off current of the top gate type polysilicon TFT and a shift of the threshold voltage are caused. Further, in a liquid crystal display device driven by the TFT, irregularity of display such as flicker is caused.

Even in a shape in which the light blocking layer formed of the conductor shields only a part of the channel region from light instead of shielding the entire source and drain regions and channel region, a shift of the threshold voltage of the top gate type polysilicon TFT is induced. A mechanism for inducing the shift of the threshold voltage even in this shape for shielding only a part of the channel region from light has not been revealed in detail yet. However, when the layered structure of the polysilicon film/the insulating film/the blocking layer (the conductor layer) is formed, the potential of the light blocking layer (the conductor layer) affects the potential of a part of the channel region located right above the blocking layer (at the interface between the polysilicon film and the insulating film). For example, if an interface between the gate electrode and the drain region, a boundary region between the gate electrode and the so-called LDD (Light Doped Drain) structure is present right above the light blocking layer (the conductor layer), an electric field distribution in the polysilicon film in the boundary region is affected by the potential of the light blocking layer. Even if there is no influence of the electric field distribution in the polysilicon film in the channel region right below the center of the gate electrode, when the electric field distribution in the polysilicon film in the boundary region is affected, it is assumed that a shift of the threshold voltage of the top gate type polysilicon TFT may be caused thereby.

If the potential of the light blocking layer (the conductor layer) is fixed, fluctuation in an electric field generated between the light blocking layer and the polysilicon film is prevented. To prevent the fluctuation, a step of forming an electrode for applying potential to the light blocking layer, specifically, a step of forming a contact hole for forming an electrode of the light blocking layer and a step of forming the electrode of the light blocking film are necessary to be added. There is also a problem in that is the addition of the steps will cause increased cost of manufacturing process. Further, in addition to a drain line (a data line) and a gate line (a scanning line), it is necessary to provide an electrode line for applying a fixed potential to the light blocking film. Therefore, there is also a problem in that an aperture ratio of the pixel falls and luminance of the display device falls by an area occupied by the electrode line for applying the fixed potential to the light blocking film.

In the top gate type polysilicon TFT disclosed in JP2007-109868A, the source and drain regions comprising an n⁻ layer and an n⁺ layer are provided in contact with the channel region consisting of p-type polysilicon for an N-channel type TFT and a so-called LDD (Lightly Doped Drain) structure is formed using the n⁻ layer. The light blocking layer (the conductor layer) is formed to cover only a boundary region of the drain region and the channel region of the N-channel type TFT. When the light blocking layer is formed, a layered structure composed of the polysilicon film/the insulating film/the light blocking film (the conductor film) is formed. However, only a boundary portion between the n⁻ layer of the drain region and the channel region consisting of the p-type polysilicon, which forms pn junction with the n⁻ layer, is present right above the light blocking layer (the conductor layer). In the boundary region of the drain region and the channel region of the N-channel type TFT, the pn junction is reverse-biased to be depleted. It is disclosed that, as a result, even if the potential of the light blocking layer (the conductor layer) changes, fluctuation in performance of the N-channel type TFT can be suppressed.

However, if the light blocking layer (the conductor layer) is present even a little under the channel region consisting of the p-type polysilicon, the channel region consisting of the p-type polysilicon right above the light blocking layer (the conductor layer) is not a little affected by the potential of the light blocking layer (the conductor layer). In order to reduce the influence of the potential, it is preferable to fix the potential of the light blocking layer (the conductor layer). It is necessary to provide an electrode for applying a fixed potential to the light blocking layer (the conductor layer).

In addition to the case where the pn junction formed in the boundary portion of the n⁻ layer of the drain region and the channel region consisting of the p-type polysilicon is reverse-biased, there is assumed such an alternative case where a pn junction formed in a boundary portion of the n⁻ layer of the source region and the channel region consisting of the p-type polysilicon is reverse-biased. In such a case, the light blocking layer (the conductive layer) is provided in both the boundary portion of the n⁻ layer of the drain region and the channel region consisting of the p-type polysilicon and the boundary portion of the n⁻ layer of the source region and the channel region consisting of the p-type polysilicon. As the light blocking layer (the conductor layer) is to be formed to cover only the boundary portion of the n⁻ layer (the LDD region) and the channel region consisting of the p-type polysilicon, the light blocking layer (the conductor layer) needs to be processed in a shape fit to the length (LDD length) of the formed n⁻ layer (the LDD region).

When the N-channel type TFT is switched to an ON state, the n⁻ layer (the LDD region) acts as an internal resistance. Therefore, when the length (the LDD length) of the n⁻ layer (the LDD region) increases, an ON resistance value of the TFT increases. As a result, an ON current value of the TFT decreases. Further, in the liquid crystal display device driven by the N-channel type TFT, when the ON current value of the TFT significantly decreases, writing of image data to sufficient signal level in the pixel cannot be performed, which may cause a defect in display.

Therefore, it is necessary to reduce the length (the LDD length) of the n⁻ layer (the LDD region) to some extent (e.g., 3 μm or shorter). For that purpose, as it is necessary to process the light blocking layer (the conductor layer) with high accuracy, there is a problem in that a process margin decreases.

In the N-channel type TFT, when a structure is employed in which drain light blocking layers and source light blocking layers are respectively provided in both the boundary portion of the n⁻ layer of the drain region and the channel region consisting of the p-type polysilicon and the boundary portion of the n⁻ layer of the source region and the channel region consisting of the p-type polysilicon, if the potential of the blocking layers (the conductor layers) is not fixed, there is resulted problems described below.

While the N-channel type TFT is kept in an "OFF state", the drain region is biased at potential ($V_D$(OFF)) of a drain electrode and the source region is biased at potential ($V_S$(OFF)) of a source electrode. In the drain light blocking layer that covers only the boundary portion of the n⁻ layer of the drain region and the channel region consisting of the p-type polysilicon, potential ($V_{BD}$(OFF)) that is originated from the potential ($V_D$(OFF)) of the drain electrode is induced. In the source light blocking layer that covers only the boundary portion of the n⁻ layer of the source region and the channel region consisting of the p-type polysilicon, potential ($V_{BS}$(OFF)) that is originated from the potential ($V_S$(OFF)) of the source region is induced.

Thereafter, when the N-channel type TFT is switched to an ON state, an electric field that is caused by the potential ($V_{BD}$(OFF)) of the drain light blocking layer is generated in the n⁻ layer (the LDD region) of the drain region and an electric field that is caused by the potential ($V_{BS}$(OFF)) of the source light blocking layer is generated in the n⁻ layer (the LDD region) of the source region. As a result, either of the n⁻ layer (the LDD region) of the drain region and the n⁻ layer (the LDD region) of the source region shows a relatively high resistance value. As a result, there is occurred some case where an ON resistance value of the TFT rises. Therefore, in some case, an ON current value of the TFT decreases. Further, in the liquid crystal display device driven by the N-channel type TFT, when the ON current value of the TFT significantly decreases, writing of image data in the pixel to sufficient signal level cannot be performed, whereby a defect in display is caused.

On the other hand, while the N-channel type TFT is held in the "ON state", the potential of the drain region is held at $V_D$(ON) and the potential of the source region is held at $V_S$(ON). Therefore, the potential of the drain light blocking layer that covers only the boundary portion of the n⁻ layer of the drain region and the p-type channel region gradually changes from the potential ($V_{BD}$(OFF)) in the OFF state to potential ($V_{BD}$(ON)) that is originated from the potential ($V_D$(ON)) of the drain region in the ON state. The potential of the source light blocking layer that covers only the boundary portion of the n⁻ layer of the source region and the channel region consisting of the p-type polysilicon gradually changes from the potential ($V_{BS}$(OFF)) in the OFF state to potential ($V_{BS}$(ON)) that is originated from the potential ($V_S$(ON)) of the source region in the ON state.

According to ON/OFF switching operations of the N-channel type TFT, potential ($V_{BD}$(t)) of the drain light blocking layer that covers only the boundary portion of the n– layer of the drain region and the channel region consisting of the p-type polysilicon changes between the potential ($V_{BD}$(OFF)) in the "OFF state" and the potential ($V_{BD}$(ON)) in the "ON state". Potential ($V_{BS}$(t)) of the source light blocking layer that covers only the boundary portion of the n⁻ layer of the source region and the channel region consisting of the p-type polysilicon changes between the potential ($V_{BS}$(OFF)) in the "OFF state" and the potential ($V_{BS}$(ON)) in the "ON state". When a period (τ) of the ON/OFF switching operations decreases, the change in the potential ($V_{BD}$(t)) of the drain light blocking layer and the potential ($V_{BS}(t)$) of the source light blocking layer cannot follow the period ($\tau$) of the ON/OFF switching operations. Specifically, when the repetition period ($\tau$) of the ON/OFF switching operations is short, a time average value of the potential ($V_{BD}(t)$) of the drain light blocking layer and a time average value of the potential ($V_{BS}(t)$) of the source light blocking layer is pinned in a "state shifted" from "potential in the OFF state" to "potential in the ON state" with time in appearance according to a "Duty ratio". As a result, there is some case where, in appearance, a time average of ON resistance values of the TFT shifts with time according to the "Duty ratio". Therefore, in some case, in appearance, a time average value of ON current values of the TFT shifts with time according to the "Duty ratio" for the ON state.

In order to reduce the influence of the shift, it is preferable to fix the potential of the two light blocking layers (the conductor layers). It is necessary to provide electrodes for applying fixed potential to the two light blocking layers (the conductor layers).

The present invention solves the problems mentioned above. Thus, it is an object of the present invention to provide a thin-film transistor comprising a light blocking layer excellent in a function of suppressing a photo leak current caused during light irradiation on an operation layer of a TFT; i.e. a channel region and drain and source regions, without the necessity of providing an electrode for applying fixed potential to a light blocking layer (a conductor layer), which is a cause of an increase in manufacturing cost, a method of manufacturing the thin-film transistor, a liquid crystal display device driven by using the thin-film transistor, and an electronic apparatus constructed by incorporating the liquid crystal display device therein.

Means for Solving the Problems

In order to solve the problems, first, the inventors studied a mechanism in which a photo leak current is generated when the operation layer of the TFT; i.e. the channel region and the drain and source regions, is irradiated with light from an insulative transparent substrate side.

For example, in a top gate type polysilicon TFT shown in FIG. 2, in particular, a P-channel type TFT, p-type impurities are doped at high concentration in a n-type polysilicon film to form $p^+$ regions, which are used to form drain and source regions. Further, P-type impurities are doped at low concentration on both sides of a gate electrode from a surface side of the n-type polysilicon film to form p regions, whereby regions doped with impurity at low concentration are provided. In a portion lying between the drain and source regions, a portion excluding the regions doped with impurity at low concentration is an n-type polysilicon region. The n-type polysilicon region right below the gate electrode is used as a channel region. The regions doped with impurity at low concentration provided on both the sides of the gate electrode function as LDD regions, which form a so-called LDD structure.

The drain region, the LDD region, and the channel region are formed in structure of $p^+/p/n$, and thereby Pn junction is formed in a boundary of the LDD region and the channel region. The source region, the LDD region, and the channel region are also formed in structure of $p^+/p/n$, and thereby Pn junction is formed in a boundary of the LDD region and the channel region. When the P-channel type TFT is kept in an "OFF state", a gate bias Vg(OFF) in the "OFF state" applied to a gate electrode of the P-channel type TFT is usually set in a range of Vg(OFF)>$V_S$>$V_D$ with respect to a drain voltage $V_D$ applied to a drain electrode and a source voltage $V_S$ applied to a source electrode.

Therefore, when the P-channel type TFT is kept in the "OFF state" and Vg(OFF)>$V_S$>$V_D$, pn junction on the drain side is set in a reverse bias state. As a result, when the gate bias Vg(OFF) in the "OFF state" is applied to the gate electrode of the P-channel type TFT, in a pn junction portion on the drain side, a wide depletion layer is formed in a boundary portion of the p region (the LDD region) and the channel region (the n region) in the structure of $p^+/p/n$.

In addition, as an interface between the LDD region and a base layer on the drain side is working as junction composed of the p region and the base layer (an insulating film). Because of this junction, a depleted region is formed in the LDD region on the drain side set in contact with the base layer.

On the other hand, when the P-channel type TFT is kept in the "OFF state", the pn junction on the source side is usually set in a forward bias state or a zero bias state. In a pn junction portion on the source side, a depleted region is also formed in a boundary portion of the p region (the LDD region) and the channel region in the structure of $p^+/p/n$. In particular, on a gate insulating film side, in such a case when the pn junction on the source side is also set in the reverse bias state, a depletion layer is formed in the pn junction of the LDD region and the channel region on the source side. On the other hand, the channel region right below the gate electrode is formed of an n-type polysilicon layer. When the P-channel type TFT is kept in the "OFF state", most of the channel region on the gate insulating film side is not depleted.

When the TFT is irradiated with light from the insulative transparent substrate side, the light transmitted through the insulative transparent substrate and the base layer is made incident on the polysilicon film. In the light made incident on the polysilicon film, only light having energy higher than an energy gap Eg of polysilicon is absorbed by the polysilicon film, whereby a pair of electron and hole is generated. In the $p^+$ region (the drain and source regions), since high-density of holes are present, the generated electrons vanish by recombination with the holes. When the gate bias Vg(OFF) in the "OFF state" is applied to the gate electrode of the P-channel type TFT, in the channel region (the n region) right below the gate electrode, since considerably high density of electrons are present, a considerable portion of the generated holes vanish out by recombination with the electrons.

On the other hand, a depletion layer due to pn junction is formed in the boundary of the LDD region and the channel region on the drain side. A depleted region is also formed on the interface between the LDD region and the base layer on the drain side. Therefore, electrons and holes generated in the depletion layer and the depleted region hardly recombine. The holes travel to the $p^+$ region (the drain region) and the electrons travel to the channel region (the n region) by the help of electric fields formed in the depletion layer and the depleted region.

In the gate insulating film side, when the pn junction on the source side is also set to the reverse bias state, a depletion layer is also formed in the pn junction composed of the LDD region and the channel region on the source side. In electrons and holes generated in the depletion layer on the source side, the holes recombine with the electrons injected from the channel region side and the electrons recombine with the holes injected from the LDD region side.

As a result, the inventors reached an idea that, because of light made incident on the depletion layer of the boundary portion (the pn junction portion) of the LDD region and the channel region on the drain side and the depleted region of the boundary portion (the junction portion) of the LDD region and the base region on the drain side, the electrons and the holes generated in the depletion layer and the depleted region become a main cause of generation of a photo leak current.

Therefore, the inventors reached an idea that it is possible to effectively suppress generation of a photo leak current by blocking the light made incident on the depletion layer of the boundary portion (the pn junction portion) of the LDD region and the channel region on the drain side and the depleted region of the boundary portion (the junction portion) of the LDD region and the base region on the drain side.

Actually, the inventors confirmed that, when a light blocking film is provided on the upper surface of the insulative transparent substrate to block light transmitted through the insulative transparent substrate and the base layer and made incident on the polysilicon film, although the channel region (n-type polysilicon) portion right below the gate electrode of the P-channel type TFT is not covered with the light blocking film, it is possible to effectively suppress generation of a photo leak current by blocking the light made incident on the depletion layer in the boundary portion of the LDD region and the channel region on the drain side and the depleted region of the boundary portion (the junction portion) of the LDD region and the base layer on the drain side.

In such a case when the light blocking film is provided, a structure in which an electrode for applying fixed potential to the light blocking film is not provided is selected. However, since the channel region (n-type polysilicon) portion that is lying right below the gate electrode of the gate electrode of the P-channel type TFT is not covered with the light blocking film, the influence of potential fluctuation of the light blocking film on the channel region (n-type polysilicon) portion is reduced. Therefore, the inventors also confirmed that a shift amount of the threshold voltage of the TFT that is caused by the fluctuation in the potential of the light blocking film is suppressed.

On the other hand, the drain region (the p$^+$ region) and the LDD region (the p region) on the drain side and the source region (the p$^+$ region) and the LDD region (the p region) on the source side of the P-channel type TFT are respectively covered with the divided two regions of the light blocking film. The drain region and the LDD region on the drain side are influenced by the potential ($V_{BD}(t)$) of the drain side region of the light blocking film. The source region and the LDD region on the source side are influenced by the potential ($V_{BS}(t)$) of the source side region of the light blocking film. In those cases, a range that is influenced by the potential in a portion in which the LDD region (the p region) is formed is mainly a portion that is in contact with the base layer. Therefore, when the P-channel type TFT is switched to the "ON state", an ON resistance value is mainly the resistance of the P channel and the LDD regions formed on the gate insulating film side. In other words, a portion in contact with the base layer of the LDD region does not have substantial contribution to the ON resistance value. Therefore, the inventors confirmed that, even if the potential ($V_{BD}(t)$) of the drain side region of the light blocking film and the potential ($V_{BS}(t)$) of the source side region of the light blocking film fluctuate between the "potential in the OFF state" and the "potential in the ON state" according to the periodical ON/OFF switching operations, an increase in the ON resistance value of the P-channel type TFT is not substantially caused thereby.

In particular, the inventors found that, when a structure in which the divided two regions of the light blocking film, i.e., the drain side region of the light blocking film and the source side region of the light blocking film are electrically coupled in a region where the polysilicon film is not formed is employed, the potential ($V_{BD}(t)$) of the drain side region of the light blocking film and the potential ($V_{BS}(t)$) of the source side region of the light blocking film can be set to substantially equal potentials ($V_{BD}(t)=V_{BS}(t)$) by this coupling portion.

In the P-channel type TFT, the structure in which the drain side region of the light blocking film and the source side region of the light blocking film are electrically coupled is equivalent to a state in which MIS junction (capacitor $C_D$) composed of the drain region, the base layer, and the drain side region of the light blocking film and MIS junction (capacitor $C_S$) composed of the source region, the base region, and the source side region of the light blocking film are coupled in series. The inventors found that, in that situation, when a relation between the potential ($V_D(t)$) of the drain region and the potential ($V_S(t)$) of the source region are $V_S(t)>V_D(t)$, the potential ($V_{BD}(t)$) of the drain side region of the light blocking film and the potential ($V_{BS}(t)$) of the source side region of the light blocking film satisfy a condition $V_S(t)>V_{BD}(t)=V_{BD}(t)>V_D(t)$.

In particular, when $V_S(t)>V_D(t)$, if the P-channel type TFT reaches a steady state of the "OFF state", i.e., a state in which charging of capacitor $C_D$ and capacitor $C_S$ is completed, the potential ($V_{BD}(t)$) of the drain side region of the light blocking film and the potential ($V_{BS}(t)$) of the source side region of the light blocking film satisfy a condition $V_S(t)>V_{BS}(t)=V_{BD}(t)>V_D(t)$. In that case, the potential ($V_{BD}(t)$) of the drain side region of the light blocking film and the potential ($V_{BS}(t)$) of the source side region of the light blocking film are kept at average potential between the potential ($V_D(t)$) of the drain region and the potential ($V_S(t)$) of the source region.

On the other hand, in the P-channel type TFT, a structure in which the drain side region of the light blocking film and the source side region of the light blocking film are electrically separated is equivalent to a state in which the MIS junction (capacitor $C_D$) composed of the drain region, the base layer, and the drain side region of the light blocking film, MIM junction (capacitor $C_{DIS}$) composed of the drain side region of the light blocking film, the base layer, and the source side region of the light blocking film, and the MIS junction (capacitor $C_S$) composed of the source region, the base layer, and the source side region of the light blocking film are coupled in series. The inventors found that, in that situation, if a relation between the potential ($V_D(t)$) of the drain region and the potential ($V_S(t)$) of the source region is $V_S(t)>V_D(t)$, the potential ($V_{BD}(t)$) of the drain side region of the light blocking film and the potential ($V_{BS}(t)$) of the source side region of the light blocking film satisfy a condition $V_S(t) \geq V_{BS}(t) > V_{BD}(t) \geq V_D(t)$.

In particular, when $V_S(t)>V_D(t)$, if the P-channel type TFT reaches the steady state of the "OFF state", i.e., a state in which charging of capacitor $C_D$, capacitor $C_{DIS}$, and capacitor $C_S$ is completed, the potential ($V_{BD}(t)$) of the drain side region of the light blocking film and the potential ($V_{BS}(t)$) of the source side region of the light blocking film satisfy a condition $V_S(t)>V_{BS}(t)>V_{BD}(t)>V_D(t)$.

For example, in the structure in which the drain side region of the light blocking film and the source side region of the light blocking film are electrically coupled, if the drain side region of the light blocking film and the source side region of the light blocking film are symmetrically arranged, even if operation for periodically inverting the drain bias ($V_D$) and the source bias ($V_S$) is continued, in the steady state of the "OFF state", the potential ($V_{BD}(t)$) of the drain side region of the light blocking film and the potential ($V_{BS}(t)$) of the source side region of the light blocking film are substantially in a state in which $V_{BD}(t)=V_{BS}(t)$ is maintained. The inventors found that, when the periodical ON/OFF switching operations are performed, even if charge and discharge of the MIS junction (capacitor $C_D$) composed of the drain region, the base layer, and the drain side region of the light blocking film and the MIS junction (capacitor $C_S$) composed of the source region, the base layer, and the source side region of the light blocking film do not promptly occur, a shift with time of the potential ($V_{BD}(t)$) of the drain side region of the light blocking film and the potential ($V_{BD}(t)$) of the source side region of the light blocking film in the "OFF state" is suppressed.

On the other hand, in the structure in which the drain side region of the light blocking film and the source side region of the light blocking film are electrically separated, even if the drain side region of the light blocking film and the source side region of the light blocking film are symmetrically arranged, in the case where the drain bias ($V_D$) and the source bias ($V_S$) are periodically inverted, the potential ($V_{BD}(t)$) of the drain side region of the light blocking film and the potential ($V_{BS}(t)$) of the source side region of the light blocking film periodically fluctuate. When the periodical ON/OFF switching operations are performed, if charge and discharge of the MIS junction (capacitor $C_D$) composed of the drain region, the base layer, and the drain side region of the light blocking film, the MIS junction (capacitor $C_S$) composed of the source region, the base layer, and the source side region, and the MIM junction (capacitor $C_{DIS}$) composed of the drain side region of the light blocking film, the base layer, and the source side region of the light blocking film do not promptly occur, it is predicted that a shift with time of the potential ($V_{BD}(t)$) of the drain side region of the light blocking film and the potential ($V_{BS}(t)$) of the source side region of the light blocking film in the "OFF state" is caused.

Therefore, the inventors found that, when the operation for periodically inverting the drain bias ($V_D$) and the source bias ($V_S$) is continued, and when the periodical ON/OFF switching operations are performed, if a coupling section is provided, a shift with time of the potential ($V_{BD}(t)$) of the drain side region of the light blocking film and the potential ($V_{BS}(t)$) of the source side region of the light blocking film can be substantially suppressed. The inventors found that, of course, even if the periodical ON/OFF switching operations are performed, since the potential ($V_{BD}(t)$) of the drain side region of the light blocking film and the potential ($V_{BS}(t)$) of the source side region of the light blocking film in the "OFF state" are kept substantially constant, an ON resistance value of the P-channel type TFT does not shift with time.

On the basis of the series of finding mentioned above, the inventors completed the present invention.

First, a first aspect of the present invention is an invention of a thin-film transistor explained below. Specifically, a thin-film transistor according to the first aspect of the present invention is:

a top gate type thin-film transistor formed on a transparent substrate, characterized in that in the thin-film transistor, a patterned light blocking film, a base layer, a patterned crystalline silicon film, a gate insulating film, and a patterned gate electrode film are sequentially laminated on the transparent substrate, wherein the patterned crystalline silicon film comprises:

a channel region overlapping the patterned gate electrode; and two regions doped with impurity at low concentration that are in contact with the channel region, and the patterned light blocking film is arranged not to overlap the channel region, and arranged such that the light blocking film overlaps, at least, a part of each of the two regions doped with impurity at low concentration.

In the thin-film transistor according to the first aspect of the present invention, it is preferred that such a structure that the channel region consist of a region of a first conduction type and, both the two regions doped with impurity at low concentration consist of regions of a second conduction type doped with impurity at low concentration is selected. For example, it is preferred that a structure that the channel region consists of a region of the first conduction type, in which carriers are electrons and, the two regions doped with impurity at low concentration consist of regions of a second conduction type doped with impurity at low concentration, in which carriers are holes, is selected.

It is desirable that an insulative transparent substrate is used as the transparent substrate. It is desirable that a base layer made of a light transmissive insulative material is used as the base layer. Of course, it is desirable that the patterned light blocking film is formed of a light non-transmissive conductive material. Further, it is desirable that the patterned crystalline silicon film comprises two regions of a second conduction type doped with impurity at high-concentration, which are used as a drain region and a source region.

Furthermore, it is desirable that the thin-film transistor is formed in such a structure in which the transparent substrate is an insulative transparent substrate, the base layer is a layer made of a light transmissive and insulative material, and the patterned light blocking film is entirely surrounded by the transparent substrate and the base layer to be electrically isolated.

In addition, it is desirable that the patterned light blocking film is formed in such a structure in which the patterned light blocking film comprises a third region that is not located right below the patterned crystalline silicon film, and a region on a drain side of the light blocking film and a region on a source side of the light blocking film divided across the channel region are electrically connected to each other via the third region of the light blocking film.

For example, one embodiment of the thin-film transistor according to the first aspect of the present invention is:

a top gate type crystalline silicon thin-film transistor formed on an insulative transparent substrate, characterized in that the thin-film transistor comprising:

a insulative transparent substrate;

a patterned light blocking film formed on an upper surface of the insulative transparent substrate;

a base layer made of a light transmissive and insulative material that is formed to cover the patterned light blocking film and the upper surface of the insulative transparent substrate;

a patterned crystalline silicon film formed on an upper surface of the base layer;

a gate insulating film formed to cover the patterned crystalline silicon film and the upper surface of the base layer; and a patterned gate electrode film formed on an upper surface of the gate insulating film, wherein
a field effect transistor is composed of
a gate electrode formed of the patterned gate electrode film,
the gate insulating film,
a channel region consisting of a region of a first conduction type right below the gate electrode of the patterned crystalline silicon film that is in contact with the gate insulating film,
a drain region consisting of a region of a second conduction type doped with an impurity at high concentration that is formed on the patterned crystalline silicon film,
a source region consisting of a region of the second conduction type doped with an impurity at high concentration that is formed on the patterned crystalline silicon film,
LDD regions consisting of regions of the second conduction type doped with an impurity at low concentration that are formed on a surface side of the patterned crystalline silicon film, which is in contact with the gate insulating film, on both sides of the channel region, and
a drain electrode and a source electrode made from electrode films that are formed to be respectively electrically connected to upper surfaces of the drain region and the source region;
in an ON state of the field effect transistor,
a channel is formed by applying a gate bias exceeding a threshold voltage to the gate electrode, and
a flow path of carriers through the channel and the LDD regions on both sides of the channel is formed between the drain region and the source region;
the patterned light blocking film is formed of a light non-transmissive conductive material, and surrounded by the insulative transparent substrate and the base layer to be kept in electrically isolated state;
any part of the patterned light blocking film is by no means present right below the channel region,
a forming region of the patterned light blocking film overlaps, at least, a part of a region right below the drain region and a part of a region right below the source region, and
the forming region of the patterned light blocking film are arranged to overlap a part of region right below the LDD region for each of the LDD regions that are provided on both the sides of the channel region.

A second aspect of the present invention is an invention of a thin-film transistor explained below. Specifically, the thin-film transistor according to the second aspect of the present invention is:

A top gate type thin-film transistor formed on a transparent substrate, characterized in that
in the thin-film transistor,
a patterned light blocking film,
a base layer,
a patterned crystalline silicon film,
a gate insulating film, and
a patterned gate electrode film are sequentially laminated on the transparent substrate;
the patterned crystalline silicon film comprises:
a drain region and a source region formed of regions doped with an impurity at high concentration,
a channel region having length L that overlaps the patterned gate electrode film, and
a drain side LDD region having length d and a source side LDD region having length d formed of regions doped with an impurity at low concentration that are in contact with the channel region on both sides of the gate electrode film;
the patterned light blocking film is divided into a region on a drain side and a region on a source side across the channel region and arranged not to overlap the channel region,
a space of interval x equal to or larger than the length L of the channel region is provided between the region on the drain side and the region on the source side of the divided light blocking films,
the region on the drain side of the divided light blocking films is arranged to overlap at least a part of the drain side LDD region having length d and a part of the drain region, and
the region on the source side of the divided light blocking films is arranged to overlap at least a part of the source side LDD region having length d and a part of the source region.

In particular, in the thin-film transistor,
interval x of the space provided between the region on the drain side of the light blocking film and the region on the source side of the light blocking film, which are divided across the channel region, is selected to satisfy the following equation (1) with respect to the length L of the channel region, length d of the drain side LDD region, and length d of the source side LDD region:

$$L+2d \geq x \geq L \qquad \text{eq. (1)}.$$

In the thin-film transistor according to the second aspect to the present invention,
it is preferred that such a structure that the channel region consist of a region of a first conduction type and, both the drain side LDD region and the source side LDD region consist of regions of a second conduction type doped with impurity at low concentration is selected. For example, it is preferred that a structure that the channel region consists of a region of the first conduction type, in which carriers are electrons and, the two regions doped with impurity at low concentration consist of regions of a second conduction type doped with impurity at low concentration, in which carriers are holes, is selected.

It is desirable that, as the transparent substrate, an insulative transparent substrate is used. Further, it is desirable that, as the base layer, a base layer made of a light transmissive insulative material is used. Of course, it is desirable that the patterned light blocking film is formed of a light non-transmissive conductive material.

Furthermore, it is preferable that the thin-film transistor is formed in such a structure in which
the transparent substrate is an insulative transparent substrate,
the base layer is a layer made of a light transmissive and insulative material, and
the patterned light blocking film is entirely surrounded by the transparent substrate and the base layer to be electrically isolated.

In addition, it is preferable that the patterned light blocking film is formed in such a structure in which
the patterned light blocking film comprises a third region that is not located right below the patterned crystalline silicon film, and
a region on a drain side of the light blocking film and a region on a source side of the light blocking film divided across the channel region are electrically connected to each other via the third region of the light blocking film.

For example, one embodiment of the thin-film transistor according to the second aspect of the present invention is:
a top gate type crystalline silicon thin-film transistor formed on an insulative transparent substrate, characterized in that:
the thin-film transistor comprising:
a insulative transparent substrate;
a patterned light blocking film formed on an upper surface of the insulative transparent substrate;

a base layer made of a light transmissive and insulative material that is formed to cover the patterned light blocking film and the upper surface of the insulative transparent substrate;

a patterned crystalline silicon film formed on an upper surface of the base layer;

a gate insulating film formed to cover the patterned crystalline silicon film and the upper surface of the base layer; and a patterned gate electrode film formed on an upper surface of the gate insulating film, wherein a field effect transistor is composed of a gate electrode having gate length of $L_{gate}$ formed of the patterned gate electrode film, the gate insulating film, a channel region having length L equal to the gate length $L_{gate}$ consisting of a region of a first conduction type of the patterned crystalline silicon film that is in contact with the gate insulating film, in which the region of the first conduction type is formed right below the gate electrode having gate length of $L_{gate}$, a drain region having length $L_D$ and a source region having length $L_S$ consisting of regions of a second conduction type doped with impurity at high concentration that are formed in the patterned crystalline silicon film on both sides of the gate electrode, a drain side LDD region having length d and a source side LDD region having length d consisting of regions of the second conduction type doped with impurity at low concentration that are formed on a surface side of the patterned crystalline silicon film, which is in contact with the gate insulating film, between the channel and drain regions and the source region, and a drain electrode and a source electrode made of electrode films that are formed to be respectively electrically connected to upper surfaces of the drain region and the source region;

in an ON state of the field effect transistor, a channel is formed by applying a gate bias exceeding a threshold voltage to the gate electrode, a flow path of carriers through the drain region, the drain side LDD region, the channel, the source side LDD region, and the source region is formed between the drain region and the source region, the patterned light blocking film is formed of a light non-transmissive conductive material, and surrounded by the insulative transparent substrate and the base layer to be kept in electrically isolated state, the patterned light blocking film comprises portions that are formed by dividing into a region on a drain side and a region on a source side across the channel region, any part of the patterned light blocking film is by no means right below the channel region having length L, a space of interval x equal to or larger than the length L of the channel region is provided between the region on the drain side and the region on the source side of the divided light blocking films, the region on the drain side of the divided light blocking films is arranged to overlap, at least, a part of the drain side LDD region having length d and a part of the drain region, and the region on the source side of the divided light blocking films is arranged to overlap, at least, a part of the source side LDD region having length d and a part of the source region.

In the thin-film transistor according to the second aspect of the present invention, it is preferred for the embodiment that interval x of the space provided between the region on the drain side of the light blocking film and the region on the source side of the light blocking film, which are divided across the channel region, is selected to satisfy the following equation (1) with respect to the length L of the channel region, length d of the drain side LDD region, and length d of the source side LDD region:

$$L+2d \geq x \geq L \qquad \text{eq. (1).}$$

In addition, it is desirable that, in the region on the drain side of the light blocking film and the region on the source side of the light blocking film divided across the channel region, an end on the gate electrode side of the region on the drain side of the light blocking film and an end on the gate electrode side of the region on the source side of the light blocking film are arranged to be in positions symmetrical with respect to the gate electrode.

In the thin-film transistor according to the second aspect of the present invention as well as the thin-film transistor according to the first aspect of the present invention, it is preferable to employ such a structure in which the patterned light blocking film comprises a third region that is not located right below the patterned crystalline silicon film, and the region on the drain side of the light blocking film and the region on the source side of the light blocking film divided across the channel region are electrically connected to each other via the third region of the light blocking film.

Further, it is preferable to employ such a structure in which the regions of the second conduction type doped with impurity at high concentration reach the upper surface of the base layer, and the regions of the second conduction type doped with impurity at low concentration also reach the upper surface of the base layer.

In the thin-film transistor according to the first aspect of the present invention and the thin-film transistor according to the second aspect of the present invention, it is desirable that such a structure that the top gate type field effect transistor further comprises an interlayer insulating film formed to cover the gate electrode and the upper surface of the gate insulating film is employed.

On the other hand, in the thin-film transistor according to the first aspect of the present invention and the thin-film transistor according to the second aspect of the present invention, such a mode may be selected in which the first conduction type is a conduction type in which holes are carriers, the second conduction type is a conduction type in which electrons are carriers, and the top gate type field effect transistor to be constructed is an N-channel type field effect transistor.

Alternatively, another mode may be selected in which the first conduction type is a conduction type in which electrons are carriers, the second conduction type is a conduction type in which holes are carriers, and the top gate type field effect transistor to be constructed is a P-channel type field effect transistor.

A third aspect of the present invention is an invention of a process for manufacturing the thin-film transistor according to the first aspect of the present invention. Specifically, the method of manufacturing a thin-film transistor according to the third aspect of the present invention is:

a method of manufacturing the thin-film transistor according to the first aspect of the present invention having the aforementioned structure on a transparent substrate, characterized in that the method of manufacturing the thin-film transistor comprises a step of forming such a structure in which
a patterned light blocking film,
a base layer,
a patterned crystalline silicon film,
a gate insulating film, and
a patterned gate electrode film are sequentially laminated on the transparent substrate,
wherein
the patterned crystalline silicon film comprises:
a channel region overlapping the patterned gate electrode, and
two regions doped with impurity at low concentration that are in contact with the channel region; and
the patterned light blocking film is arranged not to overlap the channel region and arranged such that the patterned light blocking film partially overlaps at least any one of the two regions doped with impurity at low concentration.

In the method of manufacturing the thin-film transistor according to the third aspect of the present invention,
it is preferred that such a structure that the channel region consist of a region of a first conduction type and, both the two regions doped with impurity at low concentration consist of regions of a second conduction type doped with impurity at low concentration is selected. For example, it is preferred that a structure that the channel region consists of a region of the first conduction type, in which carriers are electrons and, the two regions doped with impurity at low concentration consist of regions of a second conduction type doped with impurity at low concentration, in which carriers are holes, is selected.

It is desirable that an insulative transparent substrate is used as the transparent substrate. Further, it is desirable that a base layer made of a light transmissive insulative material is used as the base layer. Of course, it is desirable that the patterned light blocking film is made of a light non-transmissive conductive material. In addition, it is desirable that the patterned crystalline silicon film comprises two regions of a second conduction type doped with impurity at high concentration that are used as a drain region and a source region.

Furthermore, it is desirable that the thin-film transistor is formed in such a structure in which
the transparent substrate is an insulative transparent substrate;
the base layer is a layer made of a light transmissive and insulative material; and
the patterned light blocking film is entirely surrounded by the transparent substrate and the base layer to be electrically isolated.

In addition, it is desirable that the patterned light blocking film is formed in such a structure in which
the patterned light blocking film comprises a third region that is not located right below the patterned crystalline silicon film, and
a region on a drain side of the light blocking film and a region on a source side of the light blocking film divided across the channel region are electrically connected to each other via the third region of the light blocking film.

For example, one embodiment of the method of manufacturing the thin-film transistor according to the third aspect of the present invention is
a method of manufacturing the thin-film transistor illustrated above as the embodiment of the thin-film transistor according to the first aspect of the present invention on an insulative transparent substrate, characterized in that the method of manufacturing the thin-film transistor at least comprising the following steps (1) to (13):

step (1) of forming a film made of the light non-transmissive conductive material on an upper surface of the insulative transparent substrate;

step (2) of patterning the film formed of the light non-transmissive conductive material to form the patterned light blocking film on the upper surface of the insulative transparent substrate;

step (3) of forming a film made of a light transmissive insulative material so as to cover the patterned light blocking film and the upper surface of the insulative transparent substrate to form a base layer;

step (4) of forming an amorphous silicon film on an upper surface of the base layer;

step (5) of subjecting the amorphous silicon film formed on the upper surface of the base layer to heat treatment by irradiating with beam of excimer laser or the like to form a crystalline silicon film of the first conduction type;

step (6) of patterning the crystalline silicon film of the first conduction type to form the patterned crystalline silicon film of the first conduction type on the upper surface of the base layer;

step (7) of forming a gate insulating film to cover the patterned crystalline silicon film and the upper surface of the base layer;

step (8) of forming a gate electrode film on an upper surface of the gate insulating film;

step (9) of patterning the gate electrode film to form the patterned gate electrode film on the upper surface of the gate insulating film;

step (10) of implanting, at high concentration, an impurity for giving the second conductivity in the patterned crystalline silicon film of the first conduction type to form a region of the second conduction type doped with impurity at high concentration for a drain region and a region of the second conduction type doped with impurity at high concentration for a source region;

step (11) of implanting, at low concentration, the impurity for giving the second conductivity into the patterned crystalline silicon film of the first conduction type to form, on both sides of the gate electrode, regions of the second conduction type doped with impurity at low-concentration;

step (12) of subjecting the impurities for giving the second conductivity respectively implanted into the regions of the second conduction type doped with impurity at high concentration and the regions of the second conductivity type doped with impurity at low concentration to activation heat treatment to form the drain region and the source region from the regions of the second conduction type doped with impurity at high concentration, and to form LDD regions respectively on both sides of the gate electrode from the regions of the second conductivity type doped with impurity at low concentration; and step (13) of providing an opening for electrode formation in the gate insulating film that covers upper surfaces of the drain region and the source region, and then forming an electrode film in the opening to be electrically connected to the upper surfaces of the drain region and the source region to form the drain electrode and the source electrode from the electrode film, wherein
length of the patterned gate electrode film formed in the step (9) is selected to be equal to gate length of the gate electrode,
a region right below the gate electrode having the gate length of the patterned crystalline silicon film of the first conductive type that is in contact with the gate insulating film is used as a channel region having length equal to the gate length, lengths of the regions of the second conduction type doped with impurity at high concentration formed in the step (10) are respectively selected to be equal to length $L_D$ of the drain region and length $L_S$ of the source region, lengths of the regions of the second conduction type doped with impurity at low concentration formed between the gate electrode and the drain region and between the gate electrode and the source region in the step (11) are respectively selected to be equal to length d of the drain side LDD region and length d of the source side LDD region, a pattern shape of the patterned light blocking film formed in the step (2) is selected such that a space of interval x equal to or lager than length of the channel region is provided in the pattern shape, whereby any part of the patterned light blocking film is by no means present right below the channel region;

the forming region of the patterned light blocking film overlaps, at least, the part of the region right below the drain region and the part of the region right below the source region; and the forming region of the patterned light blocking film are arranged to overlap the part of region right below the LDD region for each of the LDD regions that are provided on both the sides of the channel region, an arrangement position of the patterned gate electrode film, with respect to a pattern shape of the patterned light blocking film formed in the step (2), is selected such that the patterned gate electrode film formed in the step (9) is to be positioned above the space of interval x equal to or larger than the length of the channel region, and an arrangement position of the patterned gate electrode film is aligned such that a space having length d is to be provided between a side end on the drain region side of the patterned gate electrode film and a side end on the gate electrode film side of the drain region; and a space having length d is to be provided between a side end on the source region side of the patterned gate electrode film and a side end on the gate electrode film side of the source region.

A fourth aspect of the present invention is an invention of a process for manufacturing the thin-film transistor according to the second aspect of the present invention. Specifically, the method of manufacturing the thin-film transistor according to the fourth aspect of the present invention is a method of manufacturing the thin-film transistor according to the second aspect of the present invention having the structure mentioned above on a transparent substrate, characterized in that the method of manufacturing the thin-film transistor comprises a step of forming such a structure in which a patterned light blocking film, a base layer, a patterned crystalline silicon film, a gate insulating film, and a patterned gate electrode film are sequentially laminated on the transparent substrate, wherein the patterned crystalline silicon film comprises:

a drain region and a source region formed of regions doped with an impurity at high concentration, a channel region having length L that overlaps the patterned gate electrode film, and a drain side LDD region having length d and a source side LDD region having length d formed of regions doped with an impurity at low concentration that are in contact with the channel region on both sides of the gate electrode film;

the patterned light blocking film is divided into a region on a drain side and a region on a source side across the channel region and arranged not to overlap the channel region, a space of interval x equal to or larger than the length L of the channel region is provided between the region on the drain side and the region on the source side of the divided light blocking films, the region on the drain side of the divided light blocking films is arranged to overlap at least a part of the drain side LDD region having length d and a part of the drain region, and the region on the source side of the divided light blocking films is arranged to overlap at least a part of the source side LDD region having length d and a part of the source region.

In the method of manufacturing the thin-film transistor according to the fourth aspect to the present invention, it is preferred that such a structure that the channel region consist of a region of a first conduction type and, both the drain side LDD region and the source side LDD region consist of regions of a second conduction type doped with impurity at low concentration is selected. For example, it is preferred that a structure that the channel region consists of a region of the first conduction type, in which carriers are electrons and, the two regions doped with impurity at low concentration consist of regions of a second conduction type doped with impurity at low concentration, in which carriers are holes, is selected.

It is desirable that, as the transparent substrate, an insulative transparent substrate is used. Further, it is desirable that, as the base layer, a base layer made of a light transmissive insulative material is used. Of course, it is desirable that the patterned light blocking film is formed of a light non-transmissive conductive material.

Furthermore, it is preferable that the thin-film transistor is formed in such a structure in which the transparent substrate is an insulative transparent substrate;

the base layer is a layer made of a light transmissive and insulative material; and the patterned light blocking film is entirely surrounded by the transparent substrate and the base layer to be electrically isolated.

In addition, it is preferable that the patterned light blocking film is formed in such a structure in which the patterned light blocking film comprises a third region that is not located right below the patterned crystalline silicon film, and a region on a drain side of the light blocking film and a region on a source side of the light blocking film divided across the channel region are electrically connected to each other via the third region of the light blocking film.

For example, one embodiment of the method of manufacturing the thin-film transistor according to the fourth aspect of the present invention is a method of manufacturing the thin-film transistor illustrated above as one embodiment of the thin-film transistor according to the second aspect of the present invention on an insulative transparent substrate, characterized in that the method of manufacturing the thin-film transistor at least comprising the following steps (1) to (13):

step (1) of forming a film made of the light non-transmissive conductive material on an upper surface of the insulative transparent substrate;

step (2) of patterning the film formed of the light non-transmissive conductive material to form the patterned light blocking film on the upper surface of the insulative transparent substrate;

step (3) of forming a film made of a light transmissive insulative material so as to cover the patterned light blocking film and the upper surface of the insulative transparent substrate to form a base layer;

step (4) of forming an amorphous silicon film on an upper surface of the base layer;

step (5) of subjecting the amorphous silicon film formed on the upper surface of the base layer to heat treatment by irradiating with beam of excimer laser or the like to form a crystalline silicon film of the first conduction type;

step (6) of patterning the crystalline silicon film of the first conduction type to form the patterned crystalline silicon film of the first conduction type on the upper surface of the base layer;

step (7) of forming a gate insulating film to cover the patterned crystalline silicon film and the upper surface of the base layer;

step (8) of forming a gate electrode film on an upper surface of the gate insulating film;

step (9) of patterning the gate electrode film to form the patterned gate electrode film on the upper surface of the gate insulating film;

step (10) of implanting, at high concentration, an impurity for giving the second conductivity in the patterned crystalline silicon film of the first conduction type to form a region of the second conduction type doped with impurity at high concentration for a drain region and a region of the second conduction type doped with impurity at high concentration for a source region;

step (11) of implanting, at low concentration, the impurity for giving the second conductivity into the patterned crystalline silicon film of the first conduction type to form, on both sides of the gate electrode, regions of the second conduction type doped with impurity at low-concentration;

step (12) of subjecting the impurities for giving the second conductivity respectively implanted into the regions of the second conduction type doped with impurity at high concentration and the regions of the second conductivity type doped with impurity at low concentration to activation heat treatment to form the drain region and the source region from the regions of the second conduction type doped with impurity at high concentration, and to form LDD regions respectively on both sides of the gate electrode from the regions of the second conductivity type doped with impurity at low concentration; and step (13) of providing an opening for electrode formation in the gate insulating film that covers upper surfaces of the drain region and the source region, and then forming an electrode film in the opening to be electrically connected to the upper surfaces of the drain region and the source region to form the drain electrode and the source electrode from the electrode film, wherein length of the patterned gate electrode film formed in the step (9) is selected to be equal to gate length of $L_{gate}$ of the gate electrode, a region right below the gate electrode having the gate length $L_{gate}$ of the patterned crystalline silicon film of the first conductive type that is in contact with the gate insulating film is used as a channel region having length equal to the gate length $L_{gate}$;

lengths of the regions of the second conduction type doped with impurity at high concentration formed in the step (10) are respectively selected to be equal to length $L_D$ of the drain region and length $L_S$ of the source region, lengths of the regions of the second conduction type doped with impurity at low concentration formed on both the sides of the gate electrode in the step (11) are respectively selected to be equal to length d of the drain side LDD region and length d of the source side LDD region, the patterned light blocking film formed in step (2) is divided into a region on the drain side and a region on the source side across the channel region, a space of interval x equal to or larger than the length L of the channel region is provided between the region on the drain side and the region on the source side of the divided light blocking films, and when an arrangement position of the patterned gate electrode film is aligned above the space of interval x equal to the length L of the channel region, the arrangement position of the patterned gate electrode film is aligned such that the region on the drain side of the divided light blocking films overlaps, at least, a part of the drain side LDD region having length d and a part of the drain region, and the region on the source side of the divided light blocking films is arranged to overlap at least a part of the source side LDD region having length d and a part of the source region.

In such a case, it is preferred that interval x of the space provided between the region on the drain side of the light blocking film and the region on the source side of the light blocking film, which are divided across the channel region, is selected to satisfy the following equation (1) with respect to the length L of the channel region, length d of the drain side LDD region, and length d of the source side LDD region:

$$L+2d \geq x \geq L \qquad \text{eq. (1).}$$

Further, it is desirable that with respect to the region on the drain side of the light blocking film and the region on the source side of the light blocking film divided across the channel region, the arrangement position of the patterned gate electrode film is aligned such that, an end on the gate electrode side of the region on the drain side of the light blocking film and an end on the gate electrode side of the region on the source side of the light blocking film are in positions symmetrical with respect to the gate electrode.

Furthermore, in the thin-film transistor according to the first aspect of the present invention that is produced by the method of manufacturing the thin-film transistor according to the third aspect of the present invention and the thin-film transistor according to the second aspect of the present invention that is produced by the method of manufacturing the thin-film transistor according to the fourth aspect of the present invention, it is preferable that the patterned light blocking film comprises a third region that is not located right below the patterned crystalline silicon film of the first conduction type, and the region on the drain side of the light blocking film and the region on the source side of the light blocking film that are divided with the channel region between are electrically connected to each other via the third region of the light blocking film.

Further, it is preferable to employ such a structure in which the regions of the second conduction type doped with impurity at high concentration reach the upper surface of the base layer, and the regions of the second conduction type doped with impurity at low concentration also reach the upper surface of the base layer.

In addition, the method according to the third aspect and the fourth aspect of the present may employ such manufacturing process comprising further step of forming, for the top gate type field effect transistor, an interlayer insulating film formed to cover the gate electrode and the upper surface of the gate insulating film.

In the thin-film transistor according to the first aspect of the present invention that is produced by the method of manufacturing the thin-film transistor according to the third aspect of the present invention and the thin-film transistor according to the second aspect of the present invention that is produced by the method of manufacturing the thin-film transistor according to the fourth aspect of the present invention, such a mode may be selected in which the first conduction type is a conduction type in which holes are carriers, the second conduction type is a conduction type in which electrons are carriers, and the top gate type field effect transistor to be constructed is an N-channel type field effect transistor.

Alternatively, another mode may be selected in which the first conduction type is a conduction type in which electrons are carriers, the second conduction type is a conduction type in which holes are carriers, and the top gate type field effect transistor to be constructed is a P-channel type field effect transistor.

A fifth aspect of the present invention is corresponding to an invention of a method of using the thin-film transistor according to the first aspect of the present invention or the thin-film transistor according to the second aspect of the present invention. Specifically, the fifth aspect of the present invention is an invention of a display device driven using the thin-film transistor according to the first aspect of the present invention or the thin-film transistor according to the second aspect of the present invention.

Hence, the display device according to the fifth aspect of the present invention is:

a display device driven using a top gate type crystalline silicon thin-film transistor formed on a transparent substrate, wherein the top gate type crystalline silicon thin-film transistor that is formed on the transparent substrate to be used as a driving device in the display device is the thin-film transistor according to the first aspect of the present invention or the thin-film transistor according to the second aspect of the present invention mentioned above.

For example, a preferred embodiment of the display device according to the fifth aspect of the present invention is a display device driven using a top gate type crystalline silicon thin-film transistor formed on an insulative transparent substrate, wherein the top gate type crystalline silicon thin-film transistor that is formed on the insulative transparent substrate to be used as a driving device in the display device is the thin-film transistor according to the first aspect of the present invention or the thin-film transistor according to the second aspect of the present invention mentioned above.

One embodiment of the display device according to the fifth aspect of the present invention is an invention of a liquid crystal display device driven using the thin-film transistor according to the first aspect of the present invention or the thin-film transistor according to the second aspect of the present invention.

Hence, one embodiment of the display device according to the fifth aspect of the present invention is a liquid crystal display device driven using a top gate type crystalline silicon thin-film transistor formed on an insulative transparent substrate, wherein the liquid crystal display device employs a style of display in which backlight incident from the insulative transparent substrate side is used for the liquid crystal display, and as the top gate type crystalline silicon thin-film transistor formed on the insulative transparent substrate that receives light irradiation by the back light, a thin-film transistor illustrated as the one embodiment of the thin-film transistor according to the first aspect of the present invention or a thin-film transistor illustrated as the one embodiment of the thin-film transistor according to the second aspect of the present invention is used.

A sixth aspect of the present invention is also corresponding to an invention of a method of using the thin-film transistor according to the first aspect of the present invention or the thin-film transistor according to the second aspect of the present invention. Specifically, the sixth aspect of the present invention is an invention of an electronic apparatus that is constructed by using the display device according to the fifth aspect of the present invention as a component thereof.

Hence, an electronic apparatus according to the sixth aspect of the present invention is an electronic apparatus comprising a display device, wherein the display device employed in the electronic apparatus is the display device according to the fifth aspect of the present invention.

One embodiment of the electronic apparatus according to the sixth aspect of the present invention is an invention of an electronic apparatus that is constructed by using the display device, in particular the liquid crystal display according to the fifth aspect of the present invention as a component thereof. Specifically, one embodiment of the electronic apparatus according to the sixth aspect of the present invention is an electronic apparatus in which a liquid crystal display device is employed as a display component, wherein the liquid crystal display device that is employed in the electronic apparatus employs a style of display in which backlight incident from the insulative transparent substrate side is used for the liquid crystal display, and the liquid crystal display device is the liquid crystal display device that is illustrated above as the one embodiment of the display device according to the fifth aspect of the present invention.

In the present invention, a polysilicon film may be employed as the crystalline silicon film.

Effects of the Invention

In the thin-film transistor according to the present invention, the two regions of the divided light blocking films are provided on the upper surface of the insulative transparent substrate to shield the drain region and the source region, although not shielding the channel region, when light irradiated from the insulative transparent substrate side is made incident on the crystalline silicon film that is used as the operation layer of the TFT. Therefore, the divided light blocking films are excellent in a function of suppressing a photo leak current that is induced when the light transmitted through the insulative transparent substrate and the base layer is made incident on the LDD region on the drain side and the LDD region on the source side. Since the divided light blocking films do not overlap the channel region, the potential of the light blocking layer has no influence on the channel region. As a result, fluctuation in the threshold voltage of the TFT due to the influence of the potential of the light blocking layer is prevented. Since it is unnecessary to provide any electrode for externally applying fixed bias to the light blocking layer (the conductor layer), the cause of an increase in manufacturing cost is eliminated. In the liquid crystal display device driven using the thin-film transistor, the use of the excellent performance of the thin-film transistor according to the present invention prevents occurrence of such a writing operation failure that signal for image accidentally fails to be written to sufficient level in the pixel, which causes a defect in display.

BRIEF DESCRIPTION OF THE DRAWINGS

FIG. 7-1 is a flowchart illustrating process for manufacturing a thin-film transistor according to a second exemplary embodiment of the present invention, wherein steps (a) to (d) are shown;

FIG. 7-2 is a flowchart illustrating the process for manufacturing a thin-film transistor according to the second exemplary embodiment of the present invention, wherein steps (e) to (g) are shown;

FIG. 7-3 is a flowchart illustrating the process for manufacturing a thin-film transistor according to the second exemplary embodiment of the present invention, wherein steps (h) to (j) are shown;

FIG. 7-4 is a flowchart illustrating the process for manufacturing a thin-film transistor according to the second exemplary embodiment of the present invention, wherein steps (k) to (l) are shown;

FIG. 8-1 is a flowchart illustrating a process for manufacturing a thin-film transistor (TFT-C) of conventional type, which is compared with the process of the present invention, wherein steps (a) to (d) are shown;

FIG. 8-2 is a flowchart illustrating the process for manufacturing the thin-film transistor (TFT-C) of conventional type, which is compared with the process of the present invention, wherein steps (e) to (h) are shown;

FIG. 8-3 is a flowchart illustrating the process for manufacturing the thin-film transistor (TFT-C) of conventional type, which is compared with the process of the present invention, wherein steps (i) to (k) are shown;

FIG. 8-4 is a flowchart illustrating the process for manufacturing the thin-film transistor of conventional type (TFT-C), which is compared with the process of the present invention, wherein steps (l) to (n) are shown;

Figure 1:
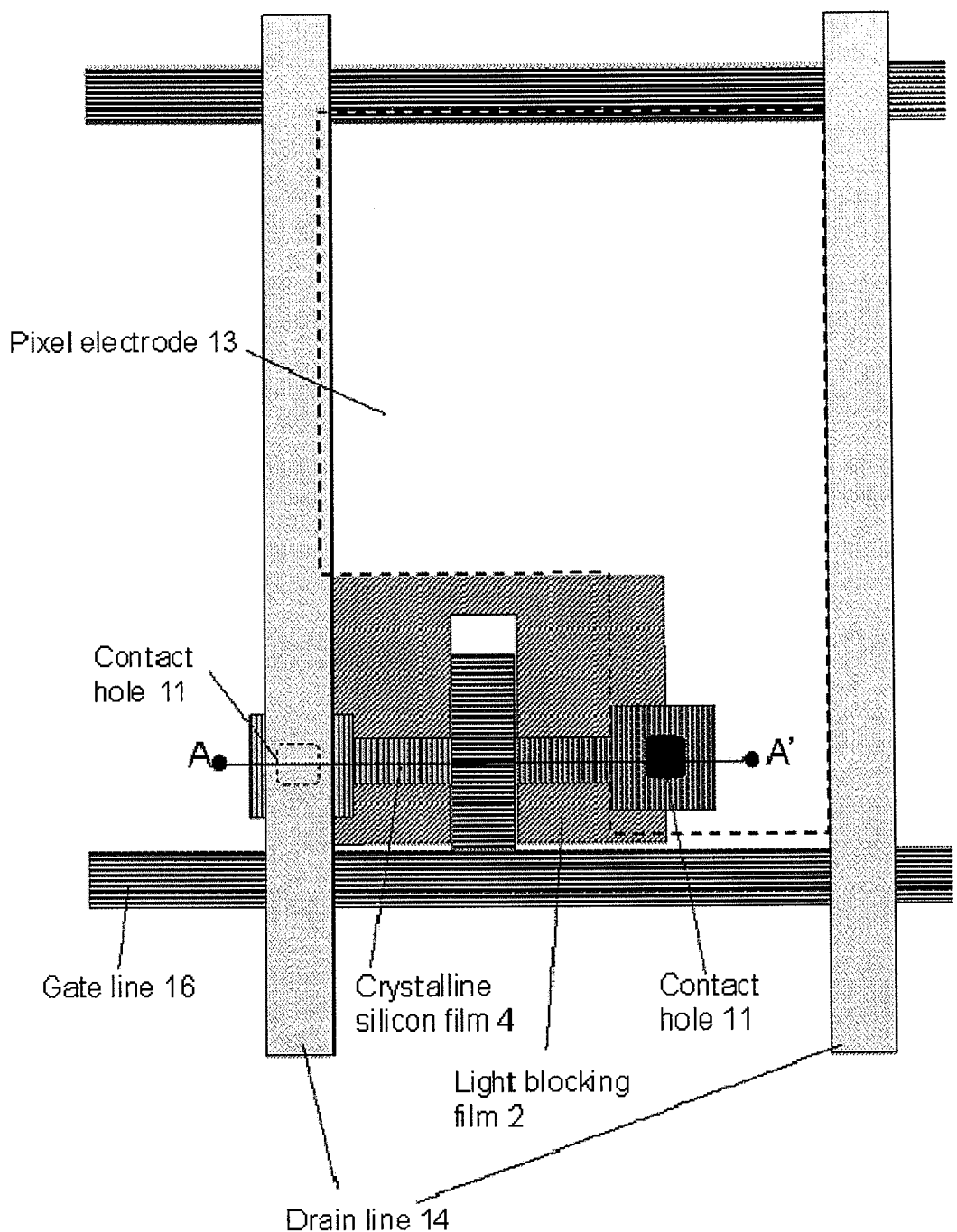
FIG. 1 is a top view schematically showing the structure of a first exemplary embodiment of a thin-film transistor according to the present invention.

DESCRIPTION OF SYMBOLS 1 insulative transparent substrate
2 light blocking film
3 base layer
4 crystalline silicon film
5 gate insulating film
6 gate electrode film
7 regions doped with impurity at low-concentration (LDD regions)
8 source region
9 drain region
10 first interlayer insulating film
11 contact hole
12 electrode film
13 pixel electrode
14 drain line
15 second interlayer insulating film
16 gate line
21 backlight unit
22 active-matrix substrate
23 scanning circuit
24 data circuit
25 pixel
26 liquid crystal layer
27 opposed substrate
28 liquid crystal panel
29 liquid crystal display device
30 housing
31 mobile phone

BEST MODE FOR CARRYING OUT THE INVENTION

A thin-film transistor and a manufacturing process for the thin-film transistor according to the present invention, a display device for which the thin-film transistor according to the present invention is used as a driving device and an electronic apparatus to which the display device is applied are explained more in detail below.

Technical characteristics of the present invention are summarized below.

A first characteristic of the present invention is that, in a TFT in which, at least, a light blocking film that is arranged not to superimpose on a channel region, a base layer, a silicon film, a gate insulating film, and a gate electrode film are formed on a transparent substrate, the light blocking film underlying the silicon film is divided across the channel region, and an interval between the divided light blocking films is equal to or larger than channel length and equal to or smaller than a sum of the channel length and a double of LDD length.

A second characteristic of the present invention is that, in the divided light blocking film, ends on the opposite side of sides opposed across the channel region are located below high-concentration impurity regions.

A third characteristic of the present invention is that the light blocking films divided across the channel region are electrically connected in a region other than the channel region.

Further, a display device according to the present invention is characterized by such feature that the display device comprises the thin-film transistor mentioned above.

Furthermore, an electronic apparatus according to the present invention is characterized by such feature that the electronic apparatus is equipped with said display device.

The aforementioned TFT having the first characteristic of the present invention is characterized by the following features:

the thin-film transistor has such structure, in which a patterned light blocking film, a base layer, a patterned silicon film, a gate insulating film, and a patterned gate electrode film are sequentially laminated on a transparent substrate, wherein the patterned silicon film comprises a channel region overlapping the patterned gate electrode film and two regions doped with impurity at low concentration that are in contact with the channel region, and the patterned light blocking film is formed in such a pattern that the patterned light blocking film is arranged not to overlap the channel region and arranged such that the patterned light blocking film partially overlaps at least each of the two regions doped with impurity at low concentration.

In such a case, the first characteristic and the second characteristic are specifically equivalent to the following condition that, in a direction in which carriers flow from one of the two regions doped with impurity at low concentration to the channel region and further flows to the other of the two regions doped with impurity at low concentration during the operation of the thin-film transistor, when an interval between ends of the patterned light blocking film overlapping the two regions doped with impurity at low concentration is represented as x, a sum of the lengths of the two regions doped with impurity at low concentration is represented as 2d, and the length of the channel region is represented as L, $L+2d \geq x \geq L$ is satisfied.

The third characteristic of the present application can be attained by employing such a structure in which the patterned light blocking film has one continuous pattern.

For the first to third characteristics of the present invention to obtain the aimed effects thereof, in general, a structure in which the patterned light blocking film is entirely surrounded by a transparent substrate showing insulation properties and a film showing insulation properties to be electrically isolated is employed.

In order to achieve the first characteristic of the present invention, a process for manufacturing the TFT needs to accord with the following manufacturing method:

A method of manufacturing a thin-film transistor comprising a channel region and regions doped with impurity at low concentration between the channel region and regions doped with impurity at high concentration, wherein a light blocking film is formed on a transparent substrate to be arranged such that the light blocking film is arranged not to overlap the channel region and arranged to partially overlap each of the two regions doped with impurity at low concentration; and then a base layer, a patterned silicon film, a gate insulating film, and a patterned gate electrode film are sequentially laminated on the patterned light blocking film.

In such a case of the process, the first characteristic and the second characteristic of the present invention is specifically corresponding to the following condition:

to be employed is a method of manufacturing such a thin-film transistor, wherein in a direction in which carriers flow from one of the two regions doped with impurity at low concentration to the channel region and further flows to the other of the two regions doped with impurity at low concentration during the operation of the thin-film transistor, when an interval between ends of the patterned light blocking film overlapping the two regions doped with impurity at low concentration is represented as x, a sum of the lengths of the two regions doped with impurity at low concentration is represented as 2d, and the length of the channel region is represented as L, the patterned light blocking film is formed so as to satisfy $L+2d \geq x \geq L$.

The third characteristic of the present application can be attained by forming the patterned light blocking film as one continuous pattern.

For the first to third characteristics of the present invention to obtain the aimed effects thereof, in general, it is necessary to form the patterned light blocking film that is entirely surrounded by a transparent substrate showing insulation properties and a film showing insulation properties to be electrically isolated.

The effects of the present invention obtained when the first to third characteristics of the present invention are employed and an action (a principle) which is used to obtain the effects can be summarized below.

When light is irradiated in silicon, pairs of electron and hole are generated by light absorbed therein. If an electric field is present therein, the generated electrons and holes are transported in opposite directions, and thereby, a flow of photo leak current is induced. A region where the photo leak current is generated during the light irradiation is a region where the electric field for transporting the electrons and the holes generated by the light absorption in the opposite directions is present. When bias is applied between a source region and a drain region, in a TFT being kept in an "OFF state", the regions in which an electric field due to a potential difference between the source region and the drain region is present are a channel region and LDD regions provided on both sides of the channel region, in particular, the LDD region on a drain side and a portion on the drain side of the channel region. In the present invention, when bias is applied between the source region and the drain region, in the TFT being kept in the "OFF state", among the channel region and the LDD regions provided on both the sides of the channel region where the electric field is present, the LDD regions on both the sides of the channel region excluding the channel region are shielded from light using the patterned light blocking film to suppress the photo leak current.

A reason for the effect has not been totally revealed at present, but the possible reason is considered to be a mechanism explained below. In the "OFF state" in which a channel is not formed, the electric field that is caused by the bias applied between the source region and the drain region is mainly present in the LDD regions. Therefore, since the electric field is present in the LDD regions, carriers generated by optical excitation can be efficiently brought out to the outside. On the other hand, in a region where the electric field is not present in the channel portion, the carriers generated by the optical excitation recombines with each other in the site and cannot be taken out to the outside. Therefore, taking into account the fact that, in some case, a bias state of junction between the channel region and the drain region including the LDD region and a bias state of junction between the channel region and the source region including the LDD region are interchanged in the course of driving a liquid crystal display device, it is possible to effectively suppress the photo leak current by shielding the LDD regions with the patterned light blocking film as used in the TFT according to the present invention.

Indeed, when bias is applied between the source region and the drain region, in the TFT being kept in the "OFF state", a region where an electric field due to pn junction is present is a depletion layer region of the pn junction which is composed of the LDD regions and the channel region. In particular, when carrier density of the LDD regions is lower than carrier density of the channel region, the region is depleted LDD regions. Further, an electric field is also present in a depleted region that is formed at an interface between the LDD region on the drain side and the base layer. In the TFT being kept in the "OFF state", it is possible to suppress the photo leak current if the regions where the electric field is present (the depletion layer region and the depleted region) in the LDD region on the drain side are shielded from light.

In the case when the source region and the drain region overlap the light blocking film and the potential of the light blocking film is not fixed, if voltage is applied to each of source and drain electrodes, the potential of the light blocking film changes according to the applied voltage. However, in the structure of the TFT according to the present invention, since the light blocking film is not present in the channel region, the channel region is not affected by the potential of the light blocking film and a resistance value of the LDD regions only slightly fluctuates. Therefore, when the thin-film transistor is applied to a liquid crystal display device, it is possible to more surely obtain an excellent display performance by slightly increasing a gate bias to be applied, whereas a condition of driving bias used in a conventional display (for the purpose of displaying in a liquid crystal display device to which a TFT without a light blocking film is applied) does not have to be changed.

Further, in the case when fluctuation in performance of TFT is large, it is necessary to substantially increase the gate bias to match a TFT having a lowest ON current value to prevent an accidental defect in display, which causes such a concern about a substantial increase in power consumption. However, in the case where the light blocking films divided symmetrically across the channel region are electrically connected in a region other than the channel region as in the TFT according to the present invention, the potential of the light blocking film is subjected to the influence of both an electrode with a low applied voltage value (an absolute value of voltage) and an electrode with a high applied voltage value so that the potential of the light blocking film can be kept at a certain high level of potential. Therefore, in comparison with the case in which the portions of the light blocking films on the left and right sides of the gate electrode are isolated from each other, since a resistance value of the LDD regions induced by the potential of the light blocking films can be more effectively prevented from increasing, a problem of a drop of the ON current of the TFT can be avoided. As a result, even when the fluctuation in the TFT performance is large, an increase in power consumption is suppressed, whereby an excellent display performance can be obtained.

In order to suppress the influence on the channel region that is induced from the potential of the light blocking film, there has been reported some cases in which an electrode for fixing the potential of the light blocking film is formed. However, complicated steps increase as explained above, and thereby cost-up is caused. In the manufacturing process for the TFT according to the present invention, the light blocking film is not present right below the channel region, i.e., below the gate electrode to which a gate electric field is applied. Therefore, it is unnecessary to fix the potential of the light blocking film, and such a step of forming an electrode of the light blocking film that may lead to an increase in cost is unnecessary.

Further, when the LDD regions and a boundary portion of the LDD regions and the source and drain regions of the TFT are shielded from light, the ends on the opposite side of the sides opposed across the channel region of the light blocking film are processed to be located in the regions doped with impurity at high concentration, i.e., the source region and the drain region, as used in the TFT according to the present invention. Consequently, even when LDD length is decreased to a certain short level in order to secure sufficient ON current as explained above, a sufficient process margin can be realized because the length of the light blocking film can be set sufficiently long. In the case of a TFT comprising plurality of gate electrodes such as TFT having a double gate structure and a triple gate structure, regions right below each of the gate electrodes are respectively used as channel regions. As a result of comprising the plurality of gate electrodes, when the channel regions are divided, source-to-drain bias $V_{SD}$ is applied between a source region and a drain region located on the outermost side. Therefore, the ends on the opposite side of the sides opposed across the channel region of the light blocking film are processed to be located in the source region and the drain region located on the outermost side.

Concerning the first to sixth aspects of the present invention, exemplary embodiments of those aspects are explained below with reference to specific examples. In first to fifth exemplary embodiments explained below, specific examples disclosed as illustrations of the exemplary embodiments are examples of best modes of the present invention. However, a technical scope of the present invention is not limited to the exemplary embodiments illustrated below.

First Exemplary Embodiment

As a first exemplary embodiment of the present invention, an example of the structure of the thin-film transistor according to the first or second aspect of the present invention and a mode of using the thin-film transistor according to the first or second aspect of the present invention as a driving device for active matrix of a liquid crystal display device are explained in detail with reference to the drawings.

FIG. 1 is a top view schematically showing a mode of using the thin-film transistor according to the first or second aspect of the present invention as the driving device for active matrix of the liquid crystal display device. In a P-channel type TFT shown in FIG. 1, light blocking film 2 is divided into two regions across a channel region in parallel to a channel width direction. The two regions of light blocking film 2 are electrically connected by a third region provided in a region where silicon film 4 is not formed. In other words, light blocking film 2 is formed in a "U-shaped" pattern, which is composed of the divided two regions and the third region.

In the P-channel type TFT shown in FIG. 1, the channel region consists of a region right below a gate electrode branching from gate line 5. A pattern shape of light blocking film 2 is arranged not to overlap the channel region. On both sides of the gate electrode in silicon film 4, regions doped with impurity at low concentration (LDD regions) are respectively formed in contact with the channel regions. The divided two regions of light blocking film 2 are arranged to overlap at least a part of any of the two LDD regions. It is preferable that width $W_{shield}$ of the divided two regions of light blocking film 2 is wider than width $W_{LDD}$ of the LDD regions (the width of the LDD regions in a channel width direction). By selecting width $W_{shield}$ of the divided two regions of light blocking film 2 in the aforementioned range, boundary portions of the LDD regions and the source and drain regions can be surely shielded from light to suppress a photo leak current of the TFT that is caused by light irradiated on the LDD regions.

It is preferable that lengths $L_{shield-D}$ and $L_{shield-S}$ of the divided two regions of light blocking film 2 are set to be equal to or larger than length d of the LDD regions (the length of the LDD regions in a channel length direction). In other words, it is preferable that the divided two regions of light blocking film 2 are respectively arranged to overlap at least a part of any of the two LDD regions and parts of the source region and the drain region.

In such a case, the divided two regions of light blocking film 2 are respectively arranged to overlap parts of source region 8 and drain region 9 formed of regions doped with impurity at high concentration.

Drain region 9 is arranged above a region on a drain side of light blocking film 2 with base layer 3 intervening therebetween. Source region 8 is arranged above a region on a source side of light blocking film 2 with base layer 3 intervening therebetween.

A portion in which the regions on drain region 9, base layer 3, and the drain side of light blocking film 2 are laminated forms a MIS structure (capacitor $C_D$) composed of drain region 9, base layer 3, and the drain side region of light blocking film 2. A portion in which the regions on the source side of source region 8, base layer 3, and light blocking film 2 forms a MIS structure (capacitor $C_S$) composed of source region 8, base layer 3, and the source side regions of light blocking film 2. Specifically, when the drain side region of the light blocking film and the source side region of the light blocking film are electrically connected, this is equivalent to a state in which MIS junction (capacitor $C_D$) composed of the drain region, the base region, and the drain side regions of the light blocking film and MIS junction (capacitor $C_S$) composed of the source region, the base layer, and the source side regions of the light blocking film are connected in series.

In that situation, when potential ($V_D(t)$) of the drain region and potential ($V_S(t)$) of the source region of the P-channel type TFT are in a condition $V_S(t)>V_D(t)$, potential ($V_{BD}(t)$) of the drain side region of light blocking film 2 and potential ($V_{BS}(t)$) of the source side region of light blocking film 2 satisfy a condition $V_S(t)>V_{BS}(t)=V_{BD}(t)>V_D(t)$.

Specifically, when the drain side region of the light blocking film and the source side region of the light blocking film are electrically connected, potential ($V_{BD}(t)$) of the drain side region of light blocking film 2 and potential ($V_{BS}(t)$) of the source side region of light blocking film 2 are identical and are an intermediate value between potential ($V_D(t)$) of the drain region and potential ($V_S(t)$) of the source region.

When the P-channel type TFT reaches a steady state of the "OFF state", i.e., a state in which charging of capacitor $C_D$ and capacitor $C_S$ is completed, potential ($V_{BD}(t)$) of the drain side region of light blocking film 2 and potential ($V_{BS}(t)$) of the source side region of light blocking film 2 satisfy a condition $V_S(t)>V_{BS}(t)=V_{BD}(t)>V_D(t)$.

In a region sandwiched by the drain side region of light blocking film 2 and the source side region of light blocking film 2, potential $V_{under-channel}(z, t)$ on a lower surface side of base layer 3 is generally in a relation of $V_{BS}(t) \geq V_{under-channel}(z, t) \geq V_{BD}(t)$ with respect to potential ($V_{BD}(t)$) of the drain side region of light blocking film 2 and potential ($V_{BS}(t)$) of the source side region of light blocking film 2. In particular, when the condition $V_S(t)>V_{BS}(t)=V_{BD}(t)>V_D(t)$ is satisfied, $V_{BS}(t)=V_{under-channel}(z, t)=V_{BD}(t)$.

In the case of $V_S(t)>V_{BS}(t)=V_{BD}(t)>V_D(t)$, in the MIS junction (capacitor $C_D$) composed of the drain region, the base layer, and the drain side region of the light blocking film, reverse bias ($\Delta V_{reverse}$) is applied to M/I/p$^+$ type junction. Therefore, in this M/I/p$^+$ type junction portion, a depleted region is formed in the drain region (a p$^+$ region) in contact with the base layer is formed. The MIS junction (capacitor $C_D$) composed of the drain region, the base layer, and the drain side region of the light blocking film has junction capacitance due to formation of the depleted region. On the other hand, in the MIS junction (capacitor $C_S$) composed of the source region, the base layer, and the source side region of the light blocking film, forward bias ($\Delta V_{forward}$) is applied to M/I/p$^+$ type junction. Therefore, in this M/I/p$^+$ type junction portion, an accumulation region of carriers (holes) is formed in the drain region (a p$^+$ region) in contact with the base layer. The MIS junction (capacitor $C_S$) composed of the source region, the base layer, and the source side region of the light blocking film has junction capacitance due to formation of the accumulation region of carriers (holes). In general, in the case of $|\Delta V^{forward}|=|\Delta V_{reverse}|$, even if a junction area is the same, junction capacitance $C_{MIP-reverse}(\Delta V_{reverse})$ in applying reverse bias ($\Delta V_{reverse}$) to the M/I/p$^+$ type junction and junction capacitance $C_{MIP-forward}(\Delta V_{forward})$ in applying forward bias ($\Delta V_{forward}$) to the M/I/p$^+$ type junction are not equal ($C_{MIP-reverse}(\Delta V_{reverse}) \neq C_{MIP-forward}(\Delta V_{forward})$).

For example, a situation is considered in which, when two parallel flat capacitors (capacitor $C_1$ and capacitor $C_2$) are connected in series and potential $V_1(t)$ and potential $V_2(t)$ ($V_2(t) \geq V_1(t)$) are applied to both ends of the capacitors to charge the two capacitors, a potential difference ($V_2(t)-V_1(t)$) is distributed between the two capacitors (capacitor $C_1$ and capacitor $C_2$).

In a process for charging the two capacitors, electric current i(t) flows to the two capacitors connected in series. Electric current i(t) is equivalent to a rate of increase $dQ_1(t)/dt$ of charge amount $Q_1(t)$ stored in capacitor $C_1$ and a rate of increase $dQ_2(t)/dt$ of charge amount $Q_2(t)$ stored in capacitor $C_2$.

$$i(t)=dQ_1(t)/dt$$

$$i(t)=dQ_2(t)/dt$$

Total $\int i(t)dt$ of electric current i(t) that flows after charging is started until the charging is completed can be represented as follows:

$$\int i(t)dt=\int (dQ_1(t)/dt)dt$$

$$\int i(t)dt=\int (dQ_2(t)/dt)dt.$$

When differences of potentials respectively applied to capacitor $C_1$ and capacitor $C_2$ at stage when the charging is completed are represented as $\Delta V_1$ and $\Delta V_2$, of course, total ($\Delta V_1+\Delta V_2$) of the potential differences is equal to ($V_1(t)-V_2(t)$).

$$(\Delta V_1+\Delta V_2)=(V_1(t)-V_2(t))$$

Charge amount $Q_1$ and charge amount $Q_2$ respectively stored in capacitors $C_1$ and capacitor $C_2$ at the stage when the charging is completed can be represented as follows:

$$Q_1 = \int (dQ_1(t)/dt) dt = C_1 \cdot \Delta V_1$$

$$Q_2 = \int (dQ_2(t)/dt) dt = C_2 \cdot \Delta V_2.$$

Since $\int (dQ_1(t)/dt) dt = \int i(t) dt = \int (dQ_2(t)/dt) dt$, $$C_1 \cdot \Delta V_1 = Q_1 = Q_2 = C_2 \cdot \Delta V_2.$$

Therefore, $\Delta V_1$ and $\cdot \Delta V_2$ can be represented as follows:

$$\Delta V_1 = (V_2(t) - V_1(t)) \cdot (1/C_1) / \{(1/C_1) + (1/C_2)\}$$

$$\Delta V_2 = (V_2(t) - V_1(t)) \cdot (1/C_2) / \{(1/C_1) + (1/C_2)\}.$$

In other words, at the stage when the charging is completed, potential $V_B(t)$ at a connecting portion of capacitor $C_1$ and capacitor $C_2$ connected in series can be represented as follows:

$$\Delta V_1 = (V_B(t) - V_1(t))$$

$$\Delta V_2 = (V_2(t) - V_B(t))$$

$$V_B(t) = (C_1 \cdot V_1(t) + C_2 \cdot V_2(t)) / (C_1 + C_2).$$

On the other hand, in the case of P-channel type TFT, in a structure in which the drain side region of the light blocking film and the source side region of the light blocking film are electrically separated, a portion in which drain region 9, base layer 3, and the drain side region of light blocking film 2 are laminated also form an MIS structure (capacitor $C_D$) composed of the drain region, the base layer, and the drain side region of the light blocking film. The portion in which source region 8, base layer 3, and the source side region of the light blocking film 2 are laminated forms an MIS structure (capacitor $C_S$) composed of the source region, the base layer, and the source side region of the light blocking film. Further, since the drain side region of the light blocking film and the source side region of the light blocking film are electrically separated, potential $(V_{BD}(t))$ of the drain side region of the light blocking film and potential $(V_{BS}(t))$ of the source side region of the light blocking film are essentially different from each other. Therefore, when potential $(V_D(t))$ of the drain region and potential $(V_S(t))$ of the source region are in a relation of $V_S(t) > V_D(t)$, in general, potential $(V_{BD}(t))$ of the drain side region of the light blocking film and potential $(V_{BD}(t))$ of the source side region of the light blocking film satisfy the condition $V_S(t) \geq V_{BS}(t) > V_{BD}(t) \geq V_D(t)$.

In other words, when the drain side region of the light blocking film and the source side region of the light blocking film are electrically separated, potential $(V_{BD}(t))$ of the drain side region of light blocking film 2 is a value close to potential $(V_D(t))$ of the drain region and potential $(V_{BS}(t))$ of the source side region of light blocking film 2 is a value close to potential $(V_S(t))$ of the source region.

Potential difference $(V_{BS}(t) - V_{BD}(t))$ is present between the drain side region of the light blocking film and the source side region of the light blocking film. An MIM structure (capacitor $C_{DIS}$) composed of the drain side region of the light blocking film, the base layer, and the source side region of the light blocking film is formed. This is equivalent to a state in which the MIS junction (capacitor $C_D$) composed of the drain region, the base layer, and the drain side region of the light blocking film, the MIM structure (capacitor $C_{DIS}$) composed of the drain side region of the light blocking film, the base layer, and the source side region of the light blocking film, and the MIS junction (capacitor $C_S$) composed of the source region, the base layer, and the source side region of the light blocking film are connected in series.

When the P-channel type TFT reaches the steady state of the "OFF state", i.e., a state in which charging of capacitor $C_D$, capacitor $C_{DIS}$, and capacitor $C_S$ is completed, the condition $V_S(t) > V_{BS}(t) > V_{BD}(t) > V_D(t)$ is satisfied.

In a region sandwiched by the drain side region of light blocking film 2 and the source side region of light blocking film 2, potential $V_{under\text{-}channel}(z, t)$ on the lower surface side of base layer 3 is generally in a relation of $V_{BS}(t) \geq V_{under\text{-}channel}(z, t) \geq V_{BD}(t)$ with respect to potential $(V_{BD}(t))$ of the drain side region of light blocking film 2 and potential $(V_{BS}(t))$ of the source side region of light blocking film 2. Potential $V_{under\text{-}channel}(z, t)$ on the lower surface side of base layer 3 linearly changes from the drain side region side of the light blocking film to the source side region side of the light blocking film in a range of $V_{BS}(t) \geq V_{under\text{-}channel}(z, t) \geq V_{BD}(t)$. In particular, when the condition $V_S(t) > V_{BS}(t) > V_{BD}(t) > V_D(t)$ is satisfied, $V_{BS}(t) > V_{under\text{-}channel}(z, t) > V_{BD}(t)$.

In the case of $V_S(t) > V_{BS}(t) > V_{BD}(t) > V_D(t)$, in the MIS junction (capacitor $C_D$) composed of the drain region, the base layer, and the drain side region of the light blocking film, reverse bias $(\Delta V_{reverse})$ is applied to the M/I/p$^+$ type junction. Therefore, in this M/I/p$^+$ type junction portion, a depleted region is formed in the drain region (the p$^+$ region) in contact with the base layer is formed. The MIS junction (capacitor $C_D$) composed of the drain region, the base layer, and the drain side region of the light blocking film has junction capacitance due to formation of the depleted region. On the other hand, in the MIS junction (capacitor $C_S$) composed of the source region, the base layer, and the source side region of the light blocking film, forward bias $(\Delta V_{forward})$ is applied to the M/I/p$^+$ type junction. Therefore, in this M/I/p$^+$ type junction portion, an accumulation region of carriers (holes) is formed in the drain region (the p$^+$ region) in contact with the base layer. The MIS junction (capacitor $C_S$) composed of the source region, the base layer, and the source side region of the light blocking film has junction capacitance due to formation of the accumulation region of carriers (holes). In general, in the case of $|\Delta V_{forward}| = |\Delta V_{reverse}|$, even if a junction area is the same, junction capacitance $C_{MIP\text{-}reverse}(\Delta V_{reverse})$ in applying reverse bias $(\Delta V_{reverse})$ to the M/I/p$^+$ type junction and junction capacitance $C_{MIP\text{-}forward}(\Delta V_{forward})$ in applying forward bias $(\Delta V_{forward})$ to the M/I/p$^+$ type junction are not equal $(C_{MIP\text{-}reverse}(\Delta V_{reverse}) \neq C_{MIP\text{-}forward}(\Delta V_{forward}))$. On the other hand, in the MIM junction (capacitor $C_{DIS}$) composed of the drain side region of the light blocking film, the base layer, and the source side region of the light blocking film, junction capacitance $C_{MIM}$ of the MIM junction does not originally depend on the direction and the magnitude of bias $(\Delta V_{MIM})$ applied to the MIM junction.

For example, a situation is considered in which, when three parallel flat capacitors (capacitor $C_1$, capacitor $C_3$, and capacitor $C_2$) are connected in series and potential $V_1(t)$ and potential $V_2(t)$ ($V_2(t) \geq V_1(t)$) are applied to both ends of the capacitors to charge the three capacitors, a potential difference $(V_2(t) - V_1(t))$ is distributed among the three capacitors (capacitor $C_1$, capacitor $C_3$, and capacitor $C_2$).

In a process for charging the three capacitors, electric current $i(t)$ flows to the three capacitors connected in series. Electric current $i(t)$ is equivalent to a rate of increase $dQ_1(t)/dt$ of charge amount $Q_1(t)$ stored in capacitor $C_1$, a rate of increase $dQ_3(t)/dt$ of charge amount $Q_3(t)$ stored in capacitor $C_3$, and a rate of increase $dQ_2(t)/dt$ of charge amount $Q_2(t)$ stored in capacitor $C_2$.

$$i(t) = dQ_1(t)/dt$$

$$i(t) = dQ_3(t)/dt$$

$$i(t) = dQ_2(t)/dt$$

Total ∫i(t)dt of electric current i(t) that flows after charging is started until the charging is completed can be represented as follows:

$$\int i(t)dt = \int (dQ_1(t)/dt)dt$$

$$\int i(t)dt = \int (dQ_3(t)/dt)dt$$

$$\int i(t)dt = \int (dQ_2(t)/dt)dt.$$

When differences of potentials respectively applied to capacitor $C_1$, capacitor $C_3$, and capacitor $C_2$ at a stage when the charging is completed are represented as $\Delta V_1$, $\Delta V_3$, and $\Delta V_2$, of course, total $(\Delta V_1 + \Delta V_3 + \Delta V_2)$ of the potential differences is equal to $(V_2(t) - V_1(t))$.

$$(\Delta V_1 + \Delta V_3 + \Delta V_2) = (V_2(t) - V_1(t))$$

Charge amount $Q_1$, charge amount $Q_3$, and charge amount $Q_2$ respectively stored in capacitor $C_1$, capacitor $C_3$, and capacitor $C_2$ at a stage when the charging is completed can be represented as follows:

$$Q_1 = \int (dQ_1(t)/dt)dt = C_1 \times \Delta V_1$$

$$Q_3 = \int (dQ_3(t)/dt)dt = C_3 \times \Delta V_3$$

$$Q_2 = \int (dQ_2(t)/dt)dt = C_2 \times \Delta V_2.$$

Since $$\int (dQ_3(t)/dt)dt = \int i(t)dt = \int (dQ_2(t)/dt)dt,$$

$$\int (dQ_3(t)/dt)dt = \int i(t)dt = \int (dQ_1(t)/dt)dt,$$

$$C_1 \times \Delta V_1 = C_3 \times \Delta V_3 = C_2 \times \Delta V_2.$$

Therefore, $\Delta V_1$, $\Delta V_3$, and $\Delta V_2$ can be represented as follows:

$$\Delta V_1 = (V_2(t) - V_1(t)) \times (1/C_1)/\{(1/C_1) + (1/C_3) + (1/C_3)\}$$

$$\Delta V_3 = (V_2(t) - V_1(t)) \times (1/C_3)/\{(1/C_1) + (1/C_3) + (1/C_2)\}$$

$$\Delta V_2 = (V_2(t) - V_1(t)) \times (1/C_2)/\{(1/C_1) + (1/C_3) + (1/C_2)\}.$$

In other words, at the stage when the charging is completed, potential $V_{B-1}(t)$ at a connecting portion of capacitor $C_1$ and capacitor $C_3$ connected in series and potential $V_{B-2}(t)$ of a connecting portion of capacitor $C_2$ and capacitor $C_3$ can be represented as follows:

$$\Delta V_1 = (V_{B-1}(t) - V_1(t))$$

$$\Delta V_3 = (V_{B-2}(t) - V_{B-1}(t))$$

$$\Delta V_2 = (V_2(t) - V_{B-2}(t))$$

$$V_{B-1}(t) = V_1(t) + (V_2(t) - V_1(t)) \times (1/C_1)/\{(1/C_1) + (1/C_3) + (1/C_2)\}$$

$$V_{B-2}(t) = V_2(t) - (V_2(t) - V_1(t)) \times (1/C_2)/\{(1/C_1) + (1/C_3) + (1/C_2)\}.$$

For example, in the case of P-channel type TFT, in a structure in which the drain side region of the light blocking film and the source side region of the light blocking film are electrically connected, if the drain side region of the light blocking film and the source side region of the light blocking film are symmetrically arranged, potential ($V_{BD}(t)$) of the drain side region of the light blocking film and potential ($V_{BS}(t)$) of the source side region of the light blocking film are substantially kept at the averaged value of potential ($V_D(t)$) of the drain region and potential ($V_S(t)$) of the source region. For example, even if operation for periodically inverting drain bias ($V_D$) and source bias ($V_S$) is continued, when the TFT reaches the steady state of the "OFF state", potential ($V_{BD}(t)$) of the drain side region of the light blocking film and potential ($V_{BS}(t)$) of the source side region of the light blocking film are substantially kept at the averaged value of potential ($V_D(t)$) of the drain region and potential ($V_S(t)$) of the source region. When periodical ON/OFF switching operations are performed, a shift with the passage of time of potential ($V_{BD}(t)$) of the drain wide region of the light blocking film and potential ($V_{BS}(t)$) of the source side region of the light blocking film is suppressed.

On the other hand, in the case of P-channel type TFT, in a structure in which the drain side region of the light blocking film and the source side region of the light blocking film are electrically separated, even if the drain side region of the light blocking film and the source side region of the light blocking film are symmetrically arranged, if drain bias ($V_D$) and source bias ($V_S$) are periodically inverted, potential ($V_{BD}(t)$) of the drain side region of the light blocking film and potential ($V_{BS}(t)$) of the source side region of the light blocking film periodically fluctuate. When the periodical ON/OFF switching operations are performed, a shift with the passage of time of potential ($V_{BD}(t)$) of the drain side region of the light blocking film and potential ($V_{BS}(t)$) of the source side region of the light blocking film is caused.

Figure 2:
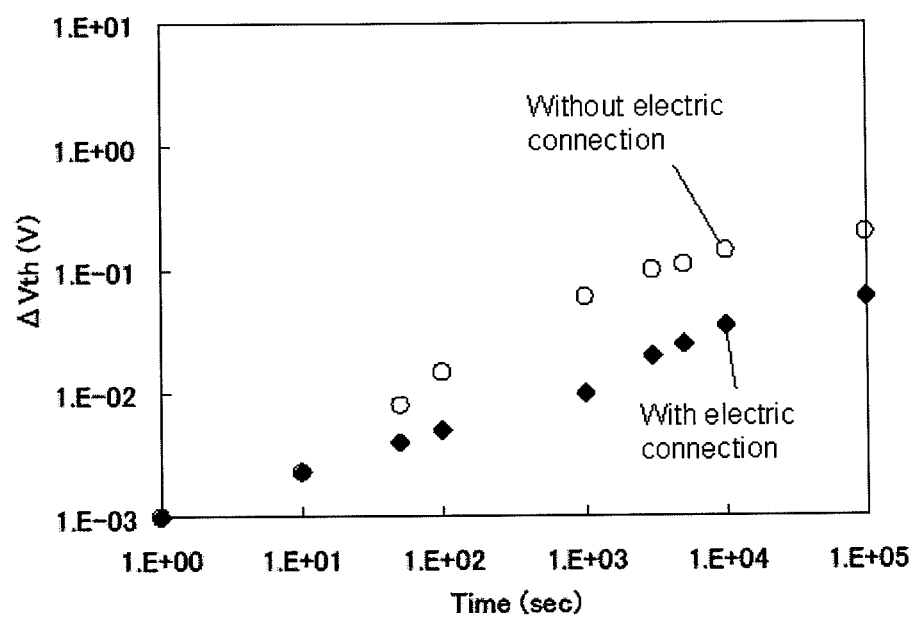
FIG. 2 is a chart showing time-dependent change ($\Delta V_{th}$) of a threshold with respect to the threshold in an initial state that were observed for the thin-film transistor according to the present invention when continuously operated, wherein ○ (without electric connection) indicates a result obtained when two regions of divided light blocking films are not electrically connected with each other and ■ (with electric connection) indicates a result obtained when the two regions of the divided light blocking films are electrically connected with each other.

FIG. 2 is a graph for comparing a change with the passage of time of threshold gate bias $V_{th}$ of the P-channel type TFT observed for the following two structures: a structure (with electric connection) in which a region on the drain side of the light blocking film and a region on the source side of the light blocking film, which are divided across the channel region, are mutually electrically connected via the third region not located right below the patterned crystalline silicon film of the first conduction type; and a structure (without electric connection) in which the region on the drain side of the light blocking film and the region on the source side of the light blocking film are electrically separated. The P-channel type TFT is continuously operated under driving conditions explained below and rise $\Delta V_{th}$ in threshold gate bias $V_{th}$ relating to an increase in a continuous operation time is plotted. In FIG. 2, a result obtained when a polysilicon film is employed as the crystalline silicon film is shown.

In a mode in which the P-channel type TFT illustrated in FIG. 1 is used as a driving device for active matrix of a liquid crystal display device, operation conditions are as follows:

drain bias ($V_D$): $V_D = -10V$, source bias ($V_S$): $V_S = 0V$, gate bias in the "ON state": $Vg(ON) = -10V$, gate bias in the "OFF state": $Vg(OFF) = 10V$, and "ON/OFF period": 1 ms (1 kHz).

In the result shown in FIG. 2, distance x between the region on the drain side of the light blocking film and the region on the source side of the light blocking film is selected to be x=L with respect to gate electrode length L and length d of the LDD regions provided on both the sides of the gate electrode.

In this case, threshold gate bias $V_{th}$ ($\tau$=0) in an initial state is $V_{th}$ ($\tau$=0) = −2.4V in the structure in which the region on the drain side of the light blocking film and the region on the source side of the light blocking film are electrically mutually connected and is $V_{th}$ ($\tau$=0) = −2.6V in the structure in which the region on the drain side of the light blocking film and the region on the source side of the light blocking film are electrically separated.

As mentioned above, as to threshold gate bias $V_{th}$ (τ=0) in the initial state, a difference is present between the structure in which the region on the drain side of the light blocking film and the region on the source side of the light blocking film are electrically mutually connected and the structure in which the region on the drain side of the light blocking film and the region on the source side of the light blocking film are electrically separated. This difference is considered to be caused by such factor that the influences of the potentials of the light blocking film on the channel region are different between the structure in which the region on the drain side of the light blocking film and the region on the source side of the light blocking film are electrically mutually connected and the structure in which the region on the drain side of the light blocking film and the region on the source side of the light blocking film are electrically separated.

The result shown in FIG. 2 indicates that, when the structure (with electric connection) in which the region on the drain side of the light blocking film and the region on the source side of the light blocking film are electrically mutually connected is selected, compared with the structure (without electric connection) in which the region on the drain side of the light blocking film and the region on the source side of the light blocking film are electrically separated, it is possible to suppress rise $\Delta V_{th}$ in threshold gate bias $V_{th}$ relating to an increase in the continuous operation time under the operation conditions.

When a continuous operation is performed under the operation conditions, a cause of rise $\Delta V_{th}$ in threshold gate bias $V_{th}$ is considered to be a shift with the passage of time of potential ($V_{BD}$(t)) of the drain side region of the light blocking film and potential ($V_{BS}$(t)) of the source side region of the light blocking film.

Specifically, rise $\Delta V_{th}$ in threshold gate bias $V_{th}$ is considered to be caused by such factor that potential ($V_{BD}$(t)) of the drain side region of the light blocking film and potential ($V_{BS}$(t)) of the source side region of the light blocking film gradually fall (shift to lower level) relating to an increase in the continuous operation time. The fall in potential ($V_{BD}$(t) of the drain side region of the light blocking film and potential ($V_{BS}$(t)) of the source side region of the light blocking film are considered to be caused by such factor that charges are gradually accumulated in the drain side region of the light blocking film and the source side region of the light blocking film relating to an increase in the continuous operation time.

The fall in potential ($V_{BD}$(t)) of the drain side region of the light blocking film and potential ($V_{BS}$(t)) of the source side region of the light blocking film induces a fall in potential $V_{under\text{-}channel}$(t) for the portion of base layer 3 of the MIM structure (capacitor $C_{DIS}$), by the help of the MIM structure composed of the drain side region of the light blocking film, the base layer, and the source side region of the light blocking film. Therefore, it is surmised that the fall in potential $V_{under\text{-}channel}$(t) of the lower surface of the portion located right below the channel region of base layer 3 causes rise $\Delta V_{th}$ in threshold gate bias $V_{th}$.

In the structure (with electric connection) in which the region on the drain side of the light blocking film and the region on the source side of the light blocking film are electrically mutually connected, when the arrangement in which the drain side region of the light blocking film and the source side region of the light blocking film are symmetrical is employed as explained above, potential ($V_{BD}$(t)) of the drain side region of the light blocking film and potential ($V_{BS}$(t)) of the source side region of the light blocking film are substantially kept at the averaged potential of potential ($V_D$(t)) of the drain region and potential ($V_S$(t)) of the source region. Therefore, accumulation of charges injected via the MIS structure portion is suppressed.

On the other hand, in the structure (without electric connection) in which the region on the drain side of the light blocking film and the region on the source side of the light blocking film are electrically separated, when the arrangement in which the drain side region of the light blocking film and the source side region of the light blocking film are symmetrical is employed as explained above, potential ($V_{BD}$(t)) of the drain side region of the light blocking film and potential ($V_{BS}$(t)) of the source side region of the light blocking film are different as explained above. Therefore, it is concluded that accumulation of charges injected via the MIS structure portion relatively increases.

In the TFT illustrated in FIG. 1, light blocking film 2 is formed in the "U-shaped" pattern. Further, the third region provided in the region where the silicon film 4 is not formed may be provided in two places to form light blocking film 2 in a "square (□) shaped" pattern. In such a case, the channel region is surrounded by the "square (□) shaped" pattern. However, the forming region of light blocking film 2 is to be arranged not to overlap the channel region.

In the TFT illustrated in FIG. 1, the forming region of light blocking film 2 of the "U-shaped" pattern is arranged not to overlap a forming region of gate electrode film 6 and the gate line. Therefore, gate electrode film 6 and the gate line are arranged such that the potential (Vg) of gate electrode film 6 and the gate line does not have substantial influence on the potential of light blocking film 2.

In the case when light blocking film 2 is formed in the "square (□) shaped" pattern, it is also desirable to select an arrangement in which the potential (Vg) of gate electrode film 6 and the gate line does not have substantial influence on the potential of light blocking film 2.

In light blocking film 2, if the third region provided in the region where silicon film 4 is not formed is arranged to partially overlap a forming region of gate electrode film 6 and the gate line, an MIM structure (capacitor $C_{GI(D/S)}$) composed of light blocking film 2, base layer 3 and gate insulating film 5, and gate electrode film 6 (the gate line) is formed. In that case, there is caused such situation that potential (Vg) of gate electrode film 6 has accidentally some influence on potential ($V_{BD}$(t)) of the drain side region of the light blocking film and potential ($V_{BS}$(t)) of the source side region of the light blocking film by the help of the MIM structure (capacitor $C_{GI(D/S)}$).

Figure 3:
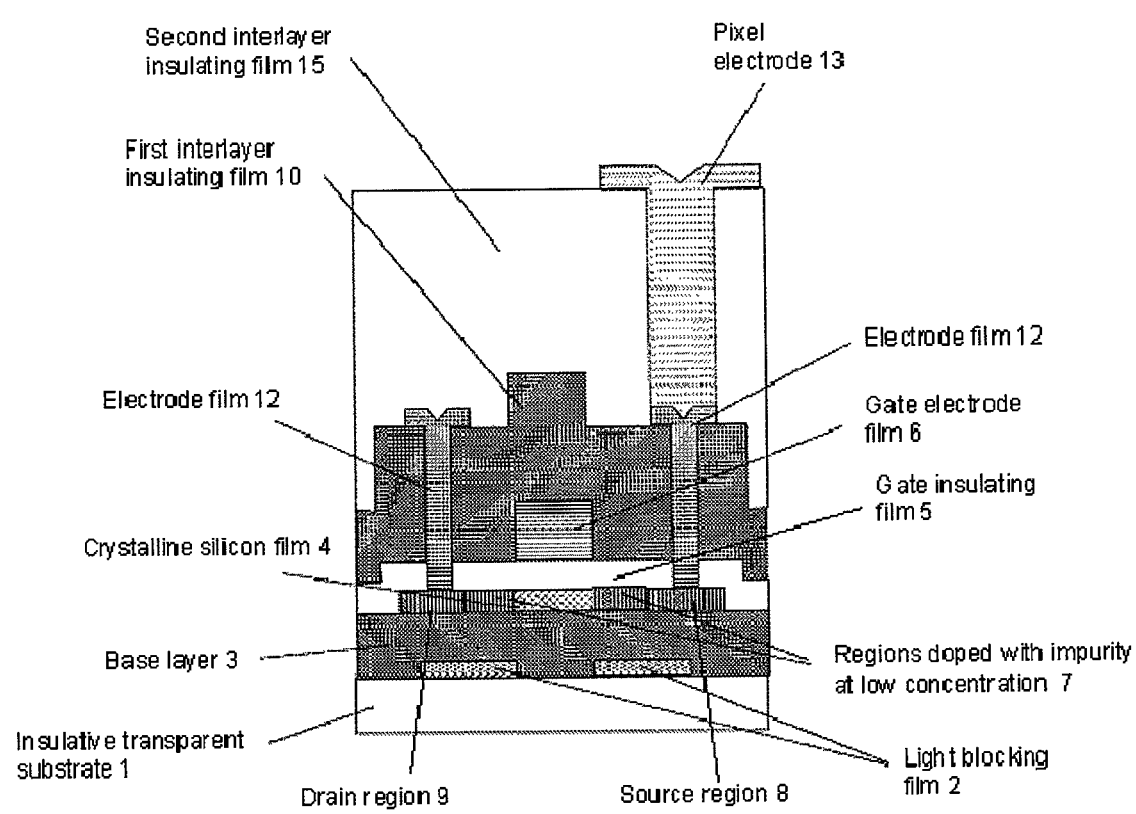
FIG. 3 is a sectional view schematically showing the structure of a section indicated by A-A' in the device structure as shown in FIG. 1, which is used for the first exemplary embodiment of the thin-film transistor according to the present invention.

FIG. 3 schematically shows a sectional view in an A-A' direction of the TFT shown in FIG. 1. The construction of the TFT shown in FIG. 1 is explained below with reference to FIG. 3.

The TFT shown in FIG. 1 is just a mode of using the TFT as a driving device for active matrix of a liquid crystal display device, in which the upper surface of the TFT is coated with a first interlayer insulating film, and the drain region and the source region of the TFT are electrically connected to electrode films via contact holes 11. One of the electrode films is integrated with drain line 14 that is formed on first interlayer insulating film 10. The other electrode film is electrically connected to pixel electrode 13, which is formed on second interlayer insulating film 15 that covers first interlayer insulating film 10, via a contact hole provided in second interlayer insulating film 15.

The TFT shown in FIG. 1 is constructed in the shape of a top gate type crystalline silicon thin-film transistor in order to provide a light blocking film. In particular, the TFT is formed in the shape of a planar type TFT in which patterned crystalline silicon film 4 formed on the upper surface of base layer 3 formed of an insulative material is used as an operation layer. After a crystalline silicon film of the first conduction type is patterned, regions doped with impurity at high concentration, in which impurity of second conductive type is doped at high concentration, are formed to use as drain region 9 and source region 8. Regions doped with impurity at low concentration 7, in which impurity of second conductive type is doped at low concentration, are respectively formed on both the sides of the gate electrode, i.e., the drain region side and the source region side. Therefore, the crystalline silicon film of the first conduction type right below the gate electrode, which is sandwiched by regions doped with impurity at low concentration 7, is used as the channel region.

Gate insulating film 5 is formed to cover the upper surface of patterned crystalline silicon film 4. Gate electrode film 6 is formed on the upper surface of gate insulating film 5. When a gate bias equal to or higher than a threshold gate bias is applied to the gate electrode, a channel is formed at an interface between gate insulating film 5 and the crystalline silicon film of the first conduction type right below gate electrode film 6, and thereby, the TFT is switched to the "ON state".

The TFT is manufactured on a substrate formed of a light transmissive insulating material, i.e., insulative transparent substrate 1. For the purpose of blocking light made incident from the rear surface side of insulative transparent substrate 1, patterned light blocking film 2 is formed in contact with lower surface of base layer 3 on the upper surface of insulative transparent substrate 1. In order to achieve improved adhesion of patterned light blocking film 2 arranged on the upper surface of insulative transparent substrate 1 to insulative transparent substrate 1, after a underlying layer for the light blocking film is formed on the upper surface of insulative transparent substrate 1, patterned light blocking film 2 may be formed on the upper surface of the underlying layer for the light blocking film.

As patterned light blocking film 2 is used for blocking light made incident from the rear surface side of insulative transparent substrate 1, patterned light blocking film 2 is made of a conductive material that does not transmit light, for example, a metal material such as chrome. When the metal material is used, in order to attain light blocking performance, it is desirable to select the thickness of light blocking film 2 to be equal to or larger than 20 nm. When light blocking film 2 is formed on the upper surface of insulative transparent substrate 1, stress is applied to insulative transparent substrate 1. It is desirable that the thickness of light blocking film 2 is selected in a range not exceeding 500 nm such that insulative transparent substrate 1 is not largely warped by the applied stress.

As light blocking film 2, resin black matrix film may be used which is formed by using a conductive non-light transmissive resin material, for example, a resin material having light blocking performance in which organic pigment such as carbon is dispersed, as the conductive material that does not transmit light. When the resin black matrix film is used, the thickness thereof is not specifically limited as long as a silicon film formed on patterned light blocking film 2 is not cut by difference in level caused by patterned light blocking film 2 and the aimed level of the light blocking performance can be obtained. When the resin black matrix film is used, it is preferable to select the thickness in a range of 0.5 to 2 µm.

In comparison with a TFT of conventional type having structure in which a light blocking film is not provided (hereinafter referred to as TFT-B), insulative transparent substrate 1 and a structure provided on base layer 3 that are employed in the structure of the TFT shown in FIG. 1 can be constructed in substantially the same shape excluding patterned light blocking film 2.

Patterned light blocking film 2 is divided into a drain side region of the light blocking film arranged on drain region 9 side and a source side region of the light blocking film arranged on source region 8 side, with the channel region therebetween. It is desirable to divide patterned light blocking film 2 such that the drain side region of the light blocking film and the source side region of the light blocking film are arranged in symmetrical positions with respect to the center of the gate electrode.

In the mode of using the TFT as the driving device for active matrix of the liquid crystal display device, bias applied to drain line 14 is switched at the stage of driving of the liquid crystal display device. As a result, there is comprised a step of performing the "ON/OFF switching operations" in a state in which potential ($V_D$(t)) of drain region 9 and potential ($V_s$(t)) of source region 8 are inverted. In a such case, if the drain side region of the light blocking film and the source side region of the light blocking film are arranged in symmetrical positions, influences due to potential ($V_{BD}$(t)) of the drain side region of the light blocking film and potential ($V_{BS}$(t)) of the source side region of the light blocking film can be equalized. For example, when the bias applied to drain line 14 is switched, changes in the resistance of the LDD regions in the "ON state" due to potential ($V_{BD}$(t)) of the drain side region of the light blocking film and potential ($V_{BS}$(t)) of the source side region of the light blocking film are the same. As a result, fluctuation in the performance of TFT incidental to a "switching operation" for switching the bias applied to drain line 14 can be suppressed. Therefore, in the embodiment in which the TFT is used as the driving device for active matrix of the liquid crystal display device, it is desirable that drain region 9 and drain side LDD region and source region 8 and source side LDD region are arranged symmetrical with respect to the center of the gate electrode; and the drain side region of the light blocking film and the source side region of the light blocking film are arranged symmetrical to the center of the gate electrode across the channel region.

Base layer 3 is formed to cover patterned light blocking film 2 and used as a base layer in the vapor phase deposition of an amorphous silicon film. Base layer 3 is also used for electrically separating patterned light blocking film 2 from patterned crystalline silicon film 4 to be formed thereon.

Therefore, base layer 3 is formed of a silicon oxide film or a layered structure composed of a silicon nitride film and the silicon oxide film. When the layered structure composed of the silicon nitride film and the silicon oxide film is employed, such a structure in which an upper layer side to be used as a base for vapor phase deposition of the amorphous silicon film is a silicon oxide film is selected. In particular, when the amorphous silicon film that is vapor phase deposited is crystallized to form a crystalline silicon film, compared with the density of an interface state generated on an interface between the silicon nitride film and the crystalline silicon film, the density of an interface state generated on an interface between the silicon oxide film and the crystalline silicon film is low. Therefore, in order to keep the density of the interface state present on an interface between base layer 3 and patterned crystalline silicon film 4 at low level, the upper surface of base layer 3 is formed of the silicon oxide film.

Subsequently, in order to crystallize the amorphous silicon film formed on base layer 3, an excimer laser or the like is irradiated to locally melt the amorphous silicon film. When the amorphous silicon film is locally heated, heat is conducted to base layer 3 side. When the thickness of base layer 3 is thin, the heat is quickly propagated to patterned light blocking film 2 located below base layer 3. Patterned light blocking film 2 is formed of a metal material or a conductive non-light transmissive material. Compared with thermal conductivity of a light transmissive insulating material forming base layer 3, thermal conductivity of the metal material or the conductive non-light transmissive material is remarkably excellent. Therefore, in patterned light blocking film 2, in-plane thermal diffusion (thermal diffusion in a lateral direction) progresses. Therefore, when the thickness of base layer 3 is thin, because of the thermal diffusion in the in-plane direction (the thermal diffusion in the lateral direction), in some case, the temperature of a region locally melted by pulse laser beam irradiation quickly falls and it is difficult to attain sufficient quality of crystal obtained.

Therefore, it is preferable that the thickness of base layer 3 is selected to be equal to or thicker than 100 nm. Further, it is more preferable that the thickness of base layer 3 is selected to be equal to or thicker than 600 nm. In particular, in the case where the thickness is equal to or thicker than 600 nm, since the influence of difference in level caused by patterned light blocking film 2 can also be reduced, uniform crystal can be obtained at the step of forming a crystalline silicon film on the upper surface of base layer 3. Such a mode in which the upper surface of base layer 3 is planarized, and thus, any difference in level caused by patterned light blocking film 2 by no means have influence when a crystalline silicon film is formed thereon is illustrated in FIG. 3.

When the thickness of base layer 3 is too thick, cost increases and stress is applied to insulative transparent substrate 1. It is desirable that the thickness of base layer 3 is selected in a range not exceeding 1.5 µm to prevent insulative transparent substrate 1 from largely warping.

In patterned light blocking film 2, there is a distance of length x between the drain side region of the light blocking film and the source side region of the light blocking film. Light made incident from the rear surface side of insulative transparent substrate 1 and passing through a region provided in patterned light blocking film 2 where the light blocking film is not present passes through base layer 3 formed of the light transmissive insulative material and reaches the lower surface of patterned crystalline silicon film 4. Specifically, in patterned crystalline silicon film 4, the channel region consisting of the crystalline silicon film of the first conduction type and a part of the LDD regions on both the sides of the channel region are not shielded from light by patterned light blocking film 2, and thus, the light is made incident on the regions.

When the TFT is kept in the "ON state", an electric current flows in the channel region and the LDD regions on both the sides of the channel region. Therefore, among electrons and holes generated by absorption of the incident light, either of electrons and holes that are corresponding to minority carriers are quickly recombined by majority carriers, and vanish out thereby. Therefore, the electrons and the holes generated by the absorption of the incident light do not substantially generate a photo leak current.

On the other hand, when the TFT is kept in the "OFF state", a depletion layer is formed in pn junction portions that are composed of the channel region consisting of the crystalline silicon of the first conduction type and the LDD regions consisting of the crystalline silicon film of the second conduction type on both the sides of the channel region. Electrons and holes generated by absorption of light made incident on this depletion layer portion do not vanish by recombination. The generated electrons and holes are respectively transported in opposite directions by an electric field present in the depletion layer. As a result, a photo leak current is generated. Therefore, it is possible to suppress a photo leak current due to incident light by reducing the volume of the depletion layer portion present when the TFT is kept in the "OFF state". Specifically, the volume of the depletion layer portion is reduced by reducing the thickness of patterned crystalline silicon film 4.

For example, the LDD regions are formed by doping impurities of the second conduction type at low concentration from the upper surface of the crystalline silicon film of the first conduction type. When the thickness of the crystalline silicon film of the first conduction type is thick, the crystalline silicon film of the first conduction type remains below the LDD region, and this remained portion will work as the depletion layer portion. Therefore, it is preferable that the thickness of the crystalline silicon film is selected in thin level such that the thickness of the crystalline silicon film is not larger than the depth of the LDD regions to be formed.

On the other hand, in the regions doped with impurity at high concentration used as the drain region and the source region, when the thickness of the crystalline silicon film is reduced, doping level of impurities is further increased to prevent an increase in a resistance value of the regions doped with impurity at high concentration. Therefore, when the thickness of the crystalline silicon film is thinner than necessary, for example, the density of a damaged site of a crystal lattice is increased by ion implantation of impurity at high concentration. In addition, the introduced impurities will be accumulated at high concentration on the interface between the crystalline silicon film and base layer 3. When recovery from the crystal lattice damage is not sufficiently performed and the impurities that are accumulated near the interface at high concentration are precipitated in the shape of particle, they work as factors retarding crystallization. In order to realize recovery from the crystal lattice damage at high density and prevent precipitation of the impurities accumulated at high concentration, heat-treatment for activation at high temperature needs to be carried out to perform uniformalization of concentration by thermal diffusion and recovery of the crystal lattice.

When a glass substrate is used as insulative transparent substrate 1, the temperature used in the heat treatment for activation can never be selected to be such high temperature at which the glass substrate is seriously deformed, for instance, temperature higher than about 600° C.

If the recovery from the crystal lattice damage at high concentration is attained, quality of crystal is lowered, and activation of the implanted impurities is insufficient, and therefore, a sheet resistance value of the region doped with impurity at high concentration increases.

When the above two requirement are taken into account, it is preferable to select the thickness of the crystalline silicon film in a range of 15 to 100 nm. In particular, the thickness of the crystalline silicon film may be selected in a range of 20 to 50 nm.

A polysilicon film may be employed as crystalline silicon film 4.

Gate insulating film 5 is formed to cover patterned crystalline silicon film 4. Gate insulating film 5 is a silicon oxide film or a layered structure composed of the silicon oxide film and a silicon nitride film. Gate insulating film 5 has a sufficient breakdown voltage so as to avoid breakdown of the isolation caused by a gate bias applied to the gate electrode. A first interlayer insulating film 10 is formed to cover gate insulating film 5 and gate electrode film 6. The first interlayer insulating film 10 is formed of a silicon oxide film, a silicon nitride film, or a layered film composed of the two type films. Electrode films 12 connected to the source region and the drain region are formed via contact holes 11 provided in the first interlayer insulating film 10.

Figure 4:
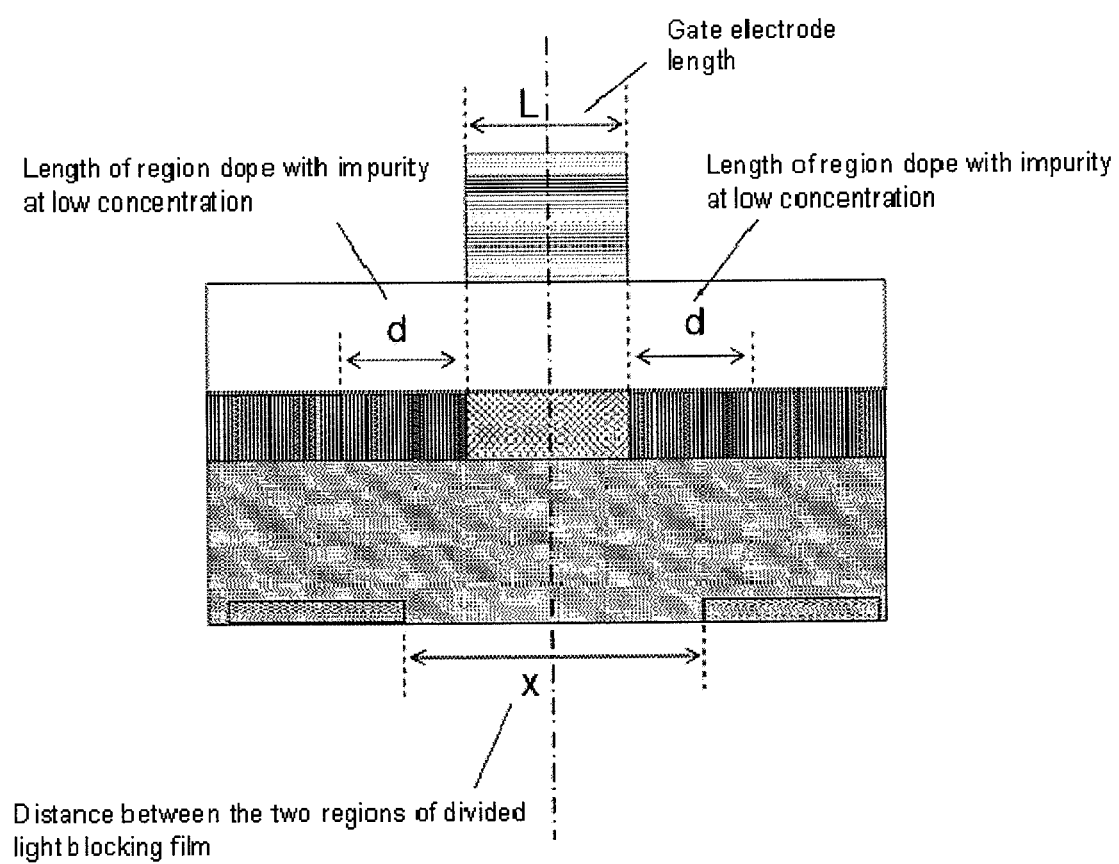
FIG. 4 is a sectional view showing, more in detail, characteristic features of the device structure, which is used for the first exemplary embodiment of the thin-film transistor according to the present invention; for instance, distance x between the two regions of the divided light blocking films, channel length L of a channel region, length d of regions doped with impurity at low-concentration provides on both sides of the channel region, and a crystalline silicon film.

FIG. 4 is a diagram schematically showing a detail of structure near the channel region in a sectional structure of the P-channel type TFT shown in FIG. 3.

Patterned light blocking film 2 is divided into two regions, and a distance of length x is set between the drain side region of the light blocking film and the source side region of the light blocking film, which are symmetrically arranged with respect to the gate electrode. The length of the channel region (channel length) formed right below the gate electrode is represented as L and the length of the LDD regions provided on both the sides of the channel region is represented as d. A specific mode in which the length (channel length) L of the channel region and the gate electrode length are equal is illustrated in FIG. 4. The specific mode is illustrated in such shape where the drain side region of the light blocking film and the source side region of the light blocking film are arranged respectively to partially overlap at least the drain region and the source region.

The lower ends of the LDD regions reach an interface between base layer 3 and patterned crystalline silicon film 4, and thus, the LDD regions are formed in such structure where the crystalline silicon portion of the first conduction type does not remain below the LDD regions. In other words, the LDD regions are formed in such structure in which, when the TFT is kept in the "OFF state", a depletion layer originated from pn junction that is formed on an interface between the channel region consisting of the crystalline silicon film of the first conduction type and the LDD regions consisting of the crystalline silicon film of the second conduction type is present on base layer 3.

In a structure in which thickness $t_{polySi}$ of patterned crystalline silicon film 4 is selected as $t_{polySi}$=50 nm; channel width W is selected as W=5 μm; channel length L is selected as L=5 μm; and length d of the LDD regions is selected as d=1.5 μm, TFTs in which length x between the drain side region of the light blocking film and the source side region of the light blocking film is variously selected are manufactured and performance of the TFTs are compared. The channel region consisting of the crystalline silicon film of the first conduction type has n-type conductivity with n=5×10$^{16}$ cm$^{-3}$ and the LDD regions have p-type conductivity with average carrier density of p=3×10$^{17}$ cm$^3$. Therefore, the TFT has the structure of a P-channel type field effect transistor.

Usually, in pn junction composed of an n-type conductive crystalline silicon layer having carrier density n and a p-type conductive crystalline silicon layer having carrier density p, thickness $t_{depletion-n}$ of a depletion layer formed on the n-type conductive crystalline silicon layer side and thickness $t_{depletion-p}$ of a depletion layer formed on the p-type conductive crystalline silicon layer side satisfies a relation n×$t_{depletion-n}$=p×$t_{depletion-p}$. Therefore, in the pn junction composed of the n-type conductive crystalline silicon layer with n=5×10$^{16}$ cm$^{-3}$ and the p-type conductive crystalline silicon layer with p=3×10$^{17}$ cm$^{-3}$, a ratio ($t_{depletion-n}$/$t_{depletion-p}$) of thickness $t_{depletion-n}$ of the depletion layer formed on the n-type conductive crystalline silicon layer side and thickness $t_{depletion-p}$ of the depletion layer formed on the p-type conductive crystalline silicon layer side is ($t_{depletion-n}$/$t_{depletion-p}$)=p/n=(3×10$^{17}$/5×10$^{16}$)=6/1.

In general, electric field E generated in pn junction to which reverse bias is applied has maximum electric field intensity $E_{max}$ at an interface of the pn junction. At both ends of a depletion layer, electric field intensity is zero. In other words, the electric field E generated in the pn junction is present only in the depletion layer. In the pn junction to which the reverse bias is applied, in a p region not depleted, electron and hole pairs generated by light absorption immediately vanish because the electrons recombine with the holes present in a large quantity. In an n region not depleted, electron and hole pairs generated by light absorption immediately vanish because the holes recombine with the electrons present in a large quantity. On the other hand, when electron and hole pairs are generated by light absorption in the depletion layer, the electrons are transported to the n region side and the holes are transported to the p region side by the electric field E. As a result, in the pn junction to which the reverse bias is applied, a photocurrent that is caused by the electron and hole pairs generated by the light absorption in the depletion layer flows from the n region to the p region.

An electric field is also formed on an interface between the LDD region (the p region) on the drain side and the base layer. A depleted region is formed on the interface between the LDD region (the p region) on the drain side and the base layer. As a result, in the depleted region on the lower surface side of the LDD region (the p region) on the drain side, a photocurrent that is caused by the electron and hole pairs generated by the light absorption flows.

Therefore, when the P-channel type TFT shown in FIG. 3 is kept in the "OFF state", a photocurrent that is caused by electron and hole pairs generated by light absorption in a depletion layer due to pn junction of an interface between the LDD region (the p region) on the drain side and the channel region (the n region) and a depleted region formed on an interface between the LDD region (the p region) on the drain side and the base layer flows.

On the other hand, patterned light blocking film 2 is formed of a Cr film having thickness of 50 nm. Base layer 3 is formed of a silicon oxide film having thickness of 500 nm.

First, concerning a photo leak current, in the "OFF state", a leak current $I_{light-on}$ at the time when light from a white LED light source showing luminance of about 15000 cd/m$^2$ is irradiated from the rear surface side of insulative transparent substrate 1 and a leak current $I_{light-off}$ at the time when the light is not irradiated are measured. A difference ($I_{light-on}$−$I_{light-off}$) of the leak current $I_{light-on}$ and the leak current $I_{light-off}$ is set as a photo leak current $I_{leak-photo}$(x). a measurement condition is selected such that when x≥L/2, measured results satisfy such equation $I_{light-on}$≫$I_{light-off}$. Therefore, In the range of x≥L/2, the photo leak current is approximately set as $I_{leak-photo}$(x)=$I_{light-on}$.

The measurement is carried out under the following operation conditions of the "OFF state":

drain bias ($V_D$): $V_D$=−10V;

source bias ($V_S$): $V_S$=0V; and gate bias in the "OFF state": $Vg$(OFF)=10V.

For the P-channel type TFT (TFT-B) of conventional type, which has such a structure that, as to $t_{polySi}$, L, and d, sizes same as the above are selected, but a light blocking film is not provided, measurement of a photo leak current is also performed under the conditions.

A value of $I_{leak-photo}$(x)/$I_{leak-photo}$(x=∞) normalized by a photo leak current $I_{leak-photo}$(x=∞) measured for the TFT-B in which a light blocking film is not provided is referred to as "normalized photo leak current".

Figure 5:
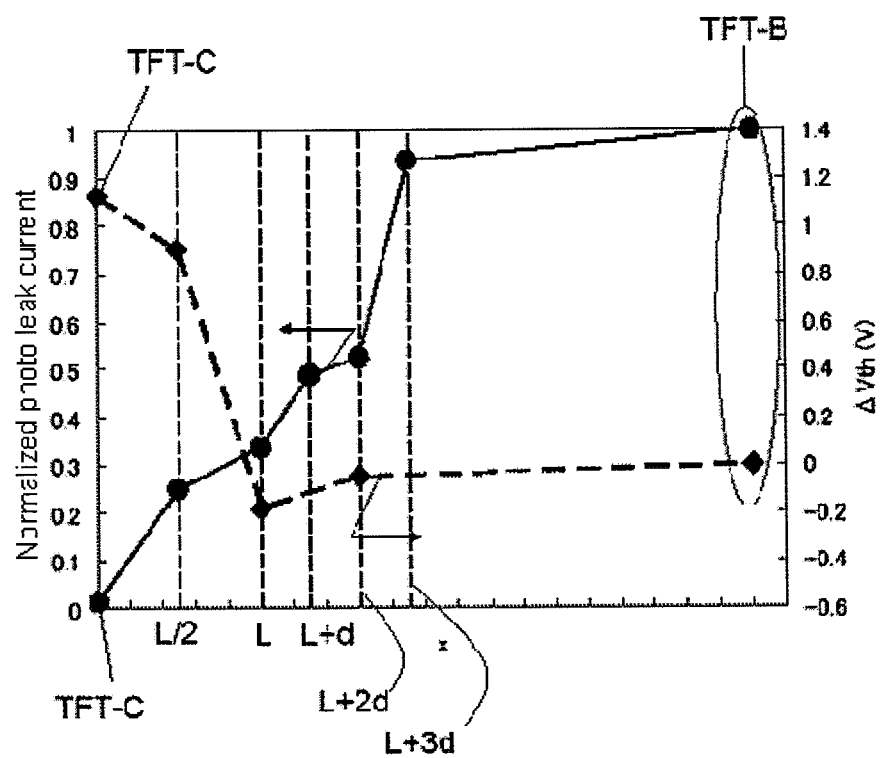
FIG. 5 is a chart showing a dependence of a "normalized photo leak current" and a difference ($\Delta V_{th}$) between a threshold of the thin-film transistor equipped with the light blocking films divided across the channel region and a threshold ($V_{th}$) of a TFT of conventional type (TFT-B) on distance x between light blocking films divided across a channel region of the thin-film transistor.

In FIG. 5, a result obtained by plotting the "normalized photo leak current" measured under the aforementioned measurement conditions with respect to length x between the drain side region of the light blocking film and the source side region of the light blocking film is shown. In FIG. 5, a result obtained when the polysilicon film is employed as the crystalline silicon film is shown.

As length x between the drain side region of the light blocking film and the source side region of the light blocking film increases, the "normalized photo leak current" increases. When x is set in a range of L≤x≤L+2d, the "normalized photo leak current" is measured in a range of 0.35 to 0.55. However, when x increases to x=L+3d, the "normalized photo leak current" suddenly increases to 0.95. Therefore, when x is set in the range of L≤x≤L+2d, an effect of suppressing a sudden increase in the "normalized photo leak current" is obtained.

In FIG. 5, the "normalized photo leak current" measured when length x between the drain side region of the light blocking film and the source side region of the light blocking film is selected to be L/2, L, L+d, L+2d, and L+3d is shown in comparison.

When a light blocking film is not provided at all (in the case of the TFT-B in FIG. 5), all of the drain region, the source region, the LDD regions, and the channel region are not shielded from light. Therefore, in the "OFF state", light absorption occurs in the entire depletion layer that is formed in the pn junction composed of the LDD regions and the channel region, and a photocurrent that is caused by electron and hole pairs produced therein is generated.

In addition, the lower surfaces of the drain region (the $p^+$ region) and the LDD region (the p region) on the drain side are in contact with the base layer formed of the light transmissive insulative material, and thus, SI junction is formed at the interface therebetween. The lower surfaces of the source region (the $p^+$ region) and the LDD region (the p region) on the source side are also in contact with the base layer formed of the light transmissive insulative material, and therefore, SI junction is formed at the interface therebetween. Further, the lower surface of the channel region is in contact with the base layer formed of the light transmissive insulative material, and therefore, SI junction is formed at the interface therebetween.

In the "OFF state", potential ($V_D(t)$) of drain region 9 and potential ($V_S(t)$) of source region 8 are in a relation $V_S(t) > V_D(t)$. Therefore, an electric field is present at least at the interface between the drain region (the $p^+$ region) and base layer 3. A space charge forming the electric field is present in the SI junction portion composed of the drain region (the $p^+$ region) and base layer 3. In other words, a depleted region is formed in the SI junction portion. An electric field is also present at the interface between the LDD region (p region) portion on the drain side, which is in contact with the drain region (the $p^+$ region), and the base layer. A space charge for forming the electric field is present in the SI junction portion composed of the LDD region (the p region) on the drain side and the base layer where the electric field is present. In other words, a depleted region is formed in the SI junction portion. The drain region (the $p^+$ region) is made of a region doped with impurity at high concentration. On the other hand, the LDD region is made of a region doped with impurity at low concentration. Therefore, the thickness of the depleted region formed in the SI junction portion composed of the drain region (the $p^+$ region) and base layer 3 is remarkably thin compared with the thickness of the depleted region formed in the SI junction portion composed of the LDD region ($p^+$ region) portion on the drain side and the base layer.

Further, an electric field is present at least at the interface between the source region (the $p^+$ region) and base layer 3. Charges (holes) forming the electric field are accumulated in the SI junction portion composed of the source region (the $p^+$ region) and base layer 3. A depleted region is not formed in the SI junction portion. An electric field is also present at the interface between the LDD region (p region) portion on the source side, which is in contact with the source region (the $p^+$ region), and the base layer. Charges (holes) forming the electric field are accumulated in the SI junction portion composed of the LDD region (p region) portion and the base layer where the electric field is present. In other words, a depleted region is not formed in the SI junction portion. Further, a depleted region is not substantially formed in the SI junction portion composed of the channel region and base layer 3.

In the "OFF state", in addition to the depletion layer formed in the pn junction composed of the LDDs and the channel region, light absorption occurs in the depleted region formed in an SI junction portion composed of the drain region (the $p^+$ region) and LDD region (p region) on the drain side and the base layer. A photocurrent that is caused by electron and hole pairs produced therein is generated.

When x=L+3d, considerable portions of the source region and the drain region are shielded from light. However, a part of the drain region, the LDD region on the drain side, the channel region, the LDD region on the source side, and a part of the source region are not shielded from light. In the "OFF state", light absorption occurs in a depleted region formed in an SI junction portion composed of a part of the drain region and the lower surface of the LDD region on the drain side and a depletion layer formed in pn junction composed of the LDD regions and the channel region. A photo leak current that is caused by electron and hole pairs produced therein is generated. Since a considerable portion of the drain region is shielded from light, it is concluded that, compared with the case in which a light blocking film is not provided at all (in the case of the TFT-B), the "normalized photo leak current" is slight reduced to 0.95.

When x=L/2, the LDD regions and a considerable portion of a boundary portion of the LDD regions and the channel region are shielded from light, but a half of the channel region is not shielded from light. Therefore, light absorption occurs in the half of the channel region. In the "OFF state", if a part of a depletion layer due to pn junction is present in a portion of the half of the channel region, light absorption will occur in the depletion layer present in the portion of the half of the channel region. A photo leak current that is caused by electron and hole pairs produced therein will be generated. As when x=L/2, the "normalized photo leak current" is 0.25, it is concluded that a part of a depletion layer due to pn junction is indeed present in the portion of the half of the channel region that is not shielded from light. In other words, in the "OFF state", it is concluded that thickness $t_{depletion-n}$ of a depletion layer on the channel region side originated from pn-junction, which is extending from a junction interface (a boundary surface of the LDD region on the drain side and the channel region) of pn junction on the drain side, is in a range of $L(5 \mu m) > t_{depletion-n} > L/4$ (1.25 μm).

It is surmised that as a photo leak current is generated only in a portion of ($t_{depletion-n} - L/4$) in thickness $t_{depletion-n}$ of the depletion layer on the channel region side, the "normalized photo leak current" is reduced to 0.25.

When x=L, since the LDD regions are shielded from light but the channel region is not shielded from light, light absorption occurs in the channel region. Accordingly, in the "OFF state", light absorption occurs in a portion present in the channel region in the depletion layer that is formed in the pn junction composed of the LDD regions and the channel region, and a photo leak current that is caused by electron and hole pairs produced therein is generated. when x=L, it is concluded that as the "normalized photo leak current" is 0.35, a considerable portion of the depletion layer due to pn junction is present in the channel regions that is not shielded from light.

In other words, it is surmised that as a photo leak current is generated only in a portion of thickness $t_{depletion-n}$ of the depletion layer on the channel region side, the "normalized photo leak current" is reduced to 0.35.

If it is assumed that a ratio 0.25/0.35 of the "normalized photo leak current" at x=L/2 and the "normalized photo leak current" at x=L is equal to a ratio of $(t_{depletion-n}-L/4)/t_{depletion-n}$, thickness $t_{depletion-n}$ of the depletion layer on the channel region side is estimated as $t_{depletion-n}=(0.35/0.10)\times L/4=7/8\times L$.

If it is assumed that a ratio $(t_{depletion-n}/t_{depletion-p})$ of thickness $t_{depletion-n}$ of the depletion layer on the channel region side and thickness $t_{depletion-p}$ of the depletion layer on the LDD region side is $(t_{depletion-n}/t_{depletion-p})=p/n=(3\times10^{17}/5\times10^{16})=6/1$, thickness $t_{depletion-p}$ of the depletion layer on the LDD region side is estimated as $t_{depletion-p}=1/6\times t_{depletion-n}=7/48\times L$. Since L=5 µm and d=1.5 µm, thickness $t_{depletion-p}$ is estimated as $t_{depletion-p}=7/48\times(10/3\times d)\sim 1/2\times d$.

On the other hand, when x=L+2d, since both the LDD regions and the channel region are not shielded from light, in the "OFF state", light absorption occurs in the entire depletion layer formed in the pn junction formed by the LDD regions and the channel region, and a photocurrent that is caused by electron and hole pairs produced therein is generated. Further, light absorption occurs in the depleted region formed in the SI junction portion composed of the LDD region (the p region) on the drain side and the base layer, and a photocurrent that is caused by electron and hole pairs produced therein is also generated. However, when x=L+2d, the "normalized photo leak current" is 0.55 and, when compared with the case in which a light blocking film is not provided at all (in the case of the TFT-B) and the case of x=L+3d, generation of a photo leak current is remarkably suppressed.

When x=L+d, since a half of the LDD regions and the channel region are not shielded from light, in the "OFF state", light absorption occurs in a portion present in the channel region and a portion present in the half of the LDD regions in the depletion layer that is formed in the pn junction composed of the LDD regions and the channel region, and a photocurrent that is caused by electron and hole pairs produced therein is generated. When X=L+d, it is concluded that as the "normalized photo leak current" is 0.50 and is only slightly small compared with the "normalized photo leak current" of 0.55 when x=L+2d, in the "OFF state", the most portion of the depletion layer present in the LDD regions in the depletion layer that is formed in the pn junction composed of the LDD regions and the channel region is present in the portion of the half of the LDD regions.

Thickness $t_{depletion-p}\sim 1/2\times d$ of the depletion layer on the LDD region side due to the pn junction that is estimated above is a value equivalent to the portion of the half of the LDD region on the drain region side (1/2×d).

From the examination result explained above, it is seen that, by selecting length x to be in the range of L≤x≤L+2d, in the "OFF state", generation of a photo leak current that is caused by light absorption in the depletion layer formed in the pn junction composed of the LDD regions and the channel region and the depleted region formed in the SI junction portion composed of the drain region (the p+ region) and LDD region (p region) on the drain side and the base layer can be effectively suppressed.

It is preferable to employ a structure in which the LDD regions are formed on both the sides of the gate electrode and length (gate electrode length) $L_{gate}$ of the gate electrode and length (channel length) L of the channel region formed right below the gate electrode are equal ($L=L_{gate}$). In the case when the LDD regions are formed on both the sides of the gate electrode film, this structure can be formed in a self-aligning manner and does not complicate a manufacturing process.

On the other hand, when length (channel length) L of the channel region and length d of the LDD regions provided on both the sides of the channel region are large, it is necessary to increase voltage ($V_D-V_S$) applied between the source electrode and the drain electrode. According to the increase in the voltage, power consumption also increases.

Therefore, when voltage ($V_D-V_S$) applied between the source electrode and the drain electrode is set in a range of 50V≥|$V_D-V_S$|≥0.1V, it is desirable to select length (channel length) L of the channel region in a range of 100 µm≥L≥2 µm and select length d of the LDD regions provided on both the sides of the channel region in a range of 10 µm≥d≥0.1 µm.

When L and d are selected in the aforementioned ranges, if a combination of (L=2 µm, d=10 µm) is selected, d/L=10/2. If a combination of (L=100 µm, d=0.1 µm) is selected, d/L=1/1000.

When a structure in which the potential of the light blocking film is electrically floated without being controlled is employed, the influence of the potential of the light blocking film on threshold gate bias $V_{th}$ is studied. Specifically, when the construction shown in FIG. 4 is employed, length x between the drain side region of the light blocking film and the source side region of the light blocking film are variously changed, and a change in threshold gate bias $V_{th}(x)$ is measured.

For the P-channel type TFT (TFT-B) of conventional type, which has such a structure that any influence of the potential of the light blocking film is by no means present, specifically, such a structure that a light blocking film is not provided, its threshold gate bias $V_{th}$ (x=∞) is measured separately. A difference $\Delta V_{th}(x)=(V_{th}(x)-V_{th}(x=\infty))$ between threshold gate bias $V_{th}$ (x=∞) and threshold gate bias $V_{th}(x)$ measured for the structure having length x between the drain side region of the light blocking film and the source side region of the light blocking film is set as a shift amount of threshold gate bias $V_{th}(x)$.

In addition, for a TFT which has such a structure in which x=0, i.e., the light blocking film is formed to be arranged to shield the entire region of from the source region to the drain region from light, i.e., the P-channel type TFT of conventional type having the structure shown in FIG. 6 (hereinafter referred to as TFT-C), its threshold gate bias $V_{th}$ (x=0) is separately measured in a state in which the electrode film electrically connected to the light blocking film is floated.

In a structure in which thickness $t_{polySi}$ of patterned crystalline silicon film 4 is selected as $t_{polySi}$=50 nm; channel width W is selected as W=5 µm; channel length L is selected as L=5 µm; and length d of the LDD regions is selected as d=1.5 µm, TFTs in which length x between the drain side region of the light blocking film and the source side region of the light blocking film is variously selected are manufactured and performance of the TFTs are compared. The channel region consisting of the crystalline silicon film of the first conduction type has n-type conductivity with n=5×10$^{16}$ cm$^{-3}$ and the LDD regions have p-type conductivity with average carrier density of p=3×10$^{-17}$ cm$^{-3}$. Therefore, the TFT has the structure of a P-channel type field effect transistor.

On the other hand, patterned light blocking film 2 is formed of a Cr film having thickness of 50 nm and base layer 3 is formed of a silicon oxide film having thickness of 500 nm The measurement of threshold gate bias $V_{th}(x)$ is performed under the following conditions in a state in which light is not irradiated:

drain bias $(V_D)$: $V_D=-10V$, source bias $(V_S)$: $V_S=0V$, gate bias in the "OFF state": $Vg(OFF)=10V$.

Gate bias Vg that is required to switch from the "OFF state" to the "ON state" is measured. Gate bias Vg at which source-to-drain current $I_{DS}(A)$ reaches $1\times10^{-7}$ A is represented as threshold gate bias $V_{th}(x)$.

In FIG. 5, a result obtained by plotting "shift amount: $\Delta V_{th}(x)$ of threshold gate bias $V_{th}(x)$" measured under the aforementioned measurement conditions with respect to length x between the drain side region of the light blocking film and the source side region of the light blocking film is shown.

When length x between the drain side region of the light blocking film and the source side region of the light blocking film is in a range of x<L, the drain side region of the light blocking film and the source side region of the light blocking film are arranged to partially overlap the channel region with base layer 3 intervening therebetween. Therefore, such situation is achieved in which potential $(V_{BD}(t))$ of the drain side region of the light blocking film and potential $(V_{BS}(t))$ of the source side region of the light blocking film have direct influence on the lower surface of the channel region through base layer 3. As a result, in the range of x<L, relating to the decrease of x, "shift amount: $\Delta V_{th}(x)$ of threshold gate bias $V_{th}(x)$" increases.

As in the TFT illustrated in FIG. 1, in the range of x>L, the forming region of light blocking film 2 of the "U-shaped" pattern is arranged not to overlap the channel region and the forming region of gate electrode film 6 and gate line 5. Therefore, light blocking film 2 is arranged such that potential (Vg(OFF)) of gate electrode film 6 and gate line 5 does not have any substantial influence on potentials $(V_{BD}(t)$ and $V_{BS}(t))$ of light blocking film 2.

On the other hand, in a range of 0<x<L, the forming region of light blocking film 2 of the "U-shaped" pattern is arranged to partially overlap the channel region and the forming region of gate electrode film 6. Light blocking film 2 partially overlaps gate electrode film 6 with base layer 3 and gate insulating film 5 intervening therebetween. As a result, an MIM structure (capacitor $C_{GI(D/S)}$) of light blocking film 2/(base layer 3+ gate insulating film 5)/gate electrode film 6 is composed thereof. Accordingly, light blocking film 2 is arranged such that potential (Vg(OFF)) of gate electrode film 6 has influence on potential $(V_{BD}(t))$ of the drain side region of the light blocking film and potential $(V_{BS}(t))$ of the source side region of the light blocking film by the help of the MIM structure (capacitor $C_{GI(D/S)}$).

Further, in the case of the TFT-C (in the case of x=0), the forming region of light blocking film 2 is arranged to have more widely overlapping with the channel region and the forming region of gate electrode film 6. Light blocking film 2 and gate electrode film 6 overlap in a wider area with base layer 3 and gate insulating film 5 intervening therebetween. As a result, an MIM structure (capacitor $C_{GI(D/S)}$) of light blocking film 2/(base layer 3+ gate insulating film 5)/gate electrode film 6 is composed thereof. Therefore, light blocking film 2 is arranged such that potential (Vg(OFF)) of gate electrode film 6 has larger influence on potential $(V_{BD}(t))$ of the drain side region of the light blocking film and potential $(V_{BS}(t))$ of the source side region of the light blocking film more by the help of the MIM structure (capacitor $C_{GI(D/S)}$).

On the other hand, in a range of L+2d≥x≥L, the drain side region of the light blocking film and the source side region of the light blocking film are arranged to partially overlap the LDD regions with base layer 3 intervening therebetween. Therefore, such situation is achieved in which potential $(V_{BD}(t))$ of the drain side region of the light blocking film and potential $(V_{BS}(t))$ of the source side region of the light blocking film do not have any direct influence of the lower surface of the channel region. As a result, in the range of L+2d≥x≥L, "shift amount: $\Delta V_{th}(x)$ of threshold gate bias $V_{th}(x)$" can be regarded as substantially negligible. In other words, in the range of L+2d≥x≥L, "threshold gate bias $V_{th}(x)$" is substantially equal to "threshold gate bias $V_{th}$ (x=∞)" of the TFT (TFT-B) having the structure of conventional type.

Potential $(V_{BD}(t))$ of the drain side region of the light blocking film and potential $(V_{BS}(t))$ of the source side region of the light blocking film depend on length x between the drain side region of the light blocking film and the source side region of the light blocking film as well as the thickness of base layer 3. Therefore, variation in length x and the thickness of base layer 3 cause variation in potential $(V_{BD}(t))$ of the drain side region of the light blocking film and potential $(V_{BS}(t))$ of the source side region of the light blocking film. In the case when length x is set in the range of L+2d≥x≥L, even if fluctuation in potential $(V_{BD}(t))$ of the drain side region of the light blocking film and potential $(V_{BS}(t))$ of the source side region of the light blocking film occurs, "threshold gate bias $V_{th}(x)$" is substantially equal to "threshold gate bias $V_{th}$ (x=∞)". When the TFT shown in FIG. 1 is used as the driving device for active matrix of the liquid crystal display device, if length x between the drain side region of the light blocking film and the source side region of the light blocking film is kept in the range of L+2d≥x≥L, it is possible to suppress fluctuation in "threshold gate bias $V_{th}(x)$".

When the result shown in FIG. 5 is examined in detail, "shift amount: $\Delta V_{th}(x)$ of threshold gate bias $V_{th}(x)$" shows a slight difference between x=L and x=L+2d. It is concluded that this difference is caused by such reason that the influence of the potential of the light blocking film on the channel region is slightly different between x=L and x=L+2d. In other words, it is concluded that, even though the light blocking film do not overlap the channel region, when x decreases from x=L+2d to x=L, the potential of the light blocking film has slight influence on the channel region. The result shown in FIG. 2 also clearly indicates that, even though the light blocking film do not overlap the channel region, when x is substantially x=L, the potential of the light blocking film has slight influence on the channel region. On the other hand, when both of the result shown in FIG. 5 and the result shown in FIG. 2 are taken into consideration, it is concluded that, as the light blocking film do not overlap the channel region, even when x is x=L, the influence of the potential of the light blocking film on the channel region is reduced to low level.

When the TFT is used as the driving device for active matrix of the liquid crystal display device, gate bias: Vg(OFF) used for "OFF operation" and gate bias: Vg(ON) used for "ON operation", which are used for "ON/OFF switching operations" of the TFT, are set taking account of fluctuation $\Delta V_{th}$ of "threshold gate bias $V_{th}$" of the TFT. For example, gate bias: Vg(OFF) used for the "OFF operation" is set in a range of $Vg(OFF)<V_{th}-\Delta V_{th}$. Gate bias: Vg(ON) used for the "ON operation" is set in a range of $Vg(ON)>V_{th}+\Delta V_{th}$. A driving bias (gate bias: Vg) that is used for the "ON/OFF switching operations" of the TFT is set such that a difference (Vg(ON)−Vg(OFF)) between gate bias: Vg(OFF) used for the "OFF operation" and the gate bias: Vg(ON) used for the "ON operation" satisfies at least a condition (Vg(ON)−Vg (OFF))>2ΔV$_{th}$. When the TFT having the construction shown in FIG. 1 is used, as fluctuation in "threshold gate bias V$_{th}$(x)" is suppressed by setting length x in the range of L+2d≥x≥L, it is unnecessary to set an increase (Vg(ON)−Vg(OFF)) of a driving bias (gate bias: Vg) unnecessarily large. At least, it is by no means necessary to set the increase (Vg(ON)−Vg (OFF)) of the driving bias (gate bias: Vg) unnecessarily large in order to prevent a defect in display due to fluctuation in "threshold gate bias V$_{th}$(x)" of respective TFTs that are used as the driving device for active matrix of the liquid crystal display device.

In the TFT having the construction shown in FIG. 1, even though the potential of the light blocking film is not fixed, a "photo leak current" in the "OFF state" is suppressed by setting length x between the drain side region of the light blocking film and the source side region of the light blocking film in the range of L+2d≥x≥L. Fluctuation in "threshold gate electrode V$_{th}$ (x)" is also reduced thereby.

In the first exemplary embodiment, for convenience of explanation, the technical features of the thin-film transistor according to the first aspect or the second aspect of the present invention are explained with reference to the mode employing the shape of the planar type TFT, an example of the construction of which is shown in FIG. 1. The technical features of the thin-film transistor according to the first aspect or the second aspect of the present invention can be applied to either of top gate type thin-film transistors in which the shape of the planar type TFT or a shape of a staggered type TFT is selected.

When the shape of the staggered type TFT is employed, a drain electrode is provided on a base layer, a drain region is formed on the drain electrode, a source electrode is provided on the base layer, and a source region is formed on the source electrode. Therefore, a drain side region of the light blocking film overlaps the drain electrode with the base layer intervening therebetween. A source side region of the light blocking film overlaps the source electrode with the base layer intervening therebetween. In the overlapping portions, an MIM structure (capacitor C$_{D-MIM}$) composed of the drain electrode/the base layer/the drain side region of the light blocking film and an MIM structure (capacitor C$_{S-MIM}$) composed of the source electrode/the base layer/the source side region of the light blocking film are respectively formed. In addition, the drain side region of the light blocking film overlaps a part of the drain region with the base layer intervening therebetween. The source side region of the light blocking film overlaps a part of the source region with the base layer intervening therebetween. In those parts, an MIS structure (capacitor C$_{D-MIS}$) composed of the drain region/the base layer/the drain side region of the light blocking film and an MIS structure (capacitor C$_{S-MIS}$) composed of the source region/the base layer/the source side region of the light blocking film are respectively formed. Therefore, the technical features of the thin-film transistor according to the first aspect or the second aspect of the present invention can be applied to either cases of TFT in which the shape of the planar type TFT or the shape of the staggered type TFT is selected, in similar manner, as long as the top gate type thin-film transistor is formed thereby.

Second Exemplary Embodiment

As a second exemplary embodiment of the present invention, as to the method of manufacturing a thin-film transistor according to the third aspect or the fourth aspect of the present invention, by using the thin-film transistor having the structure shown in FIG. 4 according to the first exemplary embodiment of the present invention as an example, a manufacturing process of the thin-film transistor is explained in detail with reference to the drawings.

Figures 1, 7:
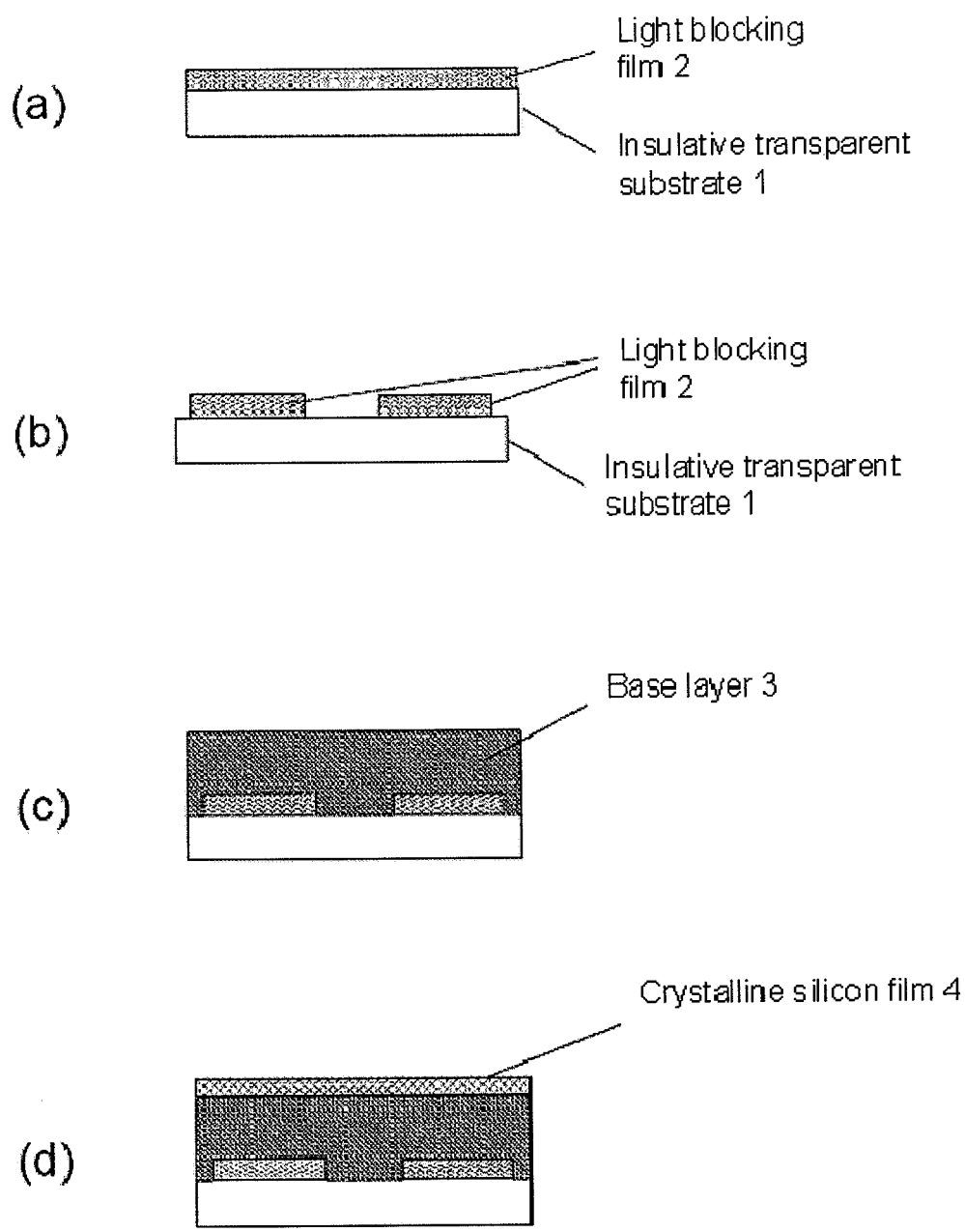
Figure 7:
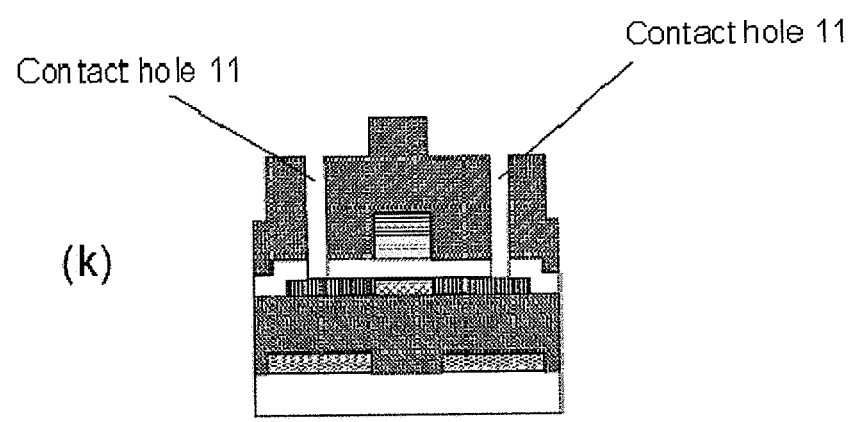
Figure 4:
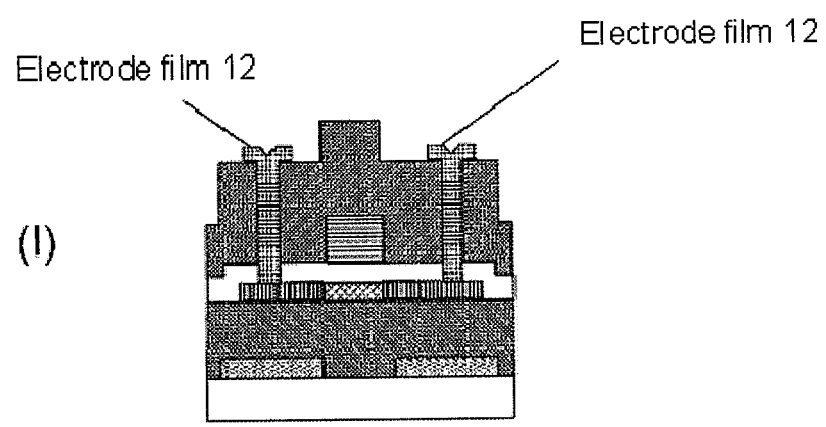

FIGS. 7-1 to 7-4 are flowcharts for illustrating a manufacturing process for the thin-film transistor according to the first exemplary embodiment of the present invention, specifically, the TFT, the sectional structure of which is shown in FIG. 3. In FIGS. 7-1 to 7-4, a series of steps comprised in the process for manufacturing a planar type TFT shown in FIG. 3; the following steps (a) to (i), excluding steps for forming second interlayer insulating film 15 and pixel electrode 13 formed on second interlayer insulating film 15, are shown.

In the steps shown in FIGS. 7-1 to 7-4, a mode in which a polysilicon film is employed as the crystalline silicon film may be selected.

Step (a)

First, a metal film, such as chromium film, which is used for forming light blocking film 2 is formed on insulative transparent substrate 1, such as a glass substrate.

Figure 6:
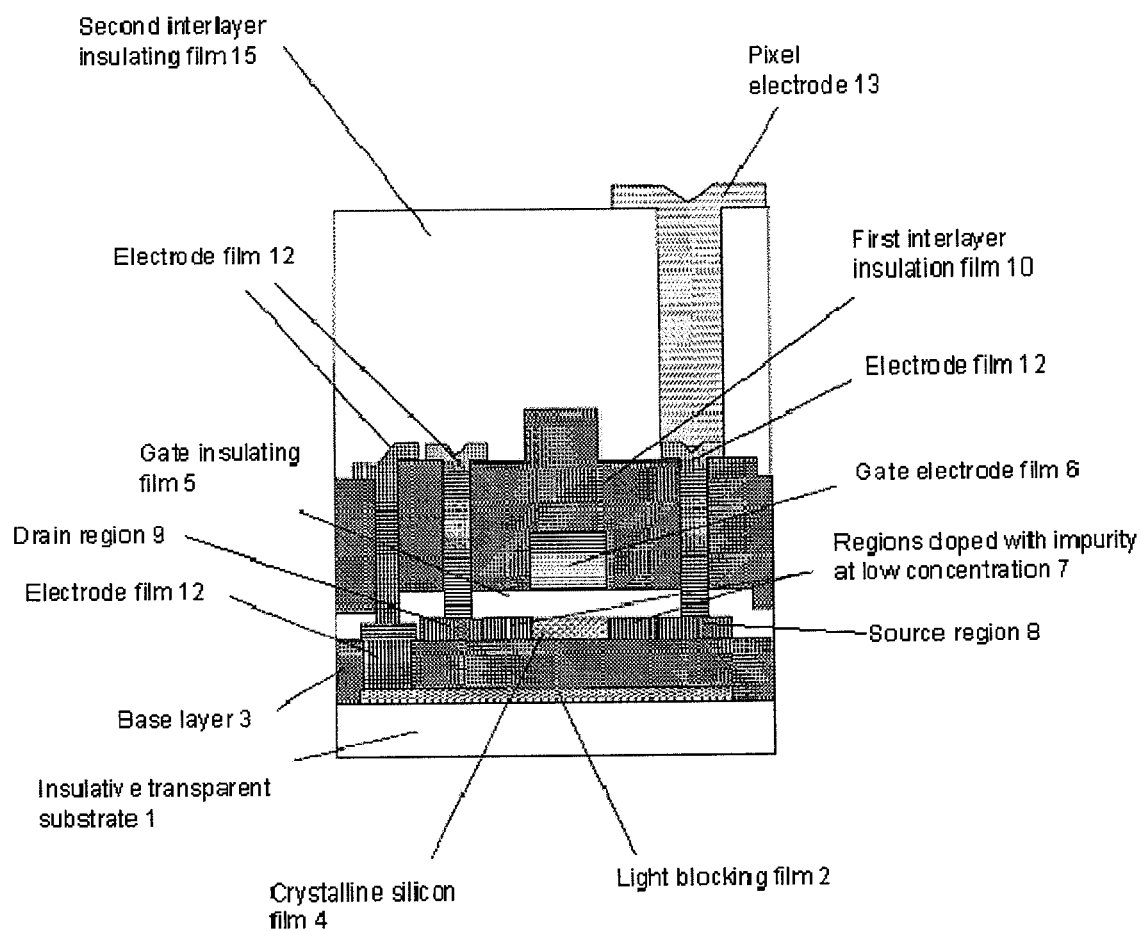
FIG. 6 is a sectional view schematically showing the structure of a thin-film transistor (TFT-C) in which a LDD structure is employed and light blocking film with an electrode for potential application is provided.

In the TFT (TFT-C) of conventional type shown in FIG. 6 in which the electrode film for fixing the potential of the light blocking film is provided, when contact holes are formed in the base layer and the electrode film in contact with the light blocking film is formed, in an etching step for formation of the contact holes, the surface of the light blocking film in openings of the contact holes is also etched. Therefore, it is necessary to select the thickness of the light blocking film taking account of an amount of thickness to be etched off. In other words, it is necessary to select the thickness of the light blocking film to be larger than the amount of thickness to be etched off.

In the TFT shown in FIG. 4, since the electrode film for fixing the potential of the light blocking film is not provided, as explained in the first exemplary embodiment, the thickness of the light blocking film is selected taking account of light blocking performance of a conductive non-light transmissive material in use. When the metal film such as chromium film is used, the thickness of the light blocking film can be set thin, for instance, in a range of thickness equal to or thicker than 20 nm and equal to or thinner than 500 nm.

Step (b)

After a photoresist pattern by lithography is formed on light blocking film 2, light blocking film 2 is patterned into a predetermined shape using dry etching or wet etching, or combination of both the techniques.

As illustrated in the top view shown in FIG. 1, a plane shape of the patterning of light blocking film 2 is a "U-shaped" pattern as a whole and is divided into left and right two regions. Length x between the left and right two regions is selected in a range of L+2d≥x≥L with respect to length L of the channel region of the TFT and length d of the LDD regions provided on both the sides of the channel region. The size of the outer boundary of the "U-shaped" pattern is selected such that ends on the opposite side of sides of the "U-shaped" pattern opposed across the channel region overlap regions doped with impurity at high concentration, which are used as the source region and the drain region of the TFT.

Length L$_{shield-D}$ of the drain side region of the light blocking film and length L$_{shield-S}$ of the source side region of the light blocking film are selected so as to overlap the drain region and the source region of the TFT as shown in FIG. 4. Consequently, the light blocking film is arranged to shield a part of the LDD regions of the TFT and a boundary portion of the LDD regions and the source and drain regions.

As explained above, in the structure shown in FIG. 4, length L of the channel region of the TFT and length d of the LDD regions provided on both the sides of the channel regions are respectively selected in a range of 100 μm≥L≥2 μm and a range of 10 μm≥d≥0.1 μm. Consequently, voltage ($V_D$-$V_S$) applied between the source electrode and the drain electrode is set in a range of 50V≥|$V_D$-$V_S$|≥0.1V.

Length $L_{shield-D}$ of the drain side region of the light blocking film and length $L_{shield-S}$ of the source side region of the blocking film are usually selected to be sufficiently large in comparison with length d of the LDD regions.

In order to set current density (ON current density) in the "ON state" to sufficiently high density, it is necessary to reduce resistance in the "ON state". Specifically, it is necessary to reduce length L of the channel region of the TFT and length d of the LDD regions provided on both the sides of the channel region to some extent. On the other hand, even when length d of the LDD regions is reduced to some extent, length $L_{shield-D}$ of the drain side region of the light blocking film and length $L_{shield-S}$ of the source side region of the light blocking film can be secured to sufficiently large level. Therefore, the patterning step itself for light blocking film 2 can be carried out with a sufficient process margin.

Step (c)

A silicon oxide film or a layered film composed of the silicon oxide film and a silicon nitride film is formed, as the base layer 3, on the patterned light blocking film 2.

Step (d)

An amorphous silicon film is deposited on base layer 3. On purpose that the concentration of impurities of the first conduction type contained in the crystalline silicon film of the first conduction type which is used to form the channel region is set to a desired value to adjust threshold gate bias $V_{th}(x)$, a very small amount of p-type impurities, for example, boron or n-type impurities, for example, phosphorus may be doped in the step for deposition of the amorphous silicon film. Alternatively, after the deposition step, impurities of the first conduction type may be introduced into the entire surface of the amorphous silicon film by an ion doping method or an ion implantation method.

Subsequently, the amorphous silicon film is subjected to crystallization by irradiating with an excimer laser or the like to form a crystalline silicon film having excellent quality.

In step (d), in place of the method of crystallization by irradiating with the excimer laser or the like, a plasma CVD method or a sputtering method may be used to form the crystalline silicon film, in such a case where priority is given to uniformity of film thickness.

When such a mode in which a polysilicon film is formed as the crystalline silicon film is selected, the technique for inducing crystallization of the amorphous silicon film by irradiating with an excimer laser or the like may be used to form a polysilicon film having excellent quality. When such a mode in which a polysilicon film is deposited as the crystalline silicon film is selected, a plasma CVD method or a sputtering method may be applied to deposit a polysilicon film.

Step (e)

The crystalline silicon film is patterned into a predetermined shape by using lithography and dry etching. A natural oxide film is produced on the surface of patterned crystalline silicon film 4. Before a gate insulating film is formed, for the purpose of removing the natural oxide film present on the surface of the crystalline silicon film, cleaning is performed using etchant such as diluted fluoric acid. The patterned crystalline silicon film 4, which is subjected to the treatment for removing the natural oxide film to expose a clean silicon surface thereon, is used in the process of the next step.

Step (f)

Gate insulating film 5 is deposited to cover patterned crystalline silicon film 4 and base layer 3. Gate insulating film 5 is a silicon oxide film or a layered structure composed of the silicon oxide film and a silicon nitride film. An interface between patterned crystalline silicon film 4 and gate insulating film 5 is to be an interface between the crystalline silicon film and the silicon oxide film.

Gate insulating film 5 is deposited by the plasma CVD method. Temperature for the deposition is selected to be temperature lower than temperature at which insulative transparent substrate 1 is deformed by heat, for example, in a range of temperature equal to or lower than 600° C.

The thickness of gate insulating film 5 is not specifically limited as long as desired gate breakdown voltage can be obtained and target threshold gate bias $V_{th}(x)$ can be attained. When gate breakdown voltage is at least set to be equal to or higher than 10V, the thickness of gate insulating film 5 is preferably selected from, for example, a range of 5 nm to 5000 nm and more preferably selected from a range of 10 nm to 1000 nm The thickness of gate insulating film 5 is selected in a range in which ion implantation is possible at a concentration distribution in a desired depth direction from the upper surface of gate insulating film 5 in a step of introducing high-concentration impurities by ion implantation and a step of introducing low-concentration impurities explained later.

Step (g)

Gate electrode film 6 is formed on gate insulating film 5.

A material of the gate electrode film is selected such that a work function of gate electrode film 6 is a desired value with respect to a work function of the crystalline silicon film of the first conduction type, which depends on the concentration of impurities of the first conduction type in the crystalline silicon film of the first conduction type used as the channel region, and a work function of the gate insulating film and the thickness of the gate insulating film.

Specifically, as the material of gate electrode film 6, a metal material having a predetermined work function or silicon (polysilicon) doped with impurities of the second conduction type at predetermined concentration can be used. In other words, a metal gate having the desirable work function or a poly-Si gate having the desirable work function can be employed as the gate electrode. A layered structure composed of a film formed of the metal material and a silicon film doped with the impurities of the second conduction type may be also used. For example, for the purpose of reducing the resistance of the gate electrode, an upper layer film formed of a metal material having excellent electric conductivity can be laminated on a lower layer film formed of the metal material having the desirable work function or the silicon (polysilicon) doped with the impurities of the second conduction type at the desirable concentration.

When the silicon film doped with the impurities of the second conduction type is employed as the material of gate electrode film 6, usually, the doping level of the impurities of the second conduction type that are contained in the silicon film doped with the impurities of the second conduction type is selected to be at high concentration. When the crystalline silicon film of the first conduction type is the p-type crystalline silicon film, n-type impurities, for example, phosphorus is selected as the impurities of the second conduction type. When the crystalline silicon film of the first conduction type is the n-type crystalline silicon film, p-type impurities, for example, boron is selected as the impurities of the second conduction type. Plurality of impurities of the second conduction type can be doped as the impurities of the second conduction type. The doping level of the impurities of the second conduction type that are contained in the silicon film doped with the impurities of the second conduction type is selected according to a kind of the impurities of the second conduction type in use and a target electric conductivity of gate electrode film 6.

The metal film deposited by the sputtering method or the silicon film doped with the impurities of the second conduction type deposited by the CVD method or the like is formed on gate insulating film 5 at predetermined thickness.

A photoresist pattern is formed on the gate electrode film by lithography. The gate electrode film is etched using the dry etching method or the wet etching method or combination of both the methods to form a gate electrode having predetermined gate length.

In the patterning of the gate electrode film, alignment is performed such that the gate electrode having the predetermined gate length is located on a gap portion provided between the divided two regions of patterned light blocking film 2. Specifically, alignment is performed such that ends of the divided two regions of patterned light blocking film 2 are arranged symmetrically with respect to the center of the gate electrode having the predetermined gate length.

Gate electrode film 6 to be formed is used as an ion implantation mask in a step of ion-implanting the impurities of the second conduction type at low concentration explained later. Therefore, the thickness of gate electrode film 6 to be formed is selected to thickness necessary for a function of an ion implantation mask. For example, when gate electrode film 6 is a metal gate, the thickness of gate electrode film 6 may be selected in a range of 50 nm to 1000 nm.

Step (h)

The impurities of the second conduction type are ion-implanted from the upper surface of patterned crystalline silicon film 4 through gate insulating film 5 to form regions doped with impurity at high concentration and to form regions doped with impurity at low concentration.

The regions doped with impurity at high concentration that are used as the source region and the drain region are formed first. Thereafter, the regions doped with impurity at low concentration that are used as the LDD regions are formed. Specifically, after the impurities of the second conduction type are ion-implanted at high concentration in portions equivalent to the source region and the drain region, the impurities of the second conduction type are ion-implanted at low concentration in portions equivalent to the source and drain regions and the LDD regions, whereby the regions doped with impurity at high concentration used as the source region and the drain region and the regions doped with impurity at low concentration used as the LDD regions are formed.

Depending on a case, after the impurities of the second conduction type are ion-implanted at low concentration in the portions equivalent to the source and drain regions and the LDD regions, the impurities of the second conduction type are ion-implanted at high concentration in the portions equivalent to the source region and the drain region, whereby the regions doped with impurity at high concentration used as the source region and the drain region and the regions doped with impurity at low concentration used as the LDD regions can also be formed.

In other words, the gate electrode is formed prior to the step of ion implantation. When the impurities of the second conduction type are ion-implanted at low concentration, the gate electrode functions as a mask. Therefore, ion implantation does not occur in a region right below the gate electrode. Therefore, the regions doped with impurity at low concentration used as the LDD regions are formed in a self-aligning manner on both sides of the gate electrode.

First, resist is applied over the entire surface to form a resist pattern having openings corresponding to the source region and the drain region. The impurities of the second conduction type are ion-implanted at high concentration by using the resist pattern as a mask. Therefore, the impurities of the second conduction type are ion-implanted at high concentration only in the openings corresponding to the source region and the drain region. Thereafter, after the resist pattern is peeled off, the impurities of the second conduction type are ion-implanted at low concentration by using gate electrode film 6 as a mask. As a result, the openings corresponding to the source region and the drain region receive the high-concentration ion implantation of the impurities of the second conduction type and the low-concentration ion implantation of the impurities of the second conduction type. A total concentration distribution of the impurities of the second conduction type in the thickness direction is a combined concentration distribution of a concentration distribution of the impurities of the second conduction type in the high-concentration ion implantation and the impurities of the second conduction type in the low-concentration ion implantation. On the other hand, only the low-concentration ion implantation of the impurities of the second conduction type is applied to the region right below the gate electrode and the remaining region excluding the openings. As a result, regions in which the impurities of the second conduction type are ion-implanted at low concentration are respectively formed on both the sides of gate electrode film 6 and between the source region and the drain region.

In the step of the high-concentration ion implantation of the impurities of the second conduction type, when the impurities of the second conduction type is n-type impurities, phosphorus is selected and, when the impurities of the second conduction type is p-type impurities, boron is selected. As conditions for ion implantation, for example, the following conditions may be selected:

when gate insulating film 5 is a silicon oxide film having thickness of 100 nm and the thickness of patterned crystalline silicon film 4 is 50 nm, $B^+$ ion generated by RF-plasma ionization of $B_2H_6$ or $P^+$ ion generated by RF-plasma ionization of $PH_3$ are used, RF power used for the RF-plasma ionization is set to 100 W, and an acceleration voltage is set to 25 keV and a set dosage level is set to $6.7 \times 10^{15}$ cm$^{-2}$.

In the step of the low-concentration ion implantation of the impurities of the second conduction type, when the impurities of the second conduction type is n-type impurities, phosphor is selected and, when the impurities of the second conduction type is p-type impurities, boron is selected. As conditions for ion implantation, for example, the following conditions may be selected:

when gate insulating film 5 is a silicon oxide film having thickness of 100 nm and the thickness of patterned crystalline silicon film 4 is 50 nm, $B^+$ ion generated by RF-plasma ionization of $B_2H_6$ or $P^+$ ion generated by RF-plasma ionization of $PH_3$ are used, RF power used for the RF-plasma ionization is set to 100 W, and an acceleration voltage is set to 30 keV and a set dosage level is set to $2.5 \times 10^{13}$ cm$^{-2}$.

In the case if the aforementioned conditions are used, if the LDD regions has p-type conductivity of average carrier density $p=3 \times 10^{17}$ cm$^{-3}$, it is estimated that the drain region and the source region have $p^+$-type conductivity of average carrier density $p=8 \times 10^{19}$ cm$^{-3}$.

Step (i)

Next, first interlayer insulating film 10 is formed.

The formation of first interlayer insulating film 10 is performed by depositing a silicon oxide film, a silicon nitride film, or a laminate film of the silicon oxide film and the silicon nitride film by using the plasma CVD method or the like.

First interlayer insulating film 10 insulates and separates gate line 5 for supplying gate bias Vg applied to gate electrode film 6 from drain line 14 for supplying drain bias $V_D$ applied to the drain electrode. Therefore, the thickness of first interlayer insulating film 10 is selected taking account of wiring capacitance ($C_{gate-drain}$) between gate line 5 and drain line 14 in addition to dielectric voltage between gate line 5 and drain line 14.

Temperature for the deposition of first interlayer insulating film 10 is selected to be temperature lower than temperature at which insulative transparent substrate 1 is deformed by heat, for example, in a range of temperature equal to or lower than 600° C.

Step (j)

After that, heat treatment for activation is performed in order to activate the impurities of the second conduction type implanted in the regions doped with impurity at high concentration and the regions doped with impurity at low concentration.

The temperature for the heat treatment for activation is selected to be temperature lower than temperature at which insulative transparent substrate 1 is deformed by heat, for example, in a range of temperature equal to or lower than 600° C. Therefore, for example, the temperature of the heat treatment for activation is selected in a range of temperature equal to or higher than 300° C. and equal to or lower than 600° C.

The heat treatment for activation may be performed by furnace annealing or may be performed by rapid thermal annealing using an excimer laser or the like.

Step (k)

After the heat treatment for activation is completed, contact holes 11 for forming a source electrode film and a drain electrode film, which are electrically in contact with the source region and the drain region, are formed.

A resist pattern having openings that are set at the positions corresponding to parts of the source region and the drain region is formed on first interlayer insulating film 10. First interlayer insulating film 10 and gate insulating film 5 in the openings are etched using dry etching, wet etching, or combination of both the techniques to form contact holes 11.

Step (l)

After contact holes 11 are formed, a metal film such as aluminum film is deposited by the sputtering method or the like. The metal film is patterned by using variety of lithography and etching methods to form source electrode film 12, drain electrode film 12, and drain line 14.

In the TFT that is used as the driving device for active matrix of the liquid crystal display device shown in FIG. 1, as illustrated in the sectional structure shown in FIG. 3, second interlayer insulating film 15 is deposited to cover first interlayer insulating film 10 and wires of drain line 14, and thereby the resulted upper surface thereof is planarized.

A pixel electrode film that is electrically connected to source electrode film 12 via contact holes provided in second interlayer insulating film 15 is formed. The pixel electrode film formed on the upper surface of second interlayer insulating film 15 is patterned to form pixel electrode 13.

When dangling bond is present on the surface of the crystalline silicon film, dangling bond that remains at the interface between the crystalline silicon film and the gate insulating film functions as an interface state. It is preferred that the dangling bond on the surface of crystalline silicon film is terminated to reduce the density of the interface state. Hydrogen may be illustrated as an element suitably used for the termination of the dangling bond on the surface of the crystalline silicon film. As termination treatment for the dangling bond by hydrogen, treatment in hydrogen plasma may be applied. The treatment for terminating the dangling bond on the surface of the crystalline silicon film, such as the treatment in hydrogen plasma, is carried out prior to the deposition of the gate insulating film after the patterning of the crystalline silicon film. For example, such procedure may be used in which the removal of the natural oxide film on the surface of the crystalline silicon film is carried out after the patterning of the crystalline silicon film, and after that, the surface of the crystalline silicon film is subjected to the treatment in hydrogen plasma, and followed by the deposition of the gate insulating film.

Process for manufacturing the TFT that is used as the driving device for active matrix of the liquid crystal display device shown in FIG. 1 is carried out according to the steps explained above, and thus, main process for manufacturing a driving device section of the liquid crystal display device are completed.

In FIGS. 7-1 to 7-4, a manufacturing process for the planar type TFT shown in FIG. 4 is explained by employing, as an example, such a mode in which, after gate electrode film 6 is formed in step (g), the regions doped with impurity at high concentration and the regions doped with impurity at low concentration are formed in step (h). It is also possible to employ such another mode in which the formation of the regions doped with impurity at high concentration is carried out prior to the formation of gate electrode film 6 and, after gate electrode film 6 is formed, the formation of the regions doped with impurity at low concentration is carried out.

In both the modes, after the formation of gate electrode film 6, the low-concentration ion implantation of the impurities of the second conduction type is carried out by using gate electrode film 6 as a mask to form the regions doped with impurity at low concentration. The thickness of the crystalline silicon film may be selected in a range of 15 nm to 100 nm, the thickness of gate insulating film 5 may be selected from, for example, a range of 5 nm to 5000 nm; and, for example, when gate electrode film 6 is a metal gate, the thickness of gate electrode film 6 may be selected in a range of 50 nm to 1000 nm. For instance, even in a case where the thickness of the crystalline silicon film is selected to be 100 nm, the thickness of gate insulating film 5 is selected to be 5000 nm, and the thickness of gate electrode film 6 is selected to be 50 nm, regions doped with impurity at low concentration that reach the surface of the base layer can be formed on both the sides of the gate electrode in a self-aligning manner by using gate electrode film 6 as a mask.

Figures 1, 8:
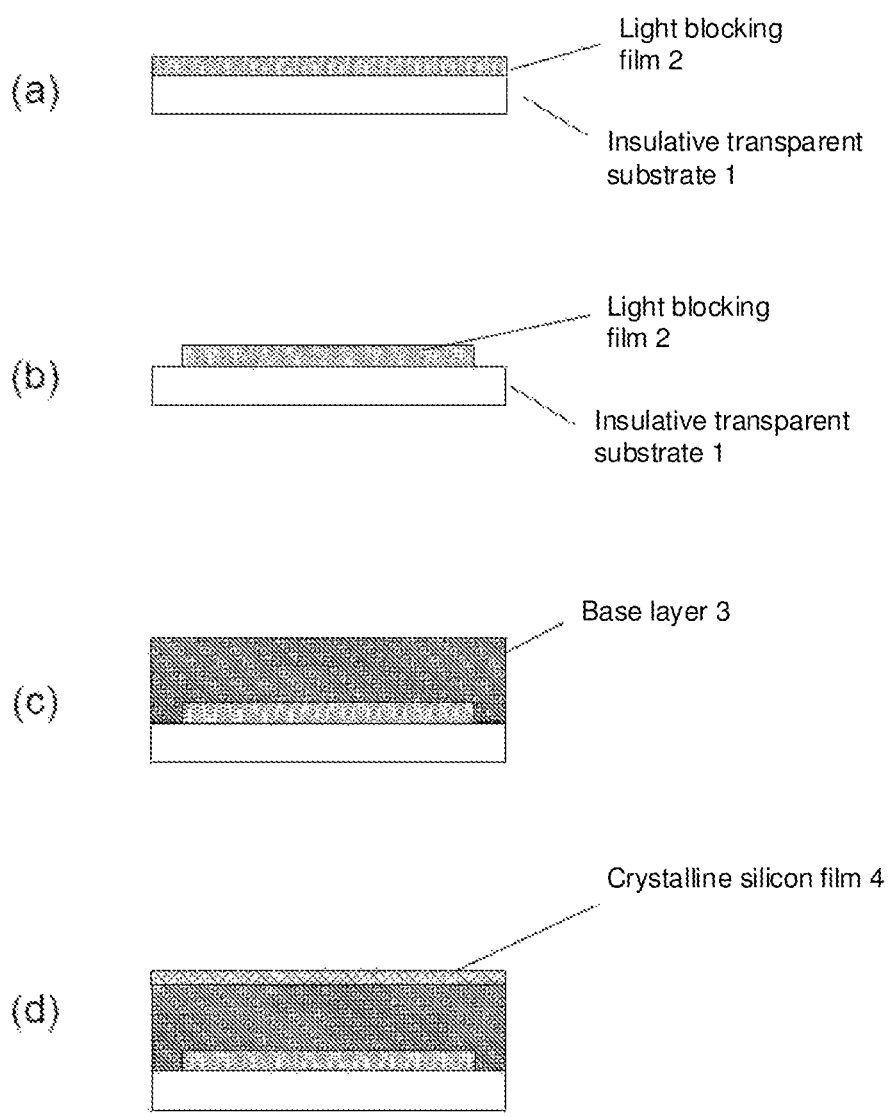
Figures 2, 8:
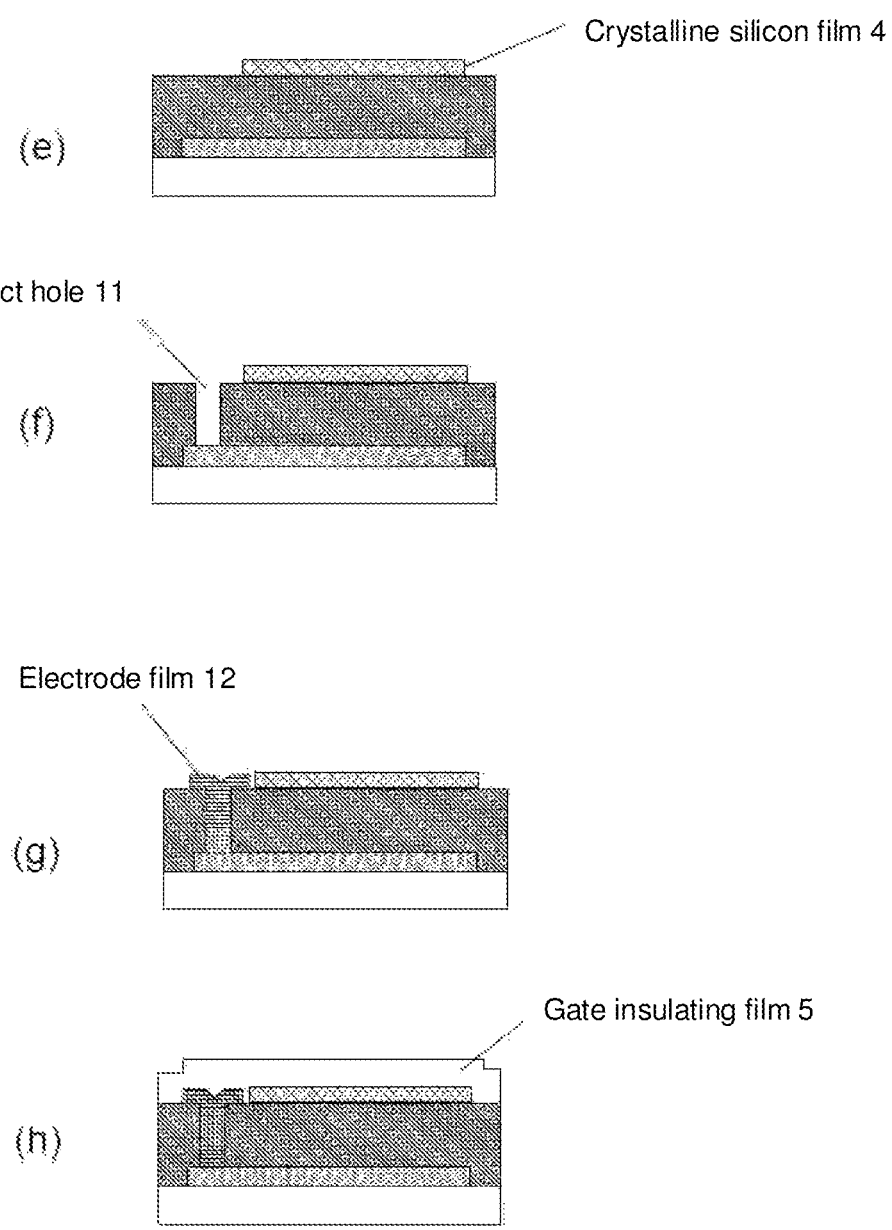
Figures 3, 8:
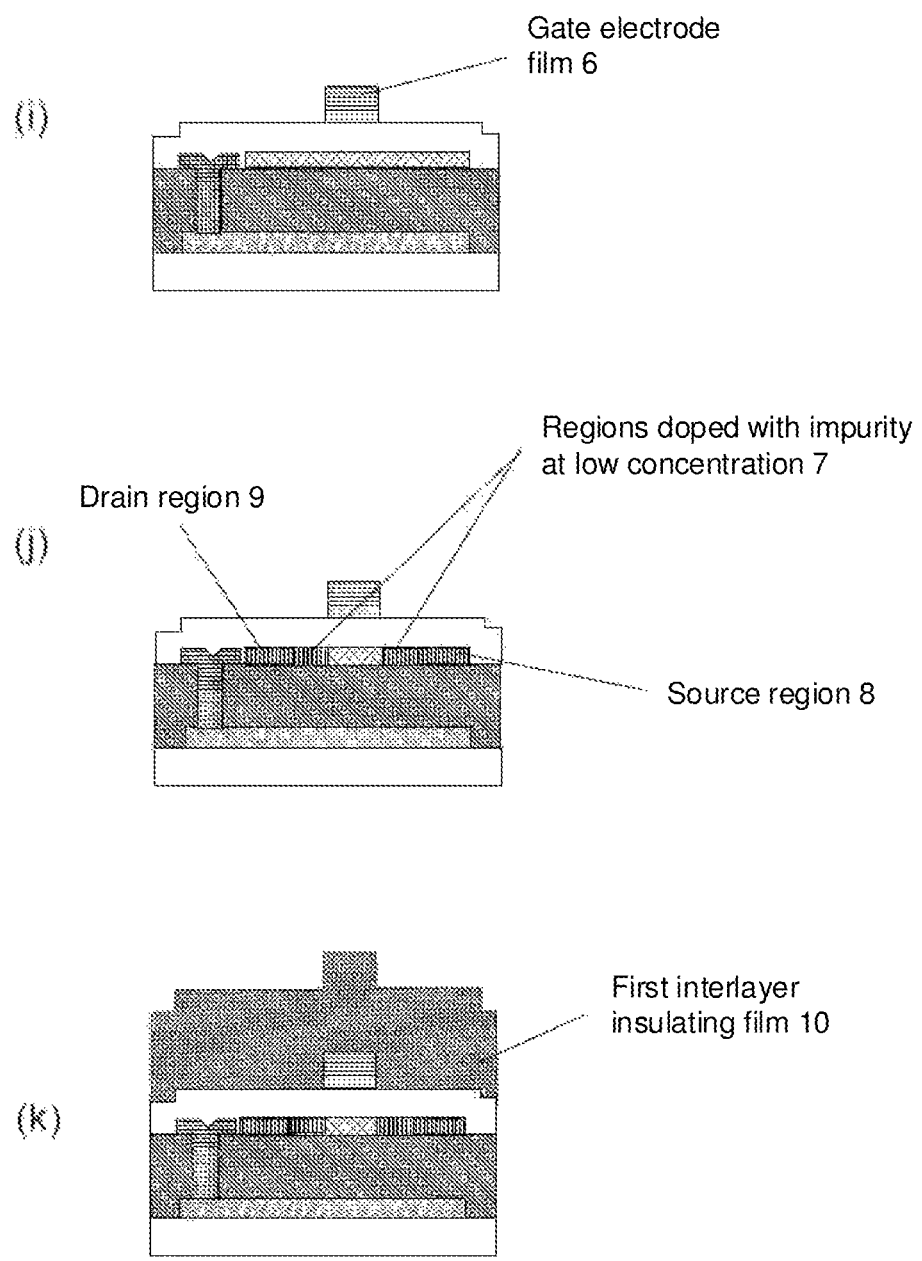

FIGS. 8-1 to 8-4 are flowcharts for explaining a process for manufacturing the TFT (TFT-C) of conventional type, the sectional structure of which is shown in FIG. 6. In FIGS. 8-1 to 8-4, a series of steps comprised in the process for manufacturing a planar type TFT of conventional type; the following steps (a) to (n), excluding steps for forming second interlayer insulating film 15 and pixel electrode 13 formed on second interlayer insulating film 15, which are comprised in the TFT (TFT-C) of conventional type shown in FIG. 6, are shown.

In the process illustrated in FIGS. 8-1 to 8-4, such a mode in which a polysilicon film is employed as the crystalline silicon film may be selected.

In the TFT (TFT-C) of conventional type shown in FIG. 6, an electrode film for fixing the potential of light blocking film 2 is formed. Therefore, the following two steps shown in FIG. 8-2 are provided:

step (f): step of resist pattern formation and base layer etching for forming contact holes 11; and step (g): step of deposition of an electrode film, formation of a resist pattern, and electrode film etching, which is used for formation of electrode film 12 directly in contact with light blocking film 2.

By providing steps (f) and (g), electrode film 12 directly in contact with light blocking film 2 is formed on the upper surface of base layer 3 in advance. As a result, in steps (m) and (n) shown in FIG. 8-4, when a source electrode film and a drain electrode film are formed, electrode film 12 overlying on electrode film 12 that is directly in contact with light blocking film 2 is formed in parallel therewith.

In step (m) shown in FIG. 8D, in order to form contact holes 11 extending from the upper surface of first interlayer insulating film 10 to the surfaces of the source region and the drain region, first interlayer insulating film 10 and gate insulating film 5 are etched. If contact holes extending from the upper surface of first interlayer insulating film 10 to the upper surface of light blocking film 2 are formed, it is necessary to etch first interlayer insulating film 10, gate insulating film 5, and base layer 3.

In comparison with etching time required for etching first interlayer insulating film 10 and gate insulating film 5, to etch first interlayer insulating film 10, gate insulating film 5, and base layer 3, etching time is longer by time required for etching of base layer 3. Therefore, when the contact holes extending from the upper surface of first interlayer insulating film 10 to the upper surface of light blocking film 2 are formed in step (m), the portions of contact holes 11 that extend from the upper surface of first interlayer insulating film 10 to the surfaces of the source region and the drain region are over-etched.

Therefore, steps (f) and (g) need to be provided to avoid the over-etching. In particular, when the thickness of a patterned crystalline silicon film is thin, if a patterned crystalline silicon film is unnecessarily over-etched, this causes an increase in sheet resistance of the source region and the drain region.

In addition, in order to form contact holes extending from the upper surface of first interlayer insulating film 10 to the upper surface of light blocking film 2, it is necessary to surely complete etching of first interlayer insulating film 10, gate insulating film 5 and base layer 3. Actual etching time is selected in such a manner that a process margin is added to necessary etching time at a fixed ratio in order to prevent etching insufficiency. When the necessary etching time is long, time to be added is long, which may causes such situation that the surface of light blocking film 2 is over-etched.

When steps (f) and (g) are provided to form the contact hole extending from the upper surface of base layer 3 to the surface of light blocking film 2, the etching time necessary for this step can be set at short time. As a result, it is possible to substantially reduce a degree of over-etching of the surface of light blocking film 2.

In comparison with the manufacturing process for the TFT (TFT-C) of conventional type, the sectional structure of which is shown in FIG. 6, the two steps, i.e., steps (f) and (g), shown in FIG. 8-2 are by no means necessary in the manufacturing process for the TFT, the sectional structure of which is shown in FIG. 4. As a result, the decrease in the number of steps has an effect of a reduction in manufacturing cost, and additionally has an effect in improvement of overall yield.

Third Exemplary Embodiment

As a third exemplary embodiment of the present invention, another example of the structure of the thin-film transistor according to the first aspect of the present invention and a mode of using the thin-film transistor according to the first aspect of the present invention as the driving device for active matrix of the liquid crystal display device are explained in detail with reference to the drawings.

Figure 9:
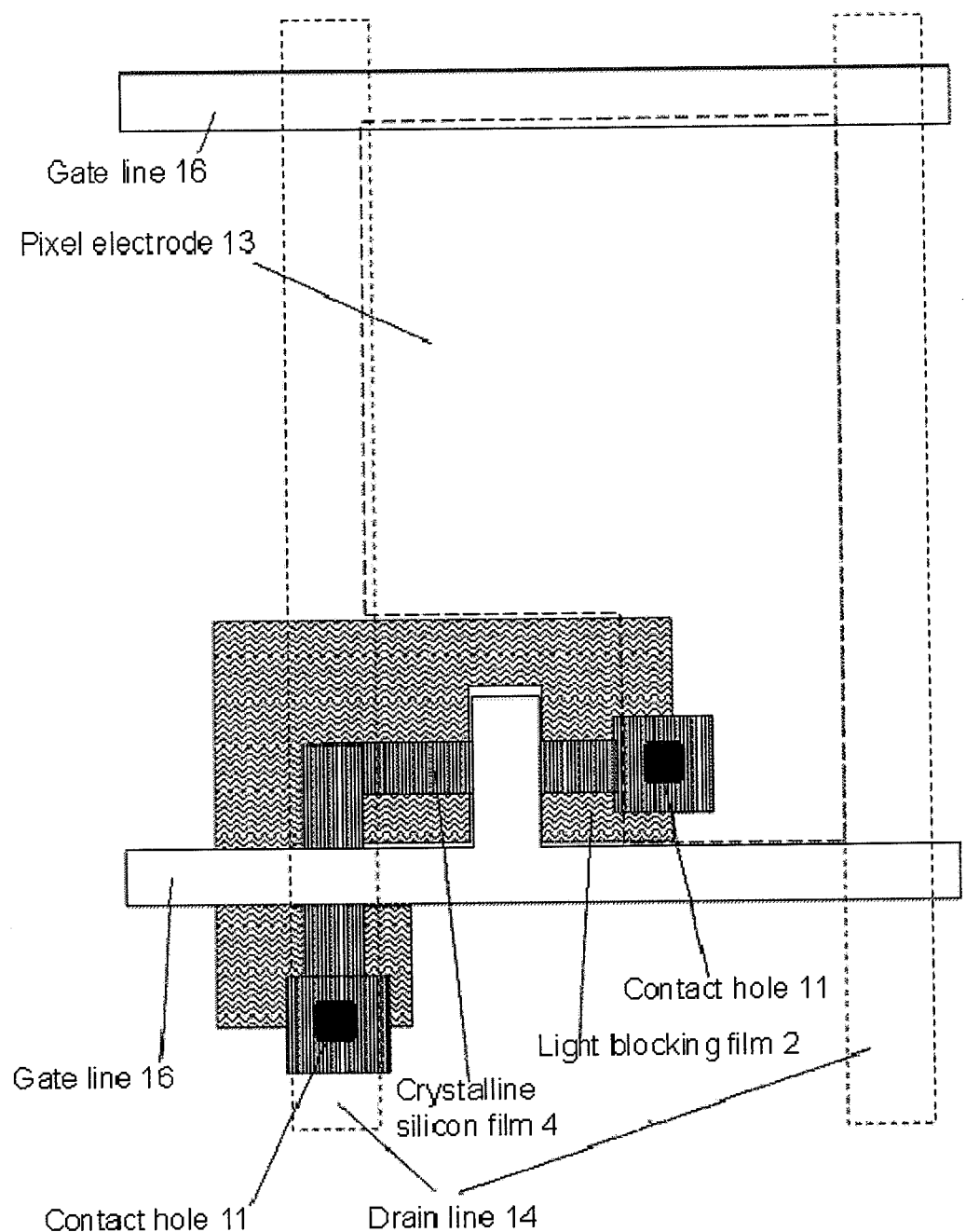
FIG. 9 is a top view showing a third exemplary embodiment of the thin-film transistor according to the present invention in which a double gate structure is employed.

FIG. 9 is a top view of a TFT according to the third exemplary embodiment of the present invention. As a structure shown in FIG. 9, a double gate structure in which two TFTs are connected in series between a drain region and a source region is employed. In the double gate structure, since the two TFTs are connected in series, potential ($V_{D1}$) of the drain region and potential ($V_{S1}$) of the source region are applied to a first TFT; and potential ($V_{D2}$) of the drain region and potential ($V_{S2}$) of the source region are applied to a second TFT. The source region of the first TFT and the drain region of the second TFT are integrated, and thus, potential ($V_{S1}$) of the source region of the first TFT and potential ($V_{D2}$) of the drain region of the second TFT are equal ($V_{S1}=V_{D2}$).

In the TFT having the double gate structure, a difference ($V_D-V_S$) between voltage ($V_D$) of a drain electrode thereof and voltage ($V_S$) of a source electrode thereof is ($V_D-V_S$)= ($V_{D1}-V_{S1}$)+($V_{D2}-V_{S2}$). Since the difference ($V_D-V_S$) between overall voltage ($V_D$) of the drain electrode and voltage ($V_S$) of the source electrode is divided into the two TFTs, in a range of $V_{Breaks-down1} > |V_{D1}-V_{S1}|$ and $V_{Breaks-down2} > |V_{D2}-V_{S2}|$ with respect to breakdown voltage $V_{Breaks-down1}$ between a source and a drain of the first TFT and $V_{Breaks-down2}$ between a source and a drain of the second TFT, breakdown is prevented.

Therefore, a potential difference $|V_D-V_S|$ between the source and the drain is divided into the two TFT, and thereby voltage applied to one TFT is set at the divided level. Therefore, the TFT having the double gate structure is used for an application for effectively increasing breakdown voltage between the source and the drain.

($V_D-V_S$) is divided into the two TFT and a bias difference $V_{DS}$; ($V_{D1}-V_{S1}$) and ($V_{D2}-V_{S2}$) between the drain and the source applied to the respective TFTs is reduced. Therefore, fluctuation in the performance of the TFT, in particular, threshold gate bias ($V_{th}$), which depends on the bias difference $V_{DS}$ between the drain and the source applied to the TFT, decreases. Therefore, fluctuation in effective threshold gate bias ($V_{th}$) of the TFT having the double gate structure is regarded as being suppressed.

In other words, the TFT having the double gate structure of the structure as shown in FIG. 9 may be suitably used for a TFT used in a "display device" in which breakdown voltage between a source and a drain needs to be increased and it is requested to suppress fluctuation in an effective threshold for "ON/OFF switching operation".

In the TFT having the double gate structure of the structure shown in FIG. 9, in each of the first TFT and the second TFT, patterned light blocking film 2 is divided into a region on the drain side and a region on the source side with a channel region between the regions. The region on the drain side and the region on the source side of light blocking film 2 are arranged not to overlap the channel region but to overlap a part of LDD regions provided on both sides of the channel region. Therefore, in similar to the TFT shown in FIG. 1 described in the first exemplary embodiment of the present invention, in the case of the TFT shown in FIG. 9, a photo leak current is suppressed and "shift amount: $\Delta V_{th}(x)$ of threshold gate bias $V_{th}(x)$" is substantially negligible.

In the TFT having the double gate structure of the structure shown in FIG. 9, the third region of light blocking film 2, which is provided in a region where silicon film 4 is not formed, is arranged to partially overlap a forming region of gate electrode film 6 and a gate line. In that portion, an MIM structure (capacitor $C_{GI(D/S)}$) composed of light blocking film 2, (base layer 3+ gate insulating film 5), and gate electrode film 6 (the gate line) is formed. Therefore, in the "OFF state", potential (Vg(OFF)) of gate electrode film 6 also has influence on potential ($V_{BD}(t)$) of the drain side region of the light blocking film and potential ($V_{BS}(t)$) of the source side region of the light blocking film via the MIM structure (capacitor $C_{GI(D/S)}$).

In the TFT having the double gate structure, it is also desirable to select a structure in which potential (Vg) of gate electrode film 6 and the gate line substantially does not have any substantial influence on the potential of patterned light blocking film 2. For example, when the MIM structure (capacitor $C_{GI(D/I)}$) composed of light blocking film 2, (base layer 3+ gate insulating film 5), and gate electrode film 6 (the gate line) is formed, by setting the capacitance of the MIM structure (capacitor $C_{GI(D/S)}$) sufficiently small, it is possible to prevent the potential (Vg) of gate electrode film 6 and the gate line from having substantial influence on the potential of light blocking film 2.

Further, in such a case when a triple gate structure in which three TFTs are arranged in series between a source and a drain is employed, as for each of the TFTs, patterned light blocking film 2 is divided into a region on the drain side and a region on the source side to hold a channel region between the regions, whereby, the same effects are obtained. In other words, in each of the TFTs, the region on the drain side and the region on the source side of light blocking film 2 are arranged not to overlap the channel region but to overlap a part of LDD regions that are provided on both sides of the channel region. Therefore, a photo leak current is suppressed and "shift amount: $\Delta_{Vth}(x)$ of threshold gate bias $V_{th}(x)$" is substantially negligible.

The fifth aspect of the present invention is equivalent to an invention of a method of using the thin-film transistor according to the first aspect or the second aspect of the present invention. Specifically, the fifth aspect is an invention of a display device driven using the thin-film transistor according to the first aspect or the second aspect of the present invention. One embodiment of the fifth aspect of the present invention is an invention of a liquid crystal display device driven using the thin-film transistor according to the first aspect or the second aspect of the present invention.

As explained above, the thin-film transistor according to the first aspect or the second aspect of the present invention is the top gate type crystalline silicon thin-film transistor formed on the insulative transparent substrate. When the thin-film transistor is used in a situation where light irradiation is received from the insulative transparent substrate side, a technical merit of providing a light blocking plate is achieved. Therefore, to correspond to the operation situation, the liquid crystal display device according to the fifth aspect of the present invention employs a mode in which backlight for liquid crystal display is made incident from the insulative transparent substrate side.

Fourth Exemplary Embodiment

Figure 10:
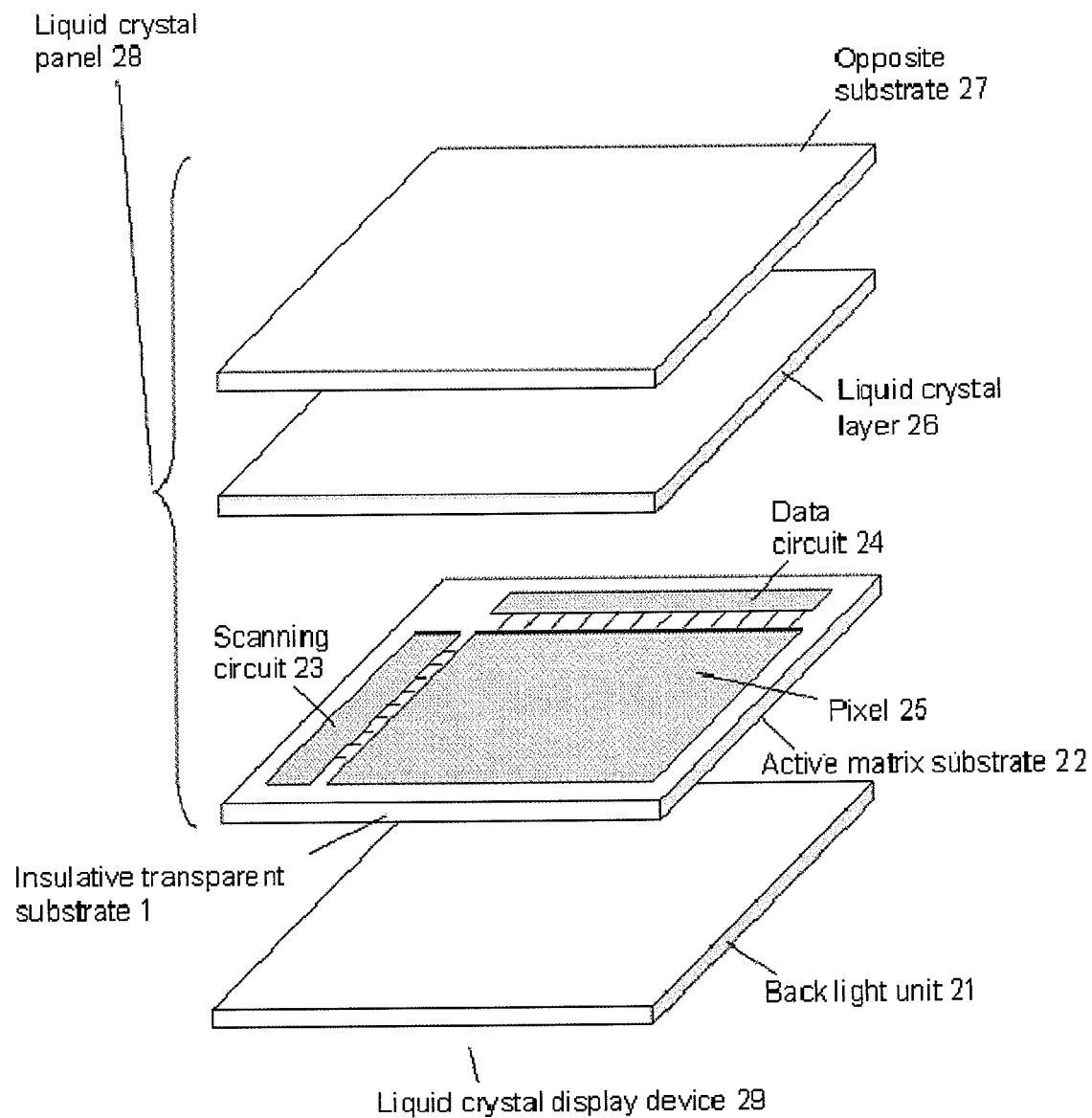
FIG. 10 is a disassembled perspective view of a liquid crystal display device according to a fourth exemplary embodiment of the present invention.

With reference to a liquid crystal display device of a backlight type shown in FIG. 10 as a specific example of a liquid crystal display device, which is one embodiment of the display device according to the fifth aspect of the present invention, an exemplary embodiment thereof is explained in detail.

FIG. 10 is a conceptual disassembled perspective view showing a general construction of the liquid crystal display device of the backlight type. Liquid crystal display device 29 of the backlight type comprises liquid crystal panel 28 and backlight unit 21. Backlight unit 21 comprises, as a light source therefor, a continuous light source having high luminance such as a cold cathode fluorescent lamp or a light emitting diode. Liquid crystal panel 28 comprises active matrix substrate 22 and opposed substrate 27, which are used as a pair of transparent substrates to hold liquid crystal layer 26 therebetween. In the construction illustrated in FIG. 10, backlight supplied from backlight unit 21 is made incident from the active matrix substrate 22 side, and then projected from the opposed substrate 27 side. Other components such as polarizer (not shown) are respectively provided on an incident surface and an projection surface of liquid crystal panel 28. When the liquid crystal display device is set up in the form of a color display liquid crystal display device, a color filter is provided on opposed substrate 27, which is used as the projection surface of liquid crystal panel 28. A common electrode (not shown) is formed on opposed substrate 27. On active matrix substrate 22, data circuit 24 and scanning circuit 23 used for writing in pixels 25 are formed. Data lines and scanning lines are respectively connected to data circuit 24 and scanning circuit 23. A display region of liquid crystal panel 28 is composed of pixel units formed on active matrix substrate 22. The pixel units are addressed by the data lines and the scanning lines. The thin-film transistor according to the first aspect of the present invention is provided in each of the pixel units. In the pixel unit, voltage applied to pixel electrode 13 is supplied via the TFT. Writing in pixels 25 is performed by using ON/OFF switching operations of the TFT.

Active matrix substrate 22 is corresponding to the transparent substrate on the incident surface side of liquid crystal panel 28. Therefore, the insulative transparent substrate is used as transparent substrate 1 of liquid crystal panel 28.

When a light source having high luminance is used as backlight unit 21, the thin-film transistor used for writing in the pixels is continuously irradiated with light having a large light quantity that is incident from insulative transparent substrate 1 side. In the thin-film transistor according to the first aspect of the present invention, the structure of the light blocking plate explained above is employed, so that generation of a photo leak current is effectively suppressed even in a situation in which light irradiation of a large light quantity is received from the insulative transparent substrate 1 side. Therefore, the liquid crystal display device of the backlight type shows a satisfactory display performance.

In addition, in such a case when a writing period for the pixels is short, i.e., a period of the ON/OFF switching operations of the thin-film transistor is short, the influence of the potential of the divided light blocking plates on operation performance of the thin-film transistor is substantially suppressed. The liquid crystal display device of the backlight type as illustrated in the third exemplary embodiment is suitable for an application with a short writing period for the pixels, for example, an application for displaying a moving image.

For example, when a "photo leak current" is generated while the TFT for driving shown in FIG. 1 is in the "OFF state", for instance, a part of charges (Q) stored between pixel electrode 13 and the common electrode is discharged. As a result, when a potential difference between pixel electrode 13 and the common electrode is reduced, an electric field in a liquid crystal layer decreases, which may be cause of a defect in the display.

In the thin-film transistor according to the first aspect or the second aspect of the present invention, even in a situation in which light irradiation of a large light quantity is received from the insulative transparent substrate side, generation of a photo leak current is effectively suppressed. Therefore, it is possible to suppress occurrence of a defect in display that is caused by the generation of a photo leak current by using the thin-film transistor according to the first aspect or the second aspect according to the present invention as the driving device for active matrix of the liquid crystal display device.

In the thin-film transistor according to the first aspect or the second aspect of the present invention, even in a situation in which light irradiation of a large light quantity is received from the insulative transparent substrate side, generation of a photo leak current is effectively suppressed. However, as explained above, unlike the structure in which the light blocking plate is provided so as to cover the entire crystalline silicon film, in the "OFF state", a slight level of photo leak current is generated. Therefore, when a writing period for the pixels is long, a part of charges (Q) stored between pixel electrode 13 and the common electrode is discharged by a total amount ($I_{photoleak} \times \tau$) of the photo leak current generated during the period ($\tau$). As a result, the potential of pixel electrode 13 falls from initial potential $V_0$ to $V_0 \times (1-(I_{photoleak} \times \tau)/Q)$ at the end of the period ($\tau$). When the writing period ($\tau$) for the pixels is short, a ratio of dropping: ($I_{photoleak} \times \tau)/Q$ of the potential of pixel electrode 13 remains at low level. Therefore, an application with a short writing period for the pixels, for example, an application for displaying a moving image is suitable for the liquid crystal display device of the backlight type as illustrated in the third exemplary embodiment.

As to the liquid crystal display device according to the fifth aspect of the present invention, the exemplary embodiment of liquid crystal display device 29 of the backlight type in which liquid crystal panel 28 and backlight unit 21 of a panel-shaped light source are combined is explained above. However, the scope of the liquid crystal display device according to the fifth aspect of the present invention is not limited to such specific modes as illustrated in this embodiment. For example, like a liquid crystal display device of a liquid crystal projector type, an embodiment in which liquid crystal panel is combined with a high-luminance light source unit of a point light source type, instead of the backlight unit of the panel-shaped light source, as a light source of backlight is also included in the scope of the present invention.

Under such a condition where a period of ON/OF switching operations is set short, in a situation in which light irradiation of a large light quantity is continuously received from the insulative transparent substrate side, the thin-film transistor according to the first aspect or the second aspect of the present invention can obtain the effects significantly. Therefore, in addition to the liquid crystal display device of the backlight type, for a display device that uses a TFT in the state where a period of ON/OF switching operations is short, in the situation in which light irradiation of a large light quantity is continuously received, the thin-film transistor according to the first aspect of the present invention can also be suitably used. For example, in the case of an organic electroluminescence display device used for the application with a short writing period for the pixels, for example, the application for displaying a moving image, the thin-film transistor according to the first aspect of the present invention may be used as a driving device for such a mode in which the organic electroluminescence display device is used in a situation in which external light irradiation of a large light quantity is continuously received from the insulative transparent substrate side.

The sixth aspect of the present invention is also equivalent to an invention of the method of using the thin-film transistor according to the first aspect or the second aspect of the present invention. Specifically, in the case of an electronic apparatus that employs a liquid crystal display device as a displaying unit thereof, the sixth aspect is just a mode of using the liquid crystal display device according to the fifth aspect of the present invention as the displaying unit that is an essential component of the electronic apparatus. As explained above, the liquid crystal display device according to the fifth aspect of the present invention employs the thin-film transistor according to the first aspect or the second aspect of the present invention as a thin-film transistor for driving of the liquid crystal display device.

The thin-film transistor according to the first aspect or the second aspect of the present invention is the top gate type crystalline silicon thin-film transistor formed on the insulative transparent substrate. When the thin-film transistor is used in a situation where light irradiation is received from the insulative transparent substrate side, a technical merit of providing a light blocking plate is achieved. Therefore, to correspond to the operation situation, the liquid crystal display device employs a mode in which backlight for liquid crystal display is made incident from the insulative transparent substrate side.

Fifth Exemplary Embodiment

An exemplary embodiment of the electronic apparatus according to the sixth aspect of the present invention is explained with reference to an example of a mobile phone that is equipped with a liquid crystal display device, as a specific example of the electronic apparatus.

Figure 11:
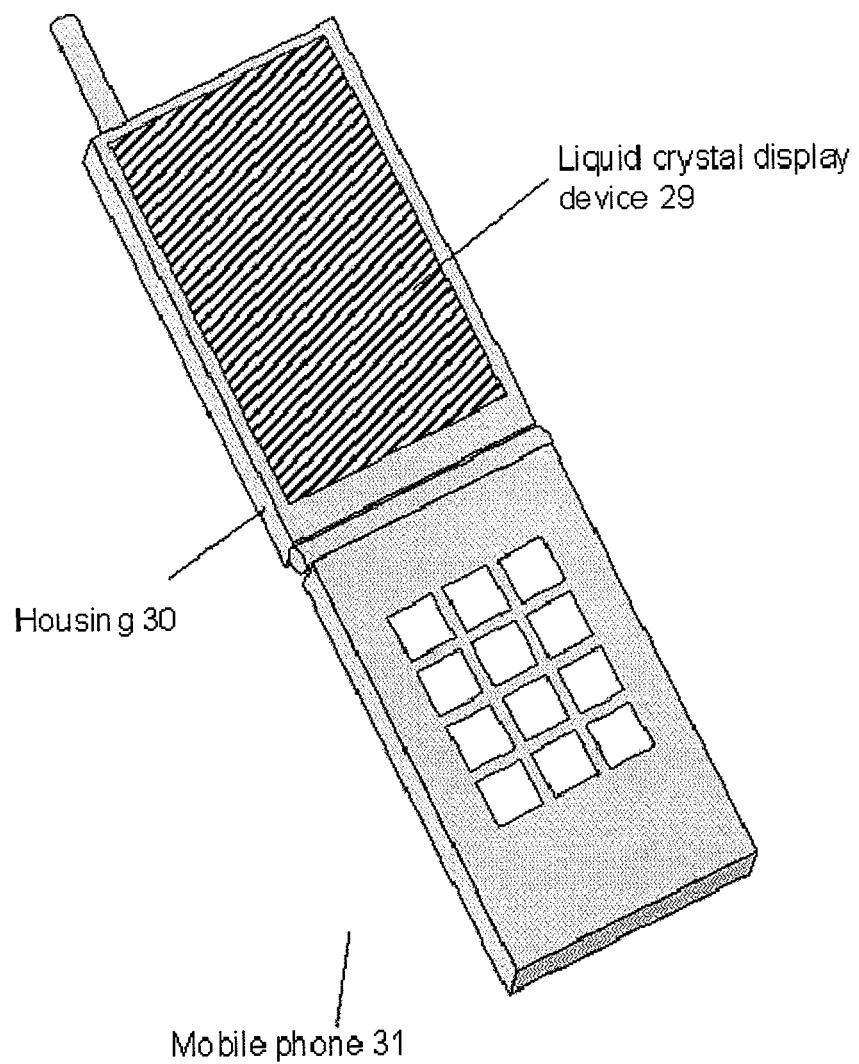
FIG. 11 is a perspective view of an electronic apparatus according to a fifth exemplary embodiment of the present invention.

FIG. 11 is a perspective view of a mobile phone comprising a liquid crystal display device of a backlight type. Housing 30 of mobile phone 31 is composed of an upper housing and a lower housing. Liquid crystal display device 29 of the backlight type is provided in the upper housing. A ten key and the like are provided in the lower housing. The liquid crystal display device for the mobile phone is desired to be a liquid crystal display device having excellent visibility, which is free from any influence from variety of illumination situation around the liquid crystal display device, such as a situation without an external illumination or an outdoor situation in which direct rays of the sun are irradiated. Therefore, it is desirable to use a light source having high luminance as a backlight unit. In that case, light of a large light quantity is continuously irradiated from the insulative transparent substrate side on the thin-film transistor used for writing in the pixels. In the thin-film transistor according to the first aspect of the present invention, since the structure of the light blocking plate illustrated above is employed, even in a situation in which light irradiation of a large light quantity is received from the insulative transparent substrate side, generation of a photo leak current is effectively suppressed. Therefore, the liquid crystal display device of the backlight type shows a satisfactory display performance, and use thereof can provide a mobile phone having excellent visibility.

The electronic apparatus according to the sixth aspect of the present invention is not limited to the exemplary embodiment of the mobile phone comprising the liquid crystal display device of the backlight type. The quite similar effects are also attained in variety of exemplary embodiments including a personal computer, a PDA (Personal Digital Assistance), and a digital (video) camera comprising a view finder or a liquid crystal display monitor, which use the liquid crystal display device of the backlight type, and also a liquid crystal projector.

In addition, when a writing period for the pixels is short, i.e., a period of the ON/OFF switching operations of the thin-film transistor is short, the influence of the potential of divided light blocking plates on operation performance of the thin-film transistor is substantially suppressed. The advantage is fit to an electronic apparatus that uses the liquid crystal display device of the backlight type for an application with a short writing period for the pixels, for example, an application for displaying a moving image. Specifically, the advantage is suitable to variety of embodiments including a mobile phone, a personal computer, a PDA (Personal Digital Assistance), a digital (video) camera comprising a view finder or a liquid crystal display monitor, which have a display function for a moving image, and also a liquid crystal projector.

Although, so far the present invention has been described with reference to exemplary embodiments (and examples thereof), the present invention will not be limited to the above described exemplary embodiments (and examples thereof). The constitutions and details of the present invention are subject to various modifications which can be understood by those skilled in the art, within the scope of the present invention.

This application claims the benefits of priority based on Japanese patent application No. 2010-30343 filed on Feb. 15, 2010 and Japanese patent application No. 2010-279367 filed on Dec. 15, 2010, of which the entire contents are incorporated herein by reference.

INDUSTRIAL APPLICABILITY

The thin-film transistor according to the present invention can be used as a transistor for driving of a liquid crystal display device used under a condition in which light irradiation is performed from an insulative transparent substrate side on a crystalline silicon film of an operation layer of the thin-film transistor. In particular, the thin-film transistor according to the present invention can be used as a transistor for driving of a liquid crystal display device in which a backlight unit is arranged on an insulative transparent substrate side.

(Note 1)

A top gate type crystalline silicon thin-film transistor formed on an insulative transparent substrate, characterized in that:

the thin-film transistor comprising:

a insulative transparent substrate;

a patterned light blocking film formed on an upper surface of the insulative transparent substrate;

a base layer made of a light transmissive and insulative material that is formed to cover the patterned light blocking film and the upper surface of the insulative transparent substrate;

a patterned crystalline silicon film formed on an upper surface of the base layer;

a gate insulating film formed to cover the patterned crystalline silicon film and the upper surface of the base layer; and a patterned gate electrode film formed on an upper surface of the gate insulating film, wherein a field effect transistor is composed of a gate electrode formed of the patterned gate electrode film, the gate insulating film, a channel region consisting of a region of a first conduction type right below the gate electrode of the patterned crystalline silicon film that is in contact with the gate insulating film, a drain region consisting of a region of a second conduction type doped with an impurity at high concentration that is formed on the patterned crystalline silicon film, a source region consisting of a region of the second conduction type doped with an impurity at high concentration that is formed on the patterned crystalline silicon film, LDD regions consisting of regions of the second conduction type doped with an impurity at low concentration that are formed on a surface side of the patterned crystalline silicon film, which is in contact with the gate insulating film, on both sides of the channel region, and a drain electrode and a source electrode made from electrode films that are formed to be respectively electrically connected to upper surfaces of the drain region and the source region, in an ON state of the field effect transistor, a channel is formed by applying a gate bias exceeding a threshold voltage to the gate electrode, a flow path of carriers through the channel and the LDD regions on both sides of the channel is formed between the drain region and the source region, the patterned light blocking film is formed of a light non-transmissive conductive material, and surrounded by the insulative transparent substrate and the base layer to be kept in electrically isolated state, any part of the patterned light blocking film is by no means present right below the channel region, a forming region of the patterned light blocking film overlaps, at least, a part of a region right below the drain region and a part of a region right below the source region, and the forming region of the patterned light blocking film are arranged to overlap a part of region right below the LDD region for each of the LDD regions that are provided on both the sides of the channel region.

(Note 2)

A top gate type crystalline silicon thin-film transistor formed on an insulative transparent substrate, characterized in that:

the thin-film transistor comprising:

a insulative transparent substrate;

a patterned light blocking film formed on an upper surface of the insulative transparent substrate;

a base layer made of a light transmissive and insulative material that is formed to cover the patterned light blocking film and the upper surface of the insulative transparent substrate;

a patterned crystalline silicon film formed on an upper surface of the base layer;

a gate insulating film formed to cover the patterned crystalline silicon film and the upper surface of the base layer; and a patterned gate electrode film formed on an upper surface of the gate insulating film, wherein a field effect transistor is composed of a gate electrode having gate length of $L_{gate}$ formed of the patterned gate electrode film, the gate insulating film, a channel region having length L equal to the gate length $L_{gate}$ consisting of a region of a first conduction type of the patterned crystalline silicon film that is in contact with the gate insulating film, in which the region of the first conduction type is formed right below the gate electrode having gate length of $L_{gate}$, a drain region having length $L_D$ and a source region having length $L_S$ consisting of regions of a second conduction type doped with impurity at high concentration that are formed in the patterned crystalline silicon film on both sides of the gate electrode, a drain side LDD region having length d and a source side LDD region having length d consisting of regions of the second conduction type doped with impurity at low concentration that are formed on a surface side of the patterned crystalline silicon film, which is in contact with the gate insulating film, between the channel and drain regions and the source region, and a drain electrode and a source electrode made of electrode films that are formed to be respectively electrically connected to upper surfaces of the drain region and the source region, in an ON state of the field effect transistor, a channel is formed by applying a gate bias exceeding a threshold voltage to the gate electrode, a flow path of carriers through the drain region, the drain side LDD region, the channel, the source side LDD region, and the source region is formed between the drain region and the source region, the patterned light blocking film is formed of a light non-transmissive conductive material, and surrounded by the insulative transparent substrate and the base layer to be kept in electrically isolated state, the patterned light blocking film comprises portions that are formed by dividing into a region on a drain side and a region on a source side across the channel region, any part of the patterned light blocking film is by no means right below the channel region having length L, a space of interval x equal to or larger than the length L of the channel region is provided between the region on the drain side and the region on the source side of the divided light blocking films, the region on the drain side of the divided light blocking films is arranged to overlap, at least, a part of the drain side LDD region having length d and a part of the drain region, and the region on the source side of the divided light blocking films is arranged to overlap at least a part of the source side LDD region having length d and a part of the source region.

(Note 3)

The thin-film transistor according to note 2, wherein interval x of the space provided between the region on the drain side of the light blocking film and the region on the source side of the light blocking film, which are divided across the channel region, is selected to satisfy the following equation (1) with respect to the length L of the channel region, length d of the drain side LDD region, and length d of the source side LDD region:

$$L+2d \geq x \geq L \qquad \text{eq. (1).}$$

(Note 4)

The thin-film transistor according to note 2 or 3, wherein in the region on the drain side of the light blocking film and the region on the source side of the light blocking film divided across the channel region, an end on the gate electrode side of the region on the drain side of the light blocking film and an end on the gate electrode side of the region on the source side of the light blocking film are arranged to be in positions symmetrical with respect to the gate electrode.

(Note 5)

The thin-film transistor according to any one of notes 1 to 4, wherein the patterned light blocking film comprises a third region that is not located right below the patterned crystalline silicon film, and the region on the drain side of the light blocking film and the region on the source side of the light blocking film that are divided with the channel region between are electrically connected to each other via the third region of the light blocking film.

(Note 6)

The thin-film transistor according to any one of notes 1 to 5, wherein the regions of the second conduction type doped with impurity at high concentration reach the upper surface of the base layer, and the regions of the second conduction type doped with impurity at low concentration also reach the upper surface of the base layer.

(Note 7)

The thin-film transistor according to any one of notes 1 to 6, wherein the top gate type field effect transistor comprises an interlayer insulating film that is formed to cover the gate electrode and the upper surface of the gate insulating film.

(Note 8)

The thin-film transistor according to any one of notes 1 to 7, wherein the first conduction type is a conduction type in which holes are carriers, the second conduction type is a conduction type in which electrons are carriers, and the top gate type field effect transistor to be constructed is an N-channel type field effect transistor.

(Note 9)

The thin-film transistor according to any one of notes 1 to 7, wherein the first conduction type is a conduction type in which electrons are carriers, the second conduction type is a conduction type in which holes are carriers, and the top gate type field effect transistor to be constructed is a P-channel type field effect transistor.

(Note 10)

A method of manufacturing the thin-film transistor according to note 1 on an insulative transparent substrate, characterized in that:

the method of manufacturing the thin-film transistor at least comprising the following steps (1) to (13):

step (1) of forming a film made of the light non-transmissive conductive material on an upper surface of the insulative transparent substrate;

step (2) of patterning the film formed of the light non-transmissive conductive material to form the patterned light blocking film on the upper surface of the insulative transparent substrate;

step (3) of forming a film made of a light transmissive insulative material so as to cover the patterned light blocking film and the upper surface of the insulative transparent substrate to form a base layer;

step (4) of forming an amorphous silicon film on an upper surface of the base layer;

step (5) of subjecting the amorphous silicon film formed on the upper surface of the base layer to heat treatment by irradiating with beam of excimer laser or the like to form a crystalline silicon film of the first conduction type;

step (6) of patterning the crystalline silicon film of the first conduction type to form the patterned crystalline silicon film of the first conduction type on the upper surface of the base layer;

step (7) of forming a gate insulating film to cover the patterned crystalline silicon film and the upper surface of the base layer;

step (8) of forming a gate electrode film on an upper surface of the gate insulating film;

step (9) of patterning the gate electrode film to form the patterned gate electrode film on the upper surface of the gate insulating film;

step (10) of implanting, at high concentration, an impurity for giving the second conductivity in the patterned crystalline silicon film of the first conduction type to form a region of the second conduction type doped with impurity at high concentration for a drain region and a region of the second conduction type doped with impurity at high concentration for a source region;

step (11) of implanting, at low concentration, the impurity for giving the second conductivity into the patterned crystalline silicon film of the first conduction type to form, on both sides of the gate electrode, regions of the second conduction type doped with impurity at low-concentration;

step (12) of subjecting the impurities for giving the second conductivity respectively implanted into the regions of the second conduction type doped with impurity at high concentration and the regions of the second conductivity type doped with impurity at low concentration to activation heat treatment to form the drain region and the source region from the regions of the second conduction type doped with impurity at high concentration, and to form LDD regions respectively on both sides of the gate electrode from the regions of the second conductivity type doped with impurity at low concentration; and step (13) of providing an opening for electrode formation in the gate insulating film that covers upper surfaces of the drain region and the source region, and then forming an electrode film in the opening to be electrically connected to the upper surfaces of the drain region and the source region to form the drain electrode and the source electrode from the electrode film, wherein length of the patterned gate electrode film formed in the step (9) is selected to be equal to gate length of the gate electrode, a region right below the gate electrode having the gate length of the patterned crystalline silicon film of the first conductive type that is in contact with the gate insulating film is used as a channel region having length equal to the gate length, lengths of the regions of the second conduction type doped with impurity at high concentration formed in the step (10) are respectively selected to be equal to length $L_D$ of the drain region and length $L_S$ of the source region, lengths of the regions of the second conduction type doped with impurity at low concentration formed between the gate electrode and the drain region and between the gate electrode and the source region in the step (11) are respectively selected to be equal to length d of the drain side LDD region and length d of the source side LDD region, a pattern shape of the patterned light blocking film formed in the step (2) is selected such that a space of interval x equal to or lager than length of the channel region is provided in the pattern shape, whereby any part of the patterned light blocking film is by no means present right below the channel region;

the forming region of the patterned light blocking film overlaps, at least, the part of the region right below the drain region and the part of the region right below the source region; and the forming region of the patterned light blocking film are arranged to overlap the part of region right below the LDD region for each of the LDD regions that are provided on both the sides of the channel region, an arrangement position of the patterned gate electrode film, with respect to a pattern shape of the patterned light blocking film formed in the step (2), is selected such that the patterned gate electrode film formed in the step (9) is to be positioned above the space of interval x equal to or larger than the length of the channel region, and an arrangement position of the patterned gate electrode film is aligned such that a space having length d is to be provided between a side end on the drain region side of the patterned gate electrode film and a side end on the gate electrode film side of the drain region; and a space having length d is to be provided between a side end on the source region side of the patterned gate electrode film and a side end on the gate electrode film side of the source region.

(Note 11)

A method of manufacturing the thin-film transistor according to note 2 on an insulative transparent substrate, characterized in that:

the method of manufacturing the thin-film transistor at least comprising the following steps (1) to (13):

step (1) of forming a film made of the light non-transmissive conductive material on an upper surface of the insulative transparent substrate;

step (2) of patterning the film formed of the light non-transmissive conductive material to form the patterned light blocking film on the upper surface of the insulative transparent substrate;

step (3) of forming a film made of a light transmissive insulative material so as to cover the patterned light blocking film and the upper surface of the insulative transparent substrate to form a base layer;

step (4) of forming an amorphous silicon film on an upper surface of the base layer;

step (5) of subjecting the amorphous silicon film formed on the upper surface of the base layer to heat treatment by irradiating with beam of excimer laser or the like to form a crystalline silicon film of the first conduction type;

step (6) of patterning the crystalline silicon film of the first conduction type to form the patterned crystalline silicon film of the first conduction type on the upper surface of the base layer;

step (7) of forming a gate insulating film to cover the patterned crystalline silicon film and the upper surface of the base layer;

step (8) of forming a gate electrode film on an upper surface of the gate insulating film;

step (9) of patterning the gate electrode film to form the patterned gate electrode film on the upper surface of the gate insulating film;

step (10) of implanting, at high concentration, an impurity for giving the second conductivity in the patterned crystalline silicon film of the first conduction type to form a region of the second conduction type doped with impurity at high concentration for a drain region and a region of the second conduction type doped with impurity at high concentration for a source region;

step (11) of implanting, at low concentration, the impurity for giving the second conductivity into the patterned crystalline silicon film of the first conduction type to form, on both sides of the gate electrode, regions of the second conduction type doped with impurity at low-concentration;

step (12) of subjecting the impurities for giving the second conductivity respectively implanted into the regions of the second conduction type doped with impurity at high concentration and the regions of the second conductivity type doped with impurity at low concentration to activation heat treatment to form the drain region and the source region from the regions of the second conduction type doped with impurity at high concentration, and to form LDD regions respectively on both sides of the gate electrode from the regions of the second conductivity type doped with impurity at low concentration; and step (13) of providing an opening for electrode formation in the gate insulating film that covers upper surfaces of the drain region and the source region, and then forming an electrode film in the opening to be electrically connected to the upper surfaces of the drain region and the source region to form the drain electrode and the source electrode from the electrode film, wherein length of the patterned gate electrode film formed in the step (9) is selected to be equal to gate length of $L_{gate}$ of the gate electrode, a region right below the gate electrode having the gate length $L_{gate}$ of the patterned crystalline silicon film of the first conductive type that is in contact with the gate insulating film is used as a channel region having length equal to the gate length $L_{gate}$, lengths of the regions of the second conduction type doped with impurity at high concentration formed in the step (10) are respectively selected to be equal to length $L_D$ of the drain region and length $L_S$ of the source region, lengths of the regions of the second conduction type doped with impurity at low concentration formed on both the sides of the gate electrode in the step (11) are respectively selected to be equal to length d of the drain side LDD region and length d of the source side LDD region, the patterned light blocking film formed in step (2) is divided into a region on the drain side and a region on the source side across the channel region, a space of interval x equal to or larger than the length L of the channel region is provided between the region on the drain side and the region on the source side of the divided light blocking films, and when an arrangement position of the patterned gate electrode film is aligned above the space of interval x equal to the length L of the channel region, the arrangement position of the patterned gate electrode film is aligned such that the region on the drain side of the divided light blocking films overlaps, at least, a part of the drain side LDD region having length d and a part of the drain region, and the region on the source side of the divided light blocking films is arranged to overlap at least a part of the source side LDD region having length d and a part of the source region.

(Note 12)
The method of manufacturing the thin-film transistor according to note 11, wherein
interval x of the space provided between the region on the drain side of the light blocking film and the region on the source side of the light blocking film, which are divided across the channel region, is selected to satisfy the following equation (1) with respect to the length L of the channel region, length d of the drain side LDD region, and length d of the source side LDD region:

$$L+2d \geq x \geq L \qquad \text{eq. (1).}$$

(Note 13)
The method of manufacturing the thin-film transistor according to note 11 or 12, wherein
with respect to the region on the drain side of the light blocking film and the region on the source side of the light blocking film divided across the channel region,
the arrangement position of the patterned gate electrode film is aligned such that, an end on the gate electrode side of the region on the drain side of the light blocking film and an end on the gate electrode side of the region on the source side of the light blocking film are in positions symmetrical with respect to the gate electrode.

(Note 14)
The method of manufacturing the thin-film transistor according to any one of notes 10 to 13, wherein
the patterned light blocking film comprises a third region that is not located right below the patterned crystalline silicon film of the first conduction type, and
the region on the drain side of the light blocking film and the region on the source side of the light blocking film that are divided with the channel region between are electrically connected to each other via the third region of the light blocking film.

(Note 15)
The method of manufacturing the thin-film transistor according to any one of notes 10 to 14, wherein
the regions of the second conduction type doped with impurity at high concentration reach the upper surface of the base layer, and
the regions of the second conduction type doped with impurity at low concentration also reach the upper surface of the base layer.

(Note 16)
The method of manufacturing the thin-film transistor according to any one of notes 10 to 15, further comprising:
step of forming, for the top gate type field effect transistor, an interlayer insulating film formed to cover the gate electrode and the upper surface of the gate insulating film.

(Note 17)
The method of manufacturing the thin-film transistor according to any one of notes 10 to 16, wherein
the first conduction type is a conduction type in which holes are carriers,
the second conduction type is a conduction type in which electrons are carriers, and
the top gate type field effect transistor to be constructed is an N-channel type field effect transistor.

(Note 18)
The method of manufacturing the thin-film transistor according to any one of notes 10 to 16, wherein
the first conduction type is a conduction type in which electrons are carriers,
the second conduction type is a conduction type in which holes are carriers, and
the top gate type field effect transistor to be constructed is a P-channel type field effect transistor.

(Note 19)
A display device driven using a top gate type crystalline silicon thin-film transistor formed on a transparent substrate, wherein
the top gate type crystalline silicon thin-film transistor, which is used as a driving device in the display device and formed on the transparent substrate, is the thin-film transistor according to any one of notes 1 to 9.

(Note 20)

An electronic apparatus comprising a display device, wherein the display device employed in the electronic apparatus is the display device according to note 19.

(Note 21)

A liquid crystal display device driven using a top gate type crystalline silicon thin-film transistor formed on an insulative transparent substrate, wherein the liquid crystal display device employs a style of display in which backlight incident from the insulative transparent substrate side is used for the liquid crystal display, and as the top gate type crystalline silicon thin-film transistor formed on the insulative transparent substrate that receives light irradiation by the back light, the thin-film transistor according to any one of notes 1 to 9 is used.

(Note 22)

An electronic apparatus in which a liquid crystal display device is employed as a display system therefor, wherein the liquid crystal display device employed in the electronic apparatus employs a style of display in which backlight incident from the insulative transparent substrate side is used for the liquid crystal display, and the liquid crystal display device is the liquid crystal display device according to note 21.

(Note 23)

The thin-film transistor according to any one of notes 1 to 9, wherein the crystalline silicon film is a polysilicon film.

(Note 24)

The method of manufacturing the thin-film transistor according to any one of notes 10 to 18, wherein the crystalline silicon film is a polysilicon film.

What is claimed is:

1. A top gate type thin-film transistor formed on a transparent substrate, comprising:
   a patterned light blocking film,
   a base layer,
   a patterned crystalline silicon film,
   a gate insulating film, and
   a patterned gate electrode film sequentially laminated on the transparent substrate,
   wherein the patterned crystalline silicon film comprises:
   a channel region overlapping the patterned gate electrode; and
   two regions doped with an impurity at low concentration that are in contact with the channel region,
   wherein the patterned light blocking film is arranged not to overlap the channel region and arranged such that the light blocking film partially overlaps at least any one of the two regions doped with an impurity at low concentration,
   wherein the patterned light blocking film is arranged such that the light blocking film partially overlaps at least any one of a source region and a drain region,
   wherein the patterned light blocking film comprises a third region that is not located right below the patterned crystalline silicon film, and
   wherein the region on the drain side of the light blocking film and the region on the source side of the light blocking film that are divided across the channel region are electrically connected to each other via the third region of the light blocking film.

2. The thin-film transistor according to claim 1, wherein the transparent substrate is an insulative transparent substrate, the base layer is a layer made of a light transmissive and insulative material, and the patterned light blocking film is entirely surrounded by the transparent substrate and the base layer and electrically isolated.

3. A display device driven using a top gate type crystalline silicon thin-film transistor formed on a transparent substrate, wherein the top gate type crystalline silicon thin-film transistor, which is used as a driving device in the display device and formed on the transparent substrate, is the thin-film transistor according to claim 1.

4. An electronic apparatus comprising a display device, wherein the display device employed in the electronic apparatus is the display device according to claim 3.

5. A top gate type thin-film transistor formed on a transparent substrate, comprising:
   a patterned light blocking film,
   a base layer,
   a patterned crystalline silicon film,
   a gate insulating film, and
   a patterned gate electrode film are sequentially laminated on the transparent substrate,
   the patterned crystalline silicon film comprises:
   a channel region overlapping the patterned gate electrode; and
   two regions doped with an impurity at low concentration that are in contact with the channel region, and
   the patterned light blocking film is arranged not to overlap the channel region and arranged such that the light blocking film partially overlaps at least any one of the two regions doped with an impurity at low concentration,
   wherein
   the patterned light blocking film comprises a third region that is not located right below the patterned crystalline silicon film, and
   the region on the drain side of the light blocking film and the region on the source side of the light blocking film that are divided across the channel region are electrically connected to each other via the third region of the light blocking film.

6. The thin-film transistor according to claim 5, wherein
   the transparent substrate is an insulative transparent substrate,
   the base layer is a layer made of a light transmissive and insulative material, and
   the patterned light blocking film is entirely surrounded by the transparent substrate and the base layer and electrically isolated.

7. A display device driven using a top gate type crystalline silicon thin-film transistor formed on
   a transparent substrate, wherein
   the top gate type crystalline silicon thin-film transistor, which is used as a driving device in the display device and formed on the transparent substrate, is the thin-film transistor according to claim 5.

8. An electronic apparatus comprising a display device, wherein
   the display device employed in the electronic apparatus is the display device according to claim 7.

9. A top gate type thin-film transistor formed on a transparent substrate, comprising:
   a patterned light blocking film,
   a base layer,
   a patterned crystalline silicon film,
   a gate insulating film, and
   a patterned gate electrode film sequentially laminated on the transparent substrate, wherein the patterned crystalline silicon film comprises:
a channel region overlapping the patterned gate electrode; and
two regions doped with an impurity at low concentration that are in contact with the channel region,
wherein the patterned light blocking film is arranged not to overlap the channel region and arranged such that the light blocking film partially overlaps at least any one of the two regions doped with an impurity at low concentration,
wherein the patterned light blocking film is arranged such that the light blocking film partially overlaps at least any one of a source region and a drain region, and
wherein the patterned light blocking film is electrically isolated from any one of drain bias, source bias, gate bias and ground that are applied for the top gate type thin-film transistor to operate.

* * * * *